US009181630B2

(12) United States Patent
Shibata et al.

(10) Patent No.: US 9,181,630 B2
(45) Date of Patent: Nov. 10, 2015

(54) METHOD FOR DISPOSING FINE OBJECTS, APPARATUS FOR ARRANGING FINE OBJECTS, ILLUMINATING APPARATUS AND DISPLAY APPARATUS

(75) Inventors: Akihide Shibata, Osaka (JP); Tetsu Negishi, Osaka (JP); Kenji Komiya, Osaka (JP); Yoshifumi Yaoi, Osaka (JP); Takeshi Shiomi, Osaka (JP); Hiroshi Iwata, Osaka (JP); Akira Takahashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 13 days.

(21) Appl. No.: 13/809,433

(22) PCT Filed: Jun. 14, 2011

(86) PCT No.: PCT/JP2011/063558
§ 371 (c)(1),
(2), (4) Date: Mar. 14, 2013

(87) PCT Pub. No.: WO2012/008253
PCT Pub. Date: Jan. 19, 2012

(65) Prior Publication Data
US 2013/0168708 A1 Jul. 4, 2013

(30) Foreign Application Priority Data
Jul. 14, 2010 (JP) ................................. 2010-159622

(51) Int. Cl.
*H01L 21/00* (2006.01)
*H01L 21/20* (2006.01)
(Continued)

(52) U.S. Cl.
CPC ............... *C25D 13/00* (2013.01); *H01L 21/479* (2013.01); *H01L 24/75* (2013.01); *H01L 24/95* (2013.01);
(Continued)

(58) Field of Classification Search
CPC ....... H01L 29/0673; H01L 33/48; G02F 1/19; G02F 1/167; G02F 9/33; C25D 13/00

USPC .............................. 438/3, 478; 422/500, 502; 257/E21.705, E25.012; 359/296; 345/107; 977/762, 883
See application file for complete search history.

(56) References Cited

U.S. PATENT DOCUMENTS 3,439,416 A * 4/1969 Yando .............................. 29/832
5,355,577 A * 10/1994 Cohn ........................... 29/592.1
(Continued)

FOREIGN PATENT DOCUMENTS

JP 2004-131363 A 4/2004
JP 2007-184566 A 7/2007
(Continued)

OTHER PUBLICATIONS

Official Communication issued in International Patent Application No. PCT/JP2011/063558, mailed on Aug. 9, 2011.

*Primary Examiner* — Mary Wilczewski
*Assistant Examiner* — Erik T Peterson
(74) *Attorney, Agent, or Firm* — Keating & Bennett, LLP

(57) ABSTRACT

This method for disposing fine objects, in a substrate preparing step, prepares a substrate having specified positions where fine objects (120) are to be disposed in an area where a first electrode (111) and a second electrode (112) face each other, and in a fluid introducing step, a fluid (121) is introduced on the substrate (110). The fluid (121) contains a plurality of the fine objects (120). The fine objects (120) are diode elements, each of which has, as an alignment structure, a front side layer (130) composed of a dielectric material, and a rear side layer (131) composed of a semiconductor. In the fine object disposing step, by applying an AC voltage to between the first electrode (111) and the second electrode (112), the fine objects (120) are disposed by dielectrophoresis with the front side layer (130) facing up at the predetermined positions in the area (A) where the first electrode (111) and the second electrode (112) face each other.

20 Claims, 43 Drawing Sheets

(51) Int. Cl.
*H01L 21/36* (2006.01)
*C25D 13/00* (2006.01)
*H01L 21/479* (2006.01)
*H01L 25/075* (2006.01)
*H01L 23/00* (2006.01)
*H01L 33/24* (2010.01)
*H01L 27/15* (2006.01)
*H01L 33/18* (2010.01)
*H01L 33/32* (2010.01)

(52) U.S. Cl.
CPC ............ *H01L 24/97* (2013.01); *H01L 25/0753* (2013.01); *H01L 24/80* (2013.01); *H01L 27/156* (2013.01); *H01L 33/18* (2013.01); *H01L 33/24* (2013.01); *H01L 33/32* (2013.01); *H01L 2224/08238* (2013.01); *H01L 2224/7598* (2013.01); *H01L 2224/75655* (2013.01); *H01L 2224/75723* (2013.01); *H01L 2224/80143* (2013.01); *H01L 2224/95101* (2013.01); *H01L 2224/95145* (2013.01); *H01L 2224/97* (2013.01); *H01L 2924/12041* (2013.01); *H01L 2924/15788* (2013.01)

(56) References Cited

U.S. PATENT DOCUMENTS

| | | | |
|---|---|---|---|
| 5,545,291 A * | 8/1996 | Smith et al. | 438/107 |
| 6,049,974 A * | 4/2000 | Asanasavest | 29/832 |
| 6,536,106 B1 | 3/2003 | Jackson et al. | |
| 7,662,008 B2 * | 2/2010 | Hillis et al. | 445/24 |
| 8,216,440 B2 | 7/2012 | Shibata et al. | |
| 2001/0031514 A1 * | 10/2001 | Smith | 438/107 |
| 2004/0106121 A1 * | 6/2004 | Ugolin et al. | 435/6 |
| 2005/0009303 A1 * | 1/2005 | Schatz | 438/466 |
| 2005/0079659 A1 * | 4/2005 | Duan et al. | 438/197 |
| 2005/0282307 A1 * | 12/2005 | Daniels | 438/82 |
| 2006/0009132 A1 * | 1/2006 | Bennett et al. | 451/8 |
| 2006/0051517 A1 * | 3/2006 | Haas et al. | 427/457 |
| 2006/0197213 A1 * | 9/2006 | Lian et al. | 257/687 |
| 2007/0087472 A1 * | 4/2007 | Huber et al. | 438/106 |
| 2007/0095669 A1 * | 5/2007 | Lau et al. | 204/547 |
| 2007/0126044 A1 * | 6/2007 | Shioya et al. | 257/306 |
| 2007/0155025 A1 * | 7/2007 | Zhang et al. | 438/3 |
| 2007/0224713 A1 * | 9/2007 | Han et al. | 438/26 |
| 2007/0228412 A1 * | 10/2007 | Yang et al. | 257/173 |
| 2007/0228421 A1 | 10/2007 | Shioya et al. | |
| 2007/0296032 A1 * | 12/2007 | Stumbo et al. | 257/347 |
| 2008/0218299 A1 * | 9/2008 | Arnold | 335/306 |
| 2008/0224123 A1 * | 9/2008 | Martin et al. | 257/23 |
| 2008/0251381 A1 * | 10/2008 | Shibata et al. | 204/483 |
| 2008/0277677 A1 * | 11/2008 | Kuo et al. | 257/91 |
| 2011/0058126 A1 | 3/2011 | Okada et al. | |
| 2012/0135158 A1 | 5/2012 | Freer et al. | |

FOREIGN PATENT DOCUMENTS

| | | |
|---|---|---|
| JP | 2008-512253 A | 4/2008 |
| JP | 2008-260073 A | 10/2008 |
| JP | 2010-506744 A | 3/2010 |
| WO | 2006/028942 A2 | 3/2006 |
| WO | 2009/101944 A1 | 8/2009 |

* cited by examiner

Fig.6
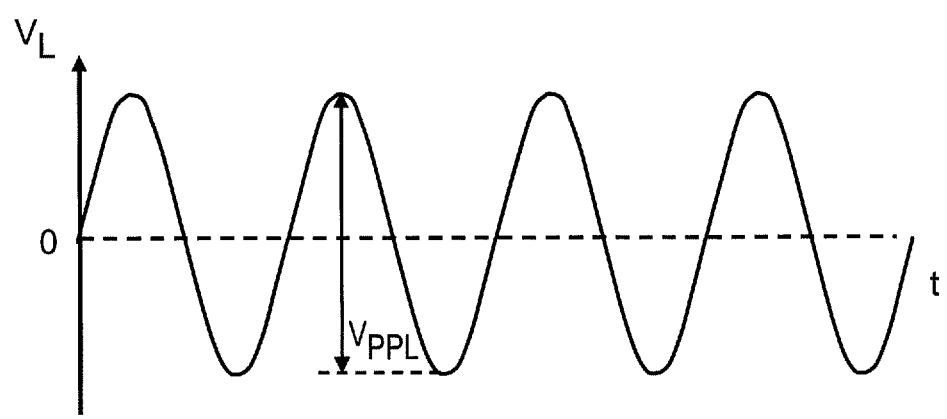
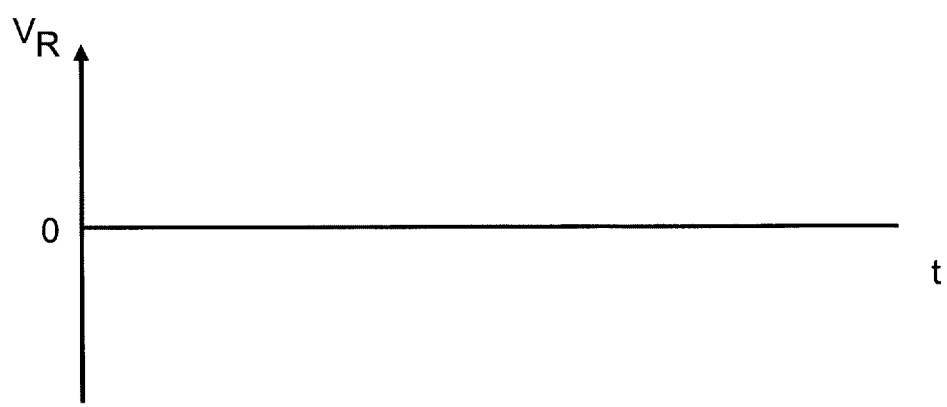

Fig.37A
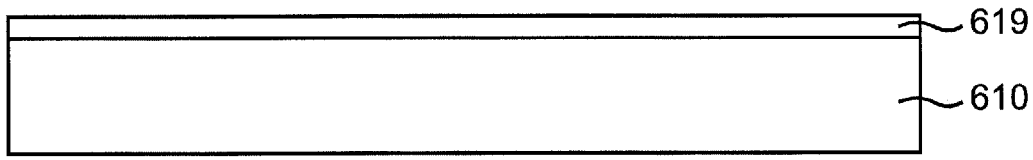
Fig.37B
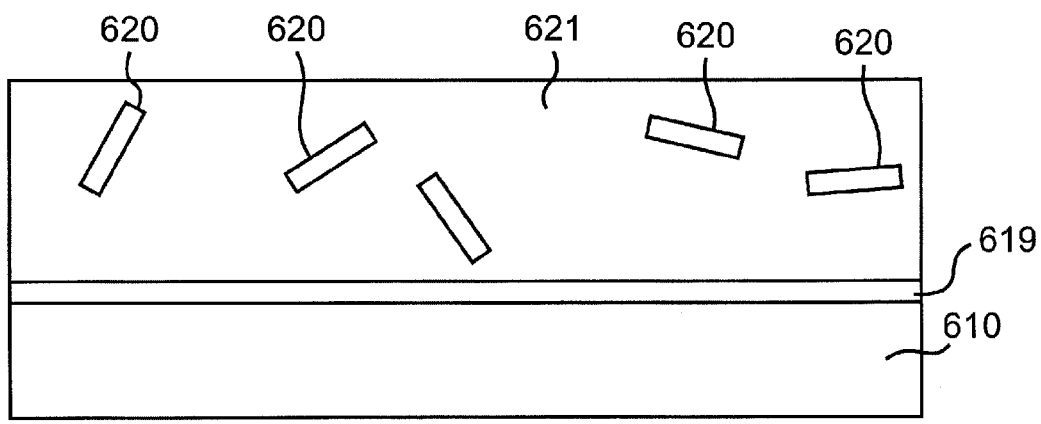
Fig.37C
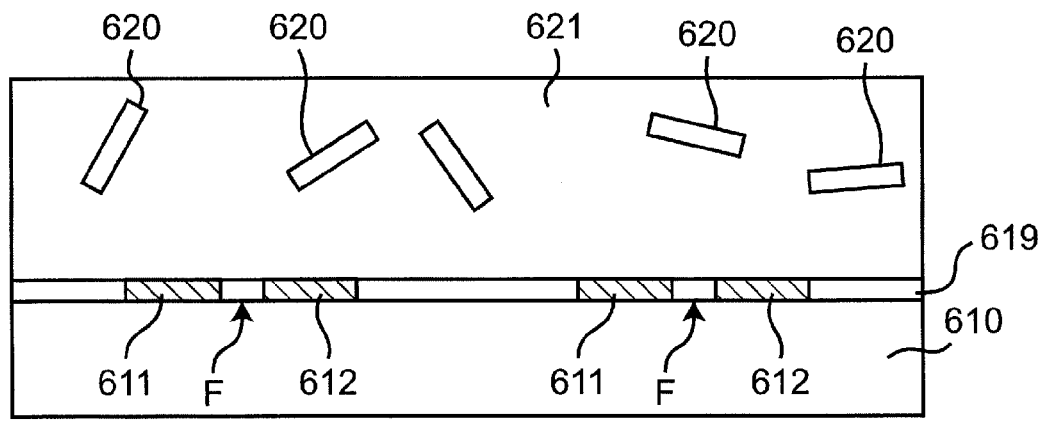
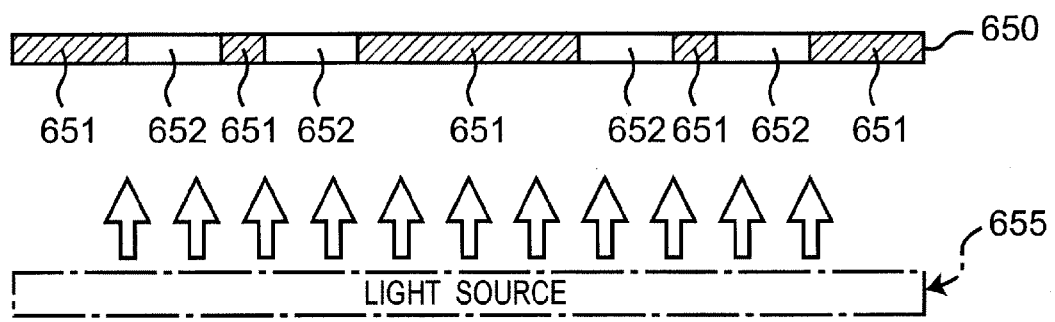

METHOD FOR DISPOSING FINE OBJECTS, APPARATUS FOR ARRANGING FINE OBJECTS, ILLUMINATING APPARATUS AND DISPLAY APPARATUS

TECHNICAL FIELD

The present invention relates to a disposing method for arranging fine objects on a substrate, an arranging apparatus based on the disposing method, and an illuminating apparatus as well as a display apparatus formed with use of the disposing method.

BACKGROUND ART

A conventional method for disposing fine objects at predetermined positions on a substrate is disclosed in Patent Literature 1 (U.S. Pat. No. 6,536,106 specification).

In the disclosure of Patent Literature 1, as shown in FIG. 58, an insulating medium (liquid) including nanowires 9925 is introduced onto a substrate 9970 patterned with a left side electrode 9950 and a right side electrode 9953, and a voltage is then applied between the left side electrode 9950 and the right side electrode 9953. Action of an electric field produced by the voltage on the nanowires 9925 causes so-called dielectrophoretic effect and the nanowires 9925 are thereby disposed so as to bridge finger-like portions 9955 of the two electrodes. Thus the nanowires 9925 that are fine objects can be disposed at predetermined positions on the substrate 9970.

In above conventional technique, however, the positions of the fine objects can be controlled, whereas directions thereof cannot be controlled. Specifically, the bar-like nanowires 9925 are each shown in FIG. 58 so as to be uniform without depiction of inner structure thereof, whereas with two ends of each nanowire 9925 discriminated as a first end and a second end, whether the first end, as an example, of each nanowire 9925 is positioned on upper side or on lower side in FIG. 58 is determined by mere chance and cannot be controlled.

CITATION LIST

Patent Literature

PATENT LITERATURE 1: U.S. Pat. No. 6,536,106 specification

SUMMARY OF INVENTION

Technical Problem

An object of the invention is to provide a disposing method for fine objects by which the fine objects can be disposed on a substrate with their position and direction controlled.

Solution to Problem

In order to achieve the above object, the present invention provides a method for disposing fine objects comprising:

a substrate preparing step for preparing a substrate in which positions where fine objects are disposed are defined;

a fluid introducing step for introducing a fluid containing the fine objects onto the substrate; and a fine object disposing step for disposing the fine objects, which are contained in the fluid introduced onto the substrate, in a predetermined orientation at predetermined positions on the substrate by electromagnetic force, wherein the fine objects respectively have a plurality of portions mutually differing in at least one of physical properties and shape;

further, at least the fine objects, out of the fine objects and the substrate, have an alignment structure for disposing the fine objects on the substrate so that the fine objects is aligned in a predetermined orientation defined by disposition of the plurality of portions, which mutually differ in at least one of physical properties and shape, relative to the substrate.

According to this invention, it becomes possible to dispose fine objects in a predetermined orientation at predetermined positions on a substrate, as has been impossible by conventional techniques using dielectrophoresis. Further, in comparison with the conventional common method in which the objects are grasped with a manipulator or the like and placed on a substrate, the disposition method of this invention eliminates the necessity for sophisticated alignment among the manipulator, the fine objects and the substrate, making it possible to attain the arrangement at lower costs and with simplicity.

In one embodiment, in the substrate preparing step, a substrate on which a first electrode and a second electrode have previously been formed is prepared, and in the fine object disposing step, a voltage is applied between the first electrode and the second electrode formed on the substrate so that the fine objects are disposed in a predetermined orientation and at predetermined positions in areas where the first electrode and the second electrode face each other.

According to this embodiment, by applying the voltage to the first electrode and the second electrode both formed previously in a desired pattern on the substrate, the fine objects can be disposed in a predetermined orientation at predetermined positions in areas where the first electrode and the second electrode face each other.

Also, in this embodiment, regions where the fine objects are arranged can be freely defined on the substrate by the first electrode and the second electrode. Further, with the method of disposing the fine objects on the substrate in the constitution, even when a large number of the fine objects are arranged, time and costs required for the disposing step hardly vary because the large number of areas where the first electrodes and the second electrode face each other have only to be provided. Besides, the method is quite suitable for improving the yield of the disposition because the forces acting between the substrate and the fine objects can be freely changed by regulation of the voltage.

Also, in one embodiment, the substrate is a transparent substrate and a semiconductor film is formed on one surface of the transparent substrate, and in the substrate preparing step, light whose incidence region is set to a certain pattern is let to be incident on the other surface of the transparent substrate, so that while the light keeps incident, portions of the semiconductor film on which the light is incident are selectively lowered in resistance, whereby the selectively lowered-in-resistance portions of the semiconductor film are formed as a first electrode and a second electrode, in the fine object disposing step, a voltage is applied between the first electrode and the second electrode formed on the substrate so that the fine objects are disposed in a predetermined orientation and at predetermined positions in areas where the first electrode and the second electrode face each other.

According to this embodiment, there is no need for previously patterning electrodes on the substrate, and the semiconductor film may well be deposited on the transparent substrate. Thus, the photolithography process and the etching process for patterning the electrodes on the substrate can be omitted, so that the process is simplified.

Also, in one embodiment, the fine objects each have a magnetized ferromagnetic material, the substrate has a magnetic field generating portion, and the ferromagnetic material forms an alignment structure of the fine objects while the magnetic field generating portion forms an alignment structure of the substrate, and wherein in the fine object disposing step, by a magnetic field generated by the magnetic field generating portion, the fine objects are disposed in a predetermined orientation and at predetermined positions defined by areas where the magnetic field is generated by the magnetic field generating portion.

According to this embodiment, by a magnetic field generated by the magnetic field generating portion, the fine objects are disposed in a predetermined orientation and at predetermined positions defined by areas where the magnetic field is generated by the magnetic field generating portion.

Also, in one embodiment, the fine objects each have a front side portion and a rear side portion mutually differing in dielectric constant, and the front side portion and the rear side portion form the alignment structure.

According to this embodiment, the fine objects can be disposed on the substrate with the position and orientation (front and rear) of the fine objects controlled. According to such a constitution, the fine objects can easily be disposed in the predetermined orientation at the predetermined positions on the substrate with a high yield without provision of alignment structures for the substrate and the like.

Also, in one embodiment, out of the front side portion and the rear side portion of the fine objects, one portion is formed from metal, and the other portion is formed from a semiconductor.

According to this embodiment, by effectively increasing the difference in dielectric constant between the front side portion and the rear side portion of the fine objects, the fine objects can be disposed in the predetermined orientation with a high probability.

Also, in one embodiment, out of the front side portion and the rear side portion of the fine objects, one portion is formed from a semiconductor and the other portion is formed from a dielectric material.

According to this embodiment, by effectively increasing the difference in dielectric constant between the front side portion and the rear side portion of the fine objects, the fine objects can be disposed in the predetermined orientation with a high probability. Further, since one of the materials of the front side portion and the rear side portion is a semiconductor, various types of semiconductor devices can be formed on the fine objects for addition of a wide variety of functions.

Also, in one embodiment, the fine objects each have two portions of mutually different sizes corresponding to the first electrode and the second electrode, respectively, in the predetermined positions, in the substrate, facing portions of the first electrode and facing portions of the second electrode face each other in areas where the first electrode and the second electrode face each other, and a width of each facing portion of the first electrode and a width of each facing portion of the second electrode are different from each other, two portions of the fine objects mutually differing in sizes form an alignment structure of the fine objects, and the facing portions of the first electrode and the facing portions of the second electrode, which mutually differ in width, form an alignment structure of the substrate.

According to this embodiment, orientation of the fine objects in their disposition onto the substrate can effectively be controlled by combinations between the alignment structure of the fine objects and the alignment structure of the substrate, thus making it possible to dispose the fine objects in a predetermined orientation at predetermined positions on the substrate with high yield.

Also, in one embodiment, the fine objects each have a front side portion and a rear side portion mutually differing in dielectric constant and further have two portions of mutually different sizes corresponding to the first electrode and the second electrode, respectively, in the predetermined positions, in the substrate, facing portions of the first electrode and facing portions of the second electrode face each other in areas where the first electrode and the second electrode face each other, and a width of each facing portion of the first electrode and a width of each facing portion of the second electrode are different from each other, the front side portion and the rear side portion of the fine objects mutually differing in dielectric constant as well as the two portions mutually differing in sizes form an alignment structure of the fine objects, and the facing portions of the first electrode and the facing portions of the second electrode, which mutually differ in width, form an alignment structure of the substrate.

According to this embodiment, the fine objects can be disposed on the substrate with their position and orientation (including front/rear orientation) controlled.

Also, in one embodiment, in the fine object disposing step, the fluid containing the fine objects introduced onto the substrate is made to flow relative to the substrate.

According to this embodiment, fine objects that are going to be disposed on the substrate in undesirable orientations can be washed away, and fine objects in a desirable orientation (predetermined orientation) only can be disposed on the substrate. Thus, the orientation of the fine objects can be controlled with better yield.

Also, in one embodiment, the alignment structure of the fine objects is that the fine objects each have a magnetized ferromagnet, and in the fine object disposing step, the fine objects are aligned in the predetermined orientation by an external magnetic field.

According to this embodiment, the fine objects can be disposed on the substrate with the position and orientation of the fine objects controlled. With this constitution, without imparting an alignment structure to the substrate, the fine objects can be disposed in a predetermined orientation at predetermined positions on the substrate simply with high yield. Also, in the fine object disposing step, there is no need for making the fluid containing the fine objects flow relative to the substrate for improvement of the yield in the alignment of the fine objects into the predetermined orientation. Therefore, the fine objects are free from disturbance of their orientation by the flow of the fluid, so that the fine objects can be disposed on the substrate in a uniform orientation with quite high yield.

Also, in one embodiment, the external magnetic field is directed generally parallel to a surface of the substrate.

According to this embodiment, it becomes possible to dispose the fine objects at predetermined positions on the substrate under control of the orientation of the fine objects with respect to an axial direction parallel to the surface of the substrate.

Also, in one embodiment, the external magnetic field is directed generally vertical to a surface of the substrate.

According to this embodiment, it becomes possible to dispose the fine objects at predetermined positions on the substrate with the orientation of the fine objects controlled with respect to an axial direction vertical to the surface of the substrate. That is, the fine objects can be disposed at the predetermined positions on the substrate with front/rear orientation of the fine objects uniformized.

Also, in one embodiment, the alignment structure of the fine objects is that the fine objects each have a magnetized ferromagnet, and the substrate also has an alignment structure, and the alignment structure of the substrate is that a magnetized ferromagnet is formed in correspondence to each of predetermined positions on the substrate.

According to this embodiment, orientation of the fine objects in their disposition onto the substrate can effectively be controlled by combinations between the alignment structure of the fine objects and the alignment structure of the substrate, thus making it possible to dispose the fine objects in a predetermined orientation at predetermined positions on the substrate with high yield. Also, in the fine object disposing step, there is no need for fluidizing the fluid containing the fine objects relative to the substrate for improvement of the yield in the alignment of the fine objects into the predetermined orientation. Therefore, the fine objects are free from disturbance of their orientation by the flow of the fluid, so that the fine objects can be disposed on the substrate in a uniform orientation with quite high yield.

Also, in one embodiment, a plurality of the predetermined positions are defined on the substrate, and a plurality of the fine objects are disposed on the substrate.

According to this embodiment, the effects of the invention become especially remarkable. This is because, for cases in which a plurality of fine objects are disposed on the substrate, conventional common methods using a manipulator or the like would involve costs and time generally proportional to the number of fine objects whereas use of the present invention makes the costs and time hardly depend on the number of the fine objects.

Also, in one embodiment, there is provided an arranging apparatus using the method for disposing fine objects to dispose the fine objects onto the substrate, the arranging apparatus comprising:

a fluid introducing section for introducing a fluid containing the fine objects onto the substrate; and an electromagnetic force applying section for applying electromagnetic force to the substrate.

According to this embodiment, the arranging apparatus is an apparatus for actually executing the method for disposing fine objects onto a substrate in this invention. Therefore, it becomes possible to dispose the fine objects in a predetermined orientation at predetermined positions on the substrate, as has been impossible by conventional techniques using dielectrophoresis. Also, in comparison with arranging apparatuses using the conventional common method in which fine objects are grasped with a manipulator or the like and disposed on a substrate, the arranging apparatus of this embodiment has no necessity for sophisticated alignment among the manipulator, the fine objects and the substrate, making it possible to achieve the arrangement of the fine objects at lower costs and with simplicity.

On condition that a plurality of fine objects are disposed on the substrate, in particular, superiority of this arranging apparatus to arranging apparatuses employing the conventional common technique using the manipulator or the like is remarkable. For instance, labor of arranging ten fine objects by the manipulator is about ten times as heavy as that of arranging one fine object. By contrast, labor and costs for the arrangement with the arranging apparatus of this embodiment hardly depend on the number of fine objects that are arranged.

Also, in one embodiment, there is provided an illuminating apparatus which is fabricated by using the method for disposing fine objects, wherein each of the fine objects is a light emitting diode.

According to this embodiment, since a light emitting substrate in which a plurality of fine light emitting diodes are disposed in great multiplicity on the substrate can simply be realized, the following effects can be obtained, compared with cases using light emitting substrates in which one or several light emitting diodes are disposed. First, each one light emitting diode has a small light emission area and moreover those diodes are dispersed on the substrate, so that the heat generation density due to light emission is smaller and moreover can be uniformized. On the other hand, ordinary light emitting diodes have large light emitting areas (which may reach 1 $mm^2$) so that the heat generation density due to light emission is larger, causing the light emitting layer to be high in temperature, giving influences on the luminous efficacy and reliability. With a plurality of fine light emitting diodes disposed on the substrate, the luminous efficacy can be improved and the reliability can be improved.

This illuminating apparatus including a plurality of fine light emitting diodes is fabricated by using the method for disposing fine objects onto a substrate, so that the fine objects can be disposed with their orientation (polarity) uniformized. Therefore, all the light emitting diodes can be made to emit light with high efficiency by DC drive. With conventional methods incapable of uniformizing the orientation, about half the fine light emitting diodes do not emit light.

Further, since the illuminating apparatus of this embodiment is fabricated by using the method for disposing fine objects onto a substrate according to the invention, the illuminating apparatus has an advantage of very low cost required for the process for the disposition.

Also, in one embodiment, there is provided a display apparatus which is fabricated by using the method for disposing fine objects, wherein each of the fine objects is a light emitting diode.

According to this embodiment, the display apparatus is made by using the method for disposing fine objects onto a substrate according to the invention. The method for disposing fine objects onto a substrate according to the invention is capable of disposing the fine objects in a predetermined orientation at predetermined positions on the substrate, thus suitable for fabricating the display apparatus. Further, since the display apparatus of this embodiment is fabricated by using the method for disposing fine objects onto a substrate according to the invention, the display apparatus has an advantage of very low cost required for the process for the disposition.

Advantageous Effects of Invention

According to the fine object disposition method of the invention, it becomes possible to dispose fine objects in a predetermined orientation at predetermined positions on a substrate, as has been impossible by conventional techniques using dielectrophoresis. Further, in comparison with the conventional common method in which the objects are grasped with a manipulator or the like and placed on a substrate, the disposition method of this invention eliminates the necessity for sophisticated alignment among the manipulator, the fine objects and the substrate, making it possible to attain the arrangement at lower costs and with simplicity.

BRIEF DESCRIPTION OF DRAWINGS

FIG. 6 is a waveform chart showing wave forms of the voltage that is applied between the first and second electrodes in the fine object disposing step in the first embodiment;

FIG. 37A is a sectional view showing a substrate prepared in a substrate preparing step in a sixth embodiment of a disposing method for fine objects of the invention;

FIG. 37B is a sectional view for explaining a fluid introducing step in the sixth embodiment;

FIG. 37C is a sectional view for explaining an electrode forming step in the sixth embodiment;

DESCRIPTION OF EMBODIMENTS

Figure 1:
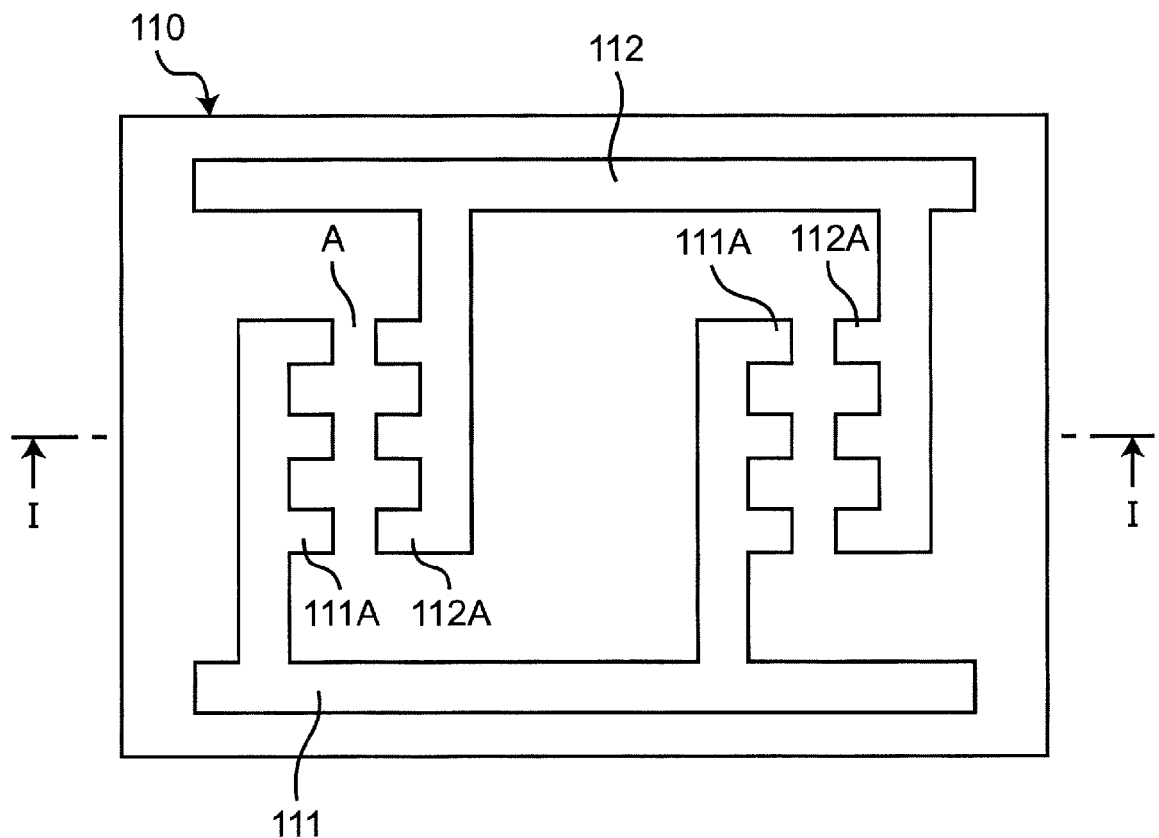
FIG. 1 is a plan view of a substrate prepared in a first embodiment of a disposing method for fine objects of the invention.

Hereinbelow, the invention will be described in detail with reference to embodiments shown in the drawings.

In the invention, fine objects designate objects having a maximum dimension of 100 μm or smaller, as an example, but connote objects having a maximum dimension exceeding 100 μm and being smaller than or equal to 1 mm. For disposing such objects having a maximum dimension smaller than or equal to 1 mm on a substrate with their position and direction controlled, a conventional common method in which the objects are grasped with a manipulator or the like and placed on the substrate is markedly difficult to perform, results in a low throughput, or requires great costs. With use of a method of the invention, accordingly, marked effects can be attained in contrast to effects of both the above common method and the background art. On condition that the maximum dimension of each fine object is 100 μm or smaller, in particular, the common method in which the objects are grasped with a manipulator or the like and placed on a substrate is substantially impossible to perform and therefore the method of the invention is particularly effective.

It is particularly preferable for each fine object to have a maximum dimension smaller than or equal to 100 μm and a minimum dimension smaller than or equal to 10 μm. Columnar objects having a diameter of 1 μm and a length of 20 μm can be mentioned as an example of such fine objects. This is because it is particularly difficult to use the conventional common method in which the objects are grasped with a manipulator or the like and placed on a substrate, for such objects have very small mechanical strength.

Shape of the fine objects can be selected from various shapes such as shapes of triangular prism, quadrangular prism, polygonal column, elliptic cylinder, and strip, in addition to the columnar shape. The shape of the objects may include asymmetrical shapes such as those provided with protrusions for determination of a direction involved in arrangement as required, as will be described in the following embodiments.

Material of the fine objects can be selected from various materials including dielectric materials such as metal oxide, metal nitride, and resin, semiconductors such as silicon, germanium, gallium arsenide, silicon carbide, zinc oxide, and gallium nitride, metals such as gold, silver, copper, and aluminum, and complexes thereof. The material of the fine objects may further include a ferromagnetic material, such as iron, iron oxide, chromium oxide, cobalt, and ferrite, for determination of the direction in the arrangement as required, as will be described in the following embodiments. Herein, ferromagnetic material connotes ferrimagnetic material. The ferromagnetic material also implies occurrence therein of spontaneous magnetization at room temperature. The fine objects themselves may have functions as devices. The devices may be diodes, light emitting diodes, transistors, integrated circuits having terminals on minute chips and/or the like.

The specific shape and material of the fine objects are mentioned as examples and are not limited thereto.

The method for disposing fine objects on a substrate in accordance with the invention includes: (1) a substrate preparing step for preparing a substrate on which predetermined positions for disposition of the fine objects are defined; (2) a fluid introducing step for introducing fluid containing the fine objects onto the substrate; and (3) a fine object disposing step for disposing the fine objects, contained in the fluid introduced onto the substrate, in a predetermined orientation at predetermined positions on the substrate, and (4) at least the fine objects have an alignment structure for the disposition in the predetermined orientation on the substrate.

The method makes it possible to dispose fine objects in a predetermined orientation at predetermined positions on a substrate, as has been impossible by conventional techniques using dielectrophoresis. In comparison with the conventional common method in which the objects are grasped with a manipulator or the like and placed on a substrate, the method eliminates the necessity for sophisticated alignment among the manipulator, the fine objects and the substrate, making it possible to attain the arrangement at lower costs and with simplicity.

On condition that a plurality of fine objects are disposed on the substrate, in particular, superiority of this method to the conventional common technique using the manipulator or the like is remarkable. For instance, labor of arranging ten fine objects by the manipulator is about ten times as heavy as that of arranging one fine object. By contrast, the method for disposing fine objects on a substrate in accordance with the invention hardly depend on the number of fine objects that are arranged. Therefore, the method is particularly preferable for arranging ten or more fine objects on a substrate. In the embodiments that will be described later, tens of thousands of fine objects may be disposed. In reality, an upper limit of the number of fine objects that are disposed on a substrate is one billion because it is undesirable in terms of costs to increase size of the substrate for the arrangement without any restriction.

There are not only one type but a plurality of types of the substrate preparing step, the fine object disposing step, and the alignment structure the fine objects have, which constitute the invention. In the invention, at least the fine objects have the alignment structure and also the substrate may have an alignment structure.

Hereinbelow, the invention will be described in detail with reference to various embodiments.

First Embodiment

A first embodiment of the invention will be described with reference to FIGS. 1 to 9. In this embodiment, the fine objects solely have the alignment structure and the orientation in which the fine objects are disposed on a substrate is thereby controlled effectively.

(Substrate Preparing Step)

In the substrate preparing step, a substrate 110 in which a first electrode 111 and a second electrode 112 are formed on a surface thereof as shown in FIG. 1 is prepared. In this case, the substrate 110 is an insulated substrate and the first, second electrodes 111, 112 are metal electrodes. The metal electrodes (first, second electrodes 111, 112) in desired electrode shapes can be formed on the surface of the substrate 110 by using a printing technique as an example. The first, second electrodes 111, 112 can be formed by uniform deposition of a metal film and a photoconductor film on the surface of the substrate 110, exposure and development of the photoconductor film into a desired electrode pattern, and etching of the metal film with the patterned photoconductor film used as a mask.

Gold, silver, copper, tungsten, aluminum, tantalum, alloys of these or the like can be used as metal material from which the first, second electrodes 111, 112 are formed. The substrate 110 is formed from insulator such as glass, ceramic, alumina and resin, or semiconductor such as silicon of which a surface has insulative property with a silicon oxide film formed. With use of the glass substrate, it is desirable to form a foundation insulating film such as a silicon oxide film and a silicon nitride film on a surface thereof.

Surfaces of the first, second electrodes 111, 112 may be covered with an insulating film, which is not shown. In this case, the following effects are produced. In the later fine object disposing step, a voltage is applied between the first electrode 111 and the second electrode 112 with a liquid introduced onto the substrate 110, in which case any flow of electric current between the electrodes 111, 112 can be prevented. Such a current may cause a voltage drop in the electrodes to make a cause of arrangement failures of the fine objects or otherwise may cause dissolution of the electrodes due to an electrochemical effect. The insulating film for covering the first, second electrodes 111, 112 may be given, for example, by using a silicon oxide film or a silicon nitride film. Without covering by such an insulating film, on the other hand, the first, second electrodes 111, 112 and the later-described fine objects 120 can be electrically connected to each other with simplicity, making it easier to utilize the first, second electrodes 111, 112 for interconnection.

Areas where the fine objects, which will subsequently be described, are disposed are defined by areas A where facing portions 111A, 112A of the first, second electrodes 111, 112 face each other. That is, in the later-described fine object disposing step, the fine objects are disposed in the areas A where the facing portions 111A, 112A of the first, second electrodes 111, 112 face each other so as to bridge the first, second electrodes 111, 112. Therefore, it is desirable that a distance between the first electrode 111 and the second electrode 112 in each area A where the facing portions 111A, 112A of the first, second electrodes 111, 112 face each other is slightly shorter than a length of each fine object. As an example, on condition that the fine object is elongate strip-shaped and 20 μm long, the distance between the facing portion 111A of the first electrode 111 and the facing portion 112A of the second electrode 112 is desirably set to 12 μm to 18 μm. That is, the distance is desirably set to about 60 to 90% of the length of the fine object, more preferably about 80 to 90% of the length.

(Fine Objects)

Figure 2:
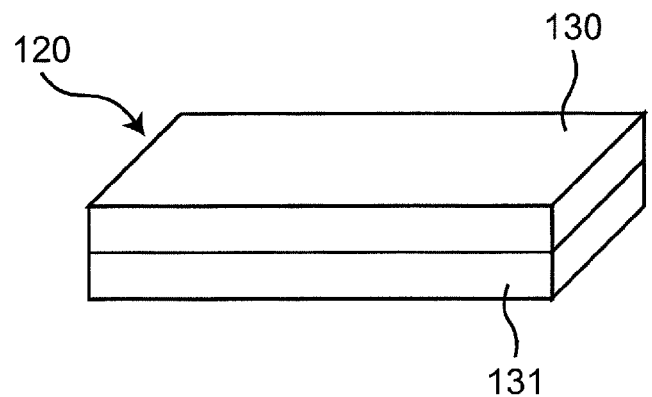
FIG. 2 is a perspective view of a fine object that is disposed in the first embodiment.

Next, fine objects to be disposed on the substrate 110 will be described. As shown in FIG. 2, a fine object 120 is strip-shaped and has a front side surface and a rear side surface. The fine object 120 has only to have the front side surface and the rear side surface defined thereon, does not necessarily have to be strip-shaped, and may be formed into circular, elliptical, polygonal or other shapes. The fine object 120 may be sized to have, for example, a longer side length of 10 μm, a shorter side length of 5 μm, and a thickness of 0.5 μm, but this is not limitative.

A front side layer 130 and a rear side layer 131 of the fine object 120 are made of materials having mutually different dielectric constants, respectively. The effects of the invention are attained as long as the materials constituting the front side layer 130 and the rear side layer 131 of the fine object 120 have different dielectric constants as will be described later, and thus any combination is permitted as the materials. There are, however, preferred combinations as shown below because the greater the difference in dielectric constant between the front side layer 130 and the rear side layer 131 is, the greater the effects are attained. The alignment structure of the fine object 120 is that the front side surface and the rear side surface are defined on the fine object 120 while the front side surface and the rear side surface differ in dielectric constant from each other.

A first preferred combination is that the front side layer 130 of the fine object 120 is formed from a dielectric material while the rear side layer 131 is formed from a metal. A metal, in which surface charge is generated at low frequencies until its internal electric field is dissipated, has a substantially infinite dielectric constant. A second preferred combination is that the front side layer 130 of the fine object 120 is formed from a dielectric material while the rear side layer 131 is formed from a semiconductor. A semiconductor, in which free carriers existing in its inside can be induced to its surfaces at low frequencies, also has a substantially infinite dielectric constant at low frequencies as in the case of metals. However, semiconductors have not so high following frequencies as those of metals, and show a behavior close to that of dielectric materials at sites where a depletion layer is formed. A large advantage of the second preferred combination is that the fine object 120 can be made to function as various devices. Hereinbelow, the description is continued on a case where the front side layer 130 of the fine object 120 is formed from a dielectric material while the rear side layer 131 is formed from a semiconductor, with a diode formed on the rear side layer 131.

FIGS. 3A to 3E are views showing a method for fabricating the fine object 120.

Figure 3A:
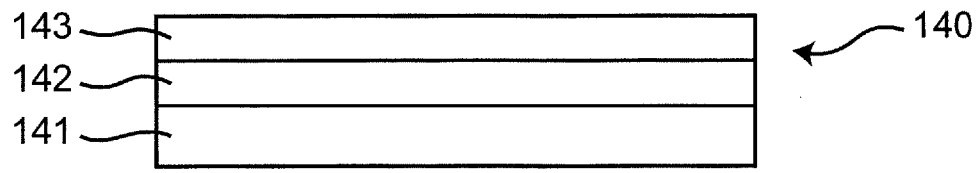
FIG. 3A is a sectional view for explaining a method of fabricating the fine object.

First, an SOI (Silicon On Insulator) substrate 140 as shown in FIG. 3A is prepared. The SOI substrate 140 is composed of a silicon substrate 141, a BOX (Buried OXide) layer 142 made of a silicon oxide film, and an SOI layer 143.

Figure 3B:
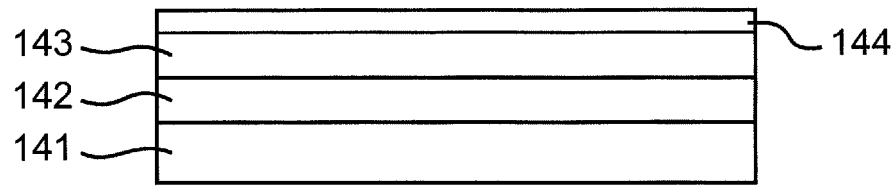
FIG. 3B is a sectional view for explaining the method of fabricating the fine object.

Next, as shown in FIG. 3B, a silicon nitride film 144 is formed on the SOI layer 143. This silicon nitride film 144 can be formed by CVD (Chemical Vapor Deposition) process.

Figure 3C:
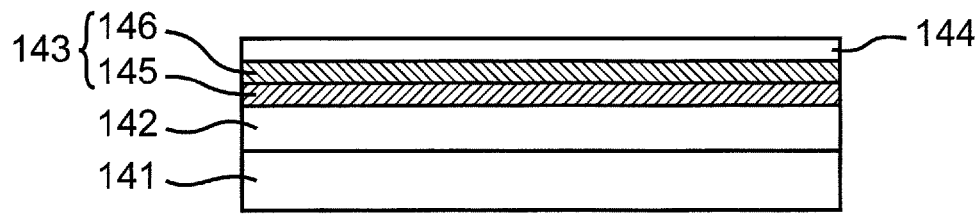
FIG. 3C is a sectional view for explaining the method of fabricating the fine object.

Next, as shown in FIG. 3C, an n-type impurity region 145 and a p-type impurity region 146 are formed in layers in the SOI layer 143. The n-type impurity region 145 and the p-type impurity region 146 can be formed by ion-implanting arsenic and boron into the SOI layer 143 and performing annealing for activation. As a result, a pn junction is formed at a boundary between the n-type impurity region 145 and the p-type impurity region 146.

Figure 3D:
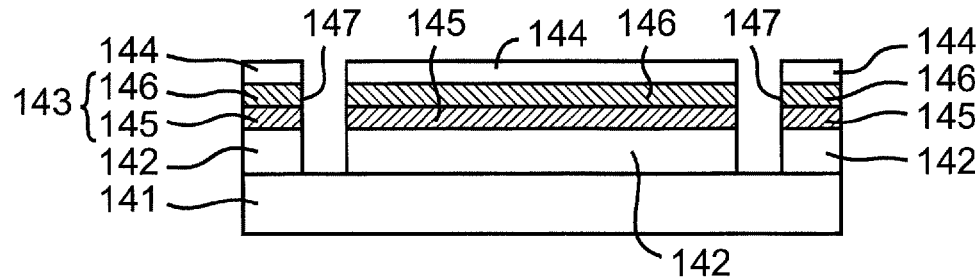
FIG. 3D is a sectional view for explaining the method of fabricating the fine object.

Next, as shown in FIG. 3D, a trench 147 is formed on the SOI substrate 140 at least until the BOX layer 142 is exposed. This trench 147 can be formed by normal photolithography process and dry etching process applied to the SOI substrate 140.

Figure 3E:
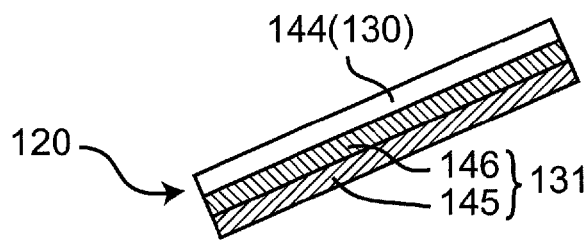
FIG. 3E is a sectional view for explaining the method of fabricating the fine object.

Next, as shown in FIG. 3E, the SOI substrate 140 is immersed into a hydrofluoric acid solution so that the BOX layer 142 made of a silicon oxide film is dissolved to separate the fine object 120 from the SOI substrate 140. In this step, since the silicon nitride film 144 remains unsolved, there can be obtained a fine object 120 having a front side layer 130 made of an insulating film (silicon nitride film 144), and a rear side layer 131 made of a semiconductor (n-type, p-type impurity regions 145, 146). This fine object 120 is a pn junction-containing device (diode), and it is quite important whether the fine object 120 is disposed on a substrate with the front side surface positioned on the upper side or with the rear side surface positioned on the upper side, because the device has polarity, and thus it is important to control not only the area for the disposition but also orientation (positions of the front and the rear) thereof.

(Fluid Introducing Step)

Figure 4:
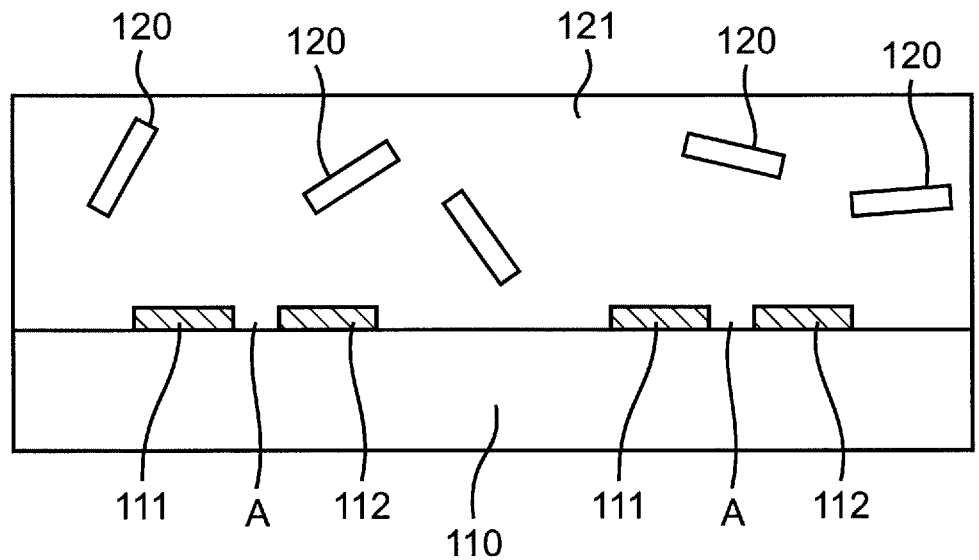
FIG. 4 is a sectional view, taken along the line I-I of FIG. 1, showing an aspect that a liquid 121 is introduced onto the substrate 110.

In this step, as shown in FIG. 4, a fluid 121 containing fine objects 120 is introduced onto the substrate 110. The fine objects 120 are dispersed in the fluid 121. FIG. 4 is a sectional view showing an aspect that the fluid 121 has been introduced onto the substrate 110, in a cross section taken along the line I-I of FIG. 1.

Liquids such as IPA (isopropyl alcohol), ethanol, methanol, ethylene glycol, propylene glycol, acetone, and water or mixtures thereof can be used as the fluid 121, whereas the fluid 121 is not limited thereto. Preferable properties which the fluid 121 should have are low viscosity such that the arrangement of the fine objects 120 is not hindered, ion concentration that is not remarkably high, and possession of volatility such that the substrate 110 can be dried after the arrangement of the fine objects 120. Use of a liquid having remarkably high ion concentration prevents the electric field from permeating the liquid, by prompt formation of electric double layers on the electrodes 111, 112, when a voltage is applied to the first, second electrodes 111, 112, with the result that the arrangement of the fine objects 120 is inhibited.

Although not shown, a cover is preferably provided above the substrate 110 so as to face the substrate 110. The cover is provided so as to parallel the substrate 110 and a uniform clearance (e.g., 500 μm) is provided between the substrate 110 and the cover. The clearance is filled with the fluid 121 containing the fine objects 120. As a result, it becomes possible to make the fluid flow through a channel of the clearance at uniform velocity and to uniformly dispose the fine objects 120 on the substrate 110 in the next-described fine object disposing step. This also prevents the fluid 121 from evaporating, causing convection, and disturbing the disposition of the fine objects 120 in the next-described fine object disposing step.

(Fine Object Disposing Step)

Figure 5:
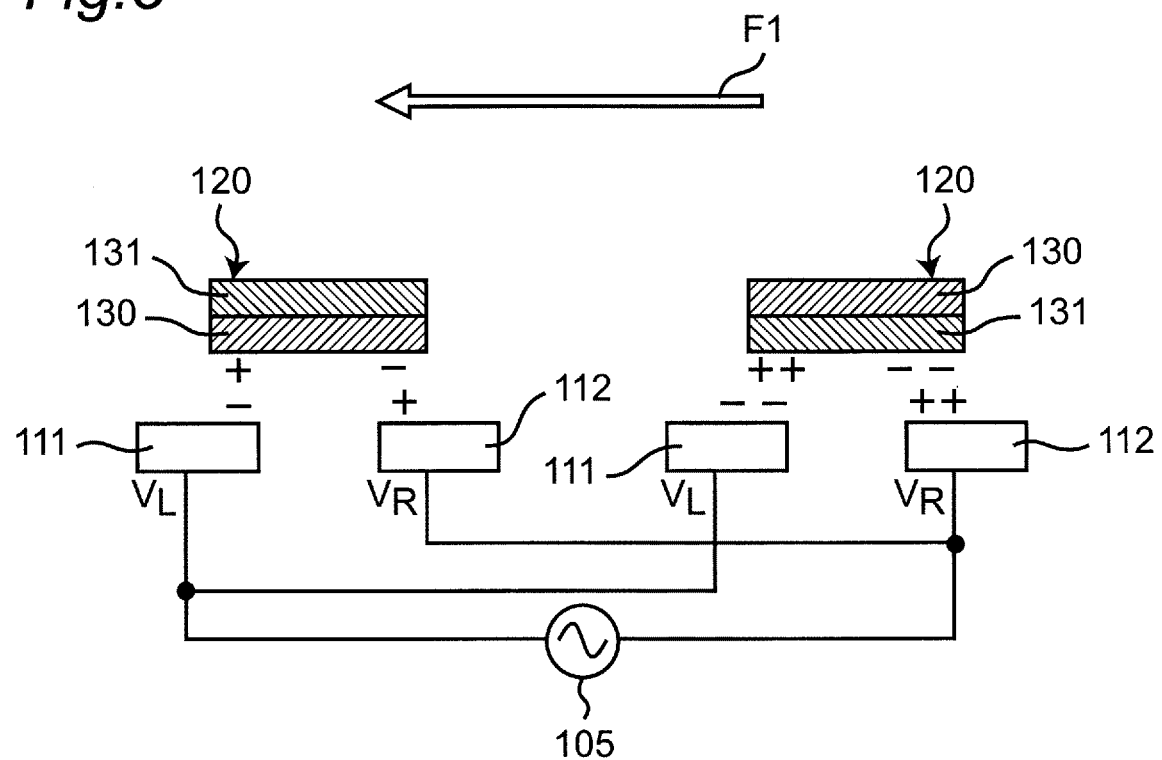
FIG. 5 is a schematic view showing an aspect that a voltage is applied between first and second electrodes in a fine object disposing step in the first embodiment.
Figure 7:
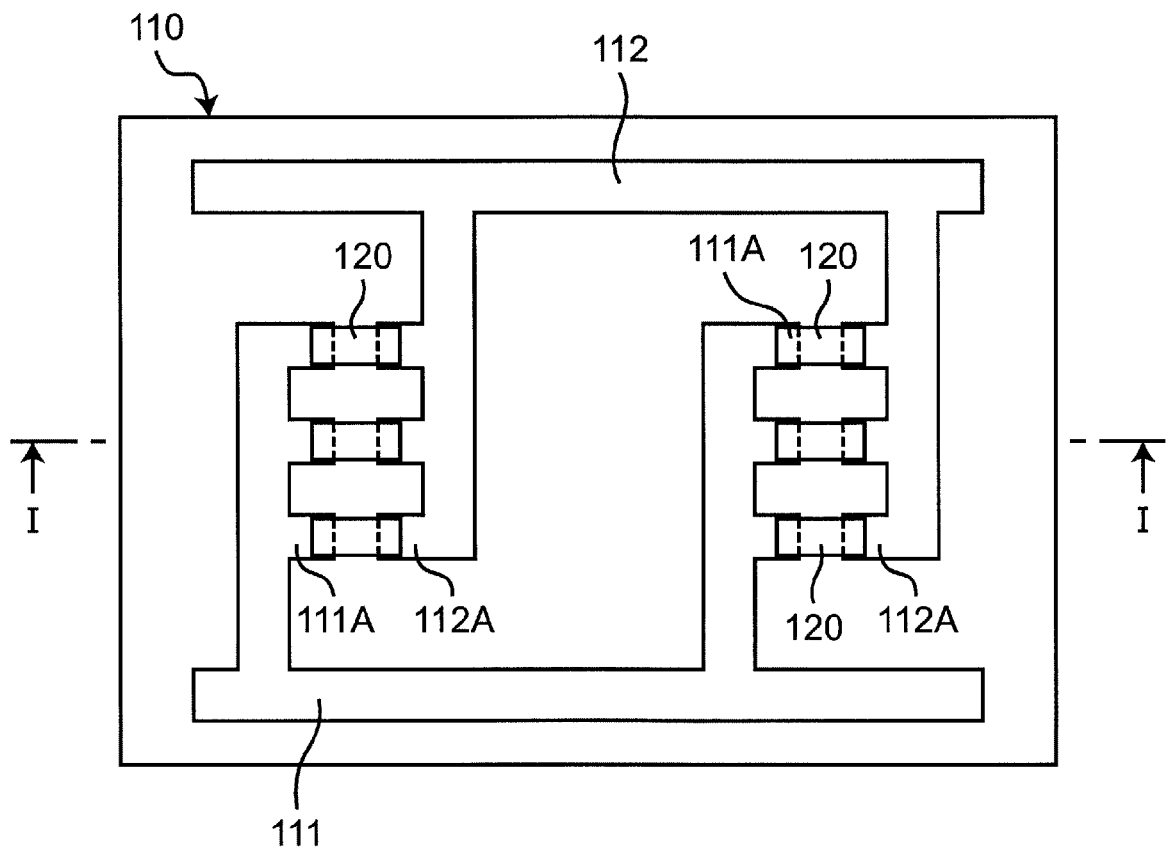
FIG. 7 is a plan view showing a state in which the fine objects are disposed at predetermined positions and in a predetermined orientation on the substrate in the first embodiment.
Figure 8:
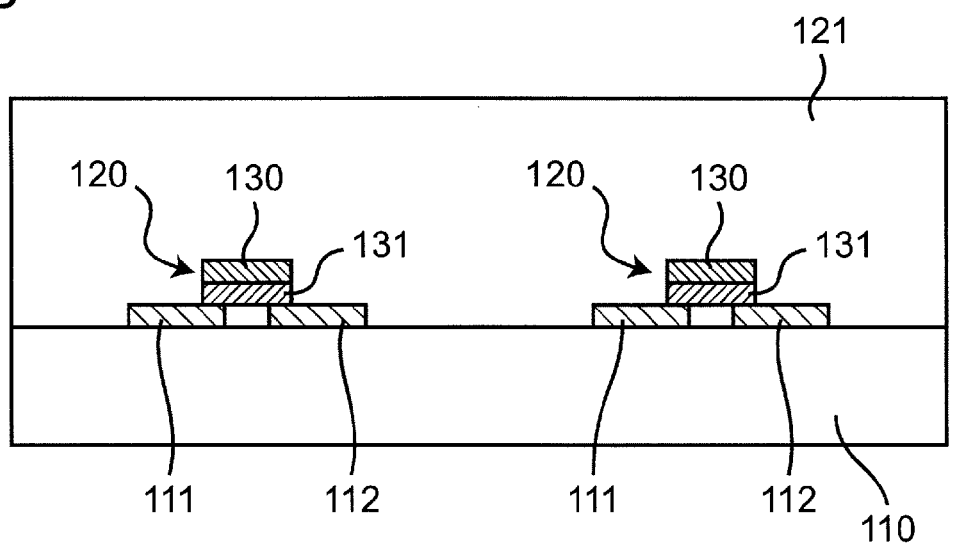
FIG. 8 is a sectional view taken along the line I-I of FIG. 7.

In this step, a voltage is applied between the first electrode 111 and the second electrode 112 as shown in FIGS. 5 and 6 after the above-described fluid introducing step, and the fine objects are consequently disposed in a predetermined orientation at predetermined positions on the substrate 110 as shown in FIGS. 7 and 8. FIG. 8 shows a sectional view taken along line I-I of FIG. 7.

FIG. 5 illustrates a principle on which the fine objects 120 are disposed with their orientation uniformized in areas where the first, second electrodes 111, 112 face each other. Such an AC voltage as shown in FIG. 6 is applied by an AC power supply 105 between the first electrode 111 and the second electrode 112. In FIG. 6, a reference potential $V_R$ is applied to the second electrode 112 and the AC voltage $V_L$ having an amplitude of $V_{PPL}/2$ is applied to the first electrode 111 with time t. Upon the application of the voltage between the first electrode 111 and the second electrode 112, an electric field is generated in the fluid 121. By the electric field, polarization occurs or electric charges are induced in the fine objects 120, and electric charges are induced to surfaces of the fine objects 120. Through agency of the induced electric charges, attractive forces act between the first, second electrodes 111, 112 and the fine objects 120 (actually, existence of electric field gradient around the objects 120 is required for occurrence of dielectrophoresis, and dielectrophoresis does not act on objects existing in parallel flat plates that are indefinitely large, whereas dielectrophoresis occurs in such electrode disposition as shown in FIG. 5 because the electric field is intensified with increasing closeness to the electrodes).

On condition that the fine objects 120 each have the front side surface and the rear side surface as shown in FIG. 5 and that the front side layer 130 and the rear side layer 131 thereof are made of materials having different dielectric constants, densities of charges induced on surfaces of the fine objects 120 that face the electrodes 111, 112 differ. On condition that the dielectric constant of the front side layer 130 is smaller than the dielectric constant of the rear side layer 131, for instance, more charges are induced on a surface of the fine object 120, shown on right side in FIG. 5, with the rear side layer 131 facing the first, second electrodes 111, 112 than on a surface of the fine object 120 with the front side layer 130 facing the first, second electrodes 111, 112. That is, the attractive force that acts between the first, second electrodes 111, 112 and the fine object 120 is increased when a side having the larger dielectric constant faces the electrodes 111, 112. This makes it possible to dispose the fine objects 120, with the front side layers 130 thereof selectively positioned on the upper side, at corresponding positions on the electrodes 111, 112 on the substrate 110.

During the fine object disposing step, the fluid 121 introduced onto the substrate 110 and containing the fine objects 120 is preferably made to flow relative to the substrate 110 as exemplified by an arrow F1 in FIG. 5. Fine objects 120 that are going to be disposed on the substrate 110 in undesirable orientations in which the front side layers 130 face the electrodes 111, 112 as shown on left side in FIG. 5 can be washed away by the flow of the fluid 121 because the attractive forces between the objects and the electrodes 111, 112 are small. Therefore, fine objects 120 with the desirable orientation in which the rear side layers 131 face the electrodes 111, 112 as shown on right side in FIG. 5 can be disposed on the substrate 110. As a result, the orientation of the fine objects 120 can be controlled with better yield.

In this way, as shown in FIGS. 7 and 8, the fine objects 120 can be arranged in the predetermined orientation (in which the rear side layers 131 of the fine objects 120 face the electrodes 111, 112) in the predetermined positions (areas A where the facing portions 111A, 112A of the first, second electrodes 111, 112 face each other) on the substrate 110.

With IPA used as the fluid, the frequency of the AC voltage fed to the first electrode 111 is preferably set to 10 Hz to 1 MHz, more preferably 50 Hz to 1 kHz, which makes the arrangement most stable. Further, the AC voltage to be applied between the first electrode 111 and the second electrode 112 is not limited to sine waves and may be any one that periodically varies such as rectangular waves, triangular waves and sawtooth waves. The AC voltage $V_{PPL}$ (double of amplitude) fed to the first electrode 111 may be 0.1 to 10 V, where voltages lower than 0.1 V result in worse arrangement of the fine objects 120 while voltages higher than 10 V cause the fine objects 120 to be immediately fixed onto the substrate 110 with a result of worse disposition yield. Therefore, the voltage is preferably set to 1 to 5 V, more preferably to about 1 V.

Next, after completion of the disposition of the fine objects 120 onto the substrate 110, the substrate 110 is heated with the voltage application maintained, so that the liquid is evaporated to fulfill drying, making the fine objects 120 fixed onto the substrate 110. Otherwise, after completion of the disposition of the fine objects 120, a sufficiently high voltage (10 to 100 V) is applied to the first electrode 111 and the second electrode 112 so that the fine objects 120 are fixed onto the substrate 110, and with the voltage application stopped, the substrate 110 is dried.

(Interconnection Step)

Figure 9A:
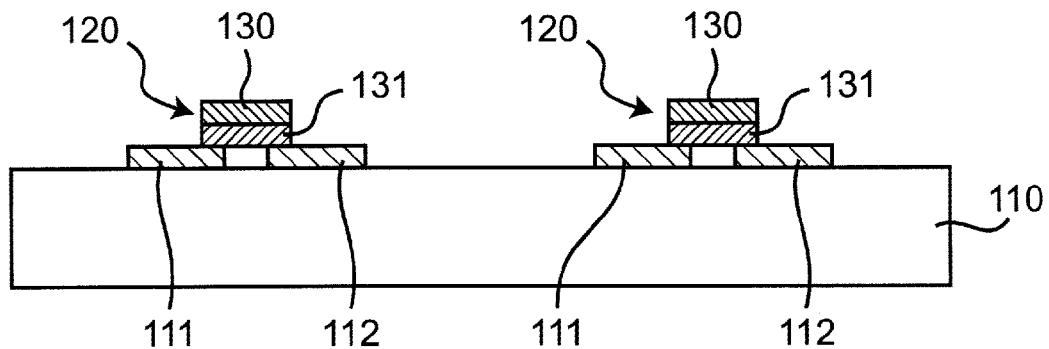
FIG. 9A is a view for explaining an interconnection step for interconnection to the fine objects 120 disposed on the substrate, posterior to the fine object disposing step of the first embodiment.
Figure 9B:
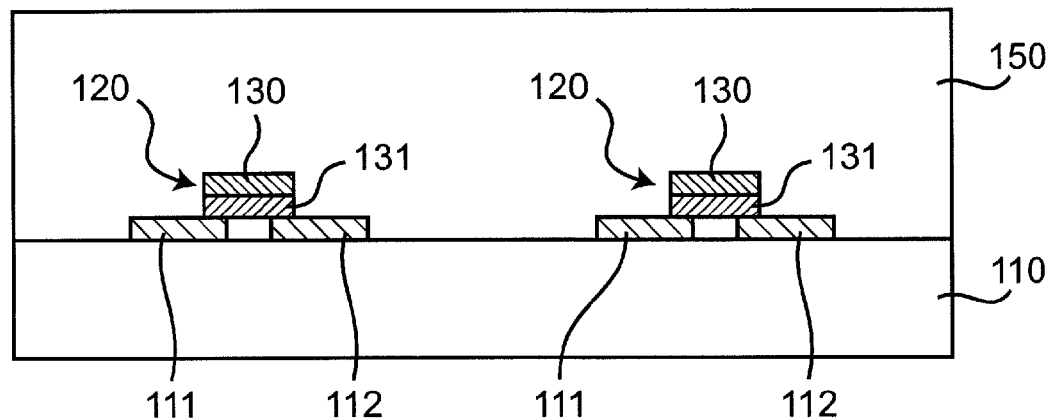
FIG. 9B is a view for explaining the interconnection step for the interconnection to the fine objects disposed on the substrate, posterior to the fine object disposing step of the first embodiment.
Figure 9C:
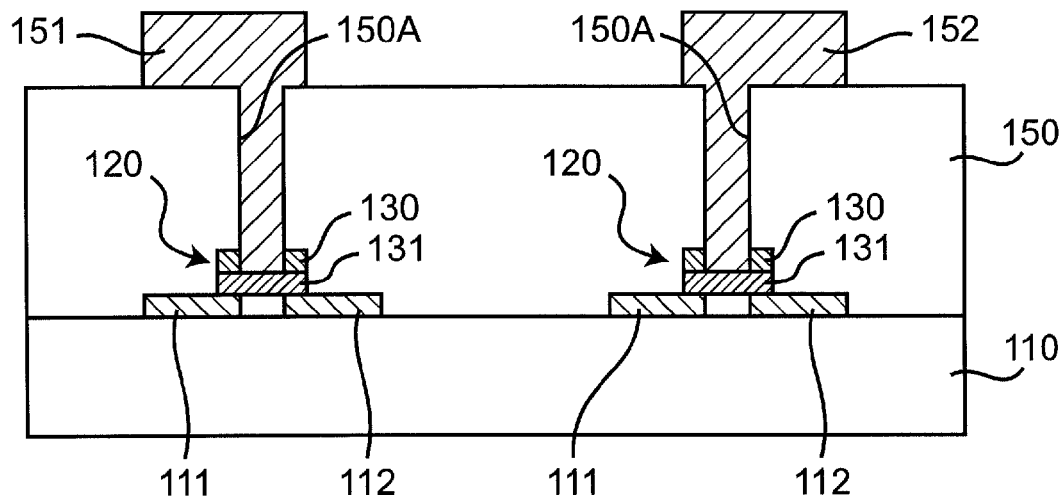
FIG. 9C is a view for explaining the interconnection step for the interconnection to the fine objects disposed on the substrate, posterior to the fine object disposing step of the first embodiment.

In this step, subsequently to the fine object disposing step, the fine objects (devices) 120 disposed on the substrate 110 are interconnected. FIGS. 9A to 9C are views for explaining the interconnection step.

The fine objects 120 are disposed in the orientation in which the rear side layers 131 of the fine objects 120 face the electrodes 111, 112, as described above, in the areas A where the facing portions 111A, 112A of the first, second electrodes 111, 112 face each other, on the substrate 110, as shown in FIG. 9A. After the fluid 121 in which the fine objects 120 are dispersed is dried, an interlayer insulating film 150 composed of a silicon oxide film is deposited on the overall surface of the substrate as shown in FIG. 9B.

Subsequently, as shown in FIG. 9C, contact holes 150A are formed in the interlayer insulating film 150 by application of the conventional photolithography process and dry etching process, and metal interconnections 151, 152 are formed by patterning of metal with metal deposition, photolithography process and etching process. The contact holes 150A extend through the front side layers 130 of the fine objects 120, so that the metal interconnections 151, 152 are electrically connected to the n-type impurity regions 145 of the rear side layers 131 of the fine objects 120 (see also FIG. 3E). On condition that the substrate 110 in which the surfaces of the first, second electrodes 111, 112 are not covered with insulating films are selected, the first, second electrodes 111, 112 are electrically connected to the p-type impurity regions 146 of the rear side layers 131 of the fine objects 120. Thus interconnection for the n-type impurity regions 145 and the p-type impurity regions 146 of the fine objects 120 that function as diode elements can be attained.

Although the fine objects 120 that are diode elements have been described above, the fine objects 120 may be other elements, such as light emitting diodes. The fine objects 120 may include integrated circuits and may each have two terminals that are to be connected to outside, and the two terminals may be formed on the front side surface and the rear side surface of each fine object 120. This embodiment is effective on condition that the front side surface and the rear side surface are defined on each of the fine objects 120 and that the fine objects 120 are required to be disposed in a specified orientation of the front and rear thereof with respect to the substrate 110.

(Major Effects)

In this embodiment, as to the substrate 110 to be prepared in the substrate preparing step, the first electrode 111 and the second electrode 112 are formed on the substrate 110, and the areas A where the facing portion 111A of the first electrode 111 and the facing portion 112A of the second electrode 112 face each other are defined as the predetermined positions. Also, in the fine object disposing step, the voltage is applied between the first electrode 111 and the second electrode 112, by which the fine objects are disposed at the predetermined positions.

With the above constitution, regions where the fine objects 220 are arranged can be freely defined on the substrate 110 by the first electrode 111 and the second electrode 112 formed on the substrate 110. With the method of disposing the fine objects 120 on the substrate 110 in the constitution, even when a large number of the fine objects 120 are arranged, time and costs required for the disposing step hardly vary because the large number of areas (the facing portions 111A, 112A) where the first electrodes 111 and the second electrode 112 face each other have only to be provided. Besides, the method is quite suitable for improving the yield of the disposition because the forces acting between the substrate 110 and the fine objects 120 can be freely changed by regulation of the voltage applied between the first, second electrodes 111, 112. For instance, the fine objects 120 can be fixed to the substrate 110 by increase in the voltage after the completion of the disposition of the fine objects 120 as described above. Furthermore, the yield of the disposition can be further increased because the fine object disposing step can be started by the application of the voltage after sufficient stabilization of the flow of the fluid posterior to the fluid introducing step, for instance.

In the alignment structure the fine object 120 has in this embodiment, the front side surface and the rear side surface are defined on the fine object 120, and the dielectric constant of the front side surface part (front side layer 130) is different from the dielectric constant of the rear side surface part (rear side layer 131).

This is an example of the alignment structure which the fine object 120 has. This makes it possible to dispose the fine objects 120 on the substrate 110 with the position and orientation (front and rear) of the fine objects 120 controlled. According to such a constitution, the fine objects 120 can easily be disposed in the predetermined orientation at the predetermined positions on the substrate 110 with a high yield without provision of alignment structures for the substrate 110 and the like.

In this embodiment, a case is described in which one of the materials of the front side surface part and the rear side surface part is a metal and in which the other thereof is a dielectric material.

In the above constitution, by effectively increasing the difference in dielectric constant between the front side layer 130 and the rear side layer 131 of the fine objects 120, the fine objects 120 can be disposed in the predetermined orientation with a high probability.

Also in this embodiment, another case is described in which one of the materials of the front side layer 130 and the rear side layer 131 is a semiconductor and in which the other thereof is a dielectric material.

In the above constitution also, by effectively increasing the difference in dielectric constant between the front side layer 130 and the rear side layer 131 of the fine objects 120, the fine objects 120 can be disposed in the predetermined orientation with a high probability. One of the materials of the front side layer 130 and the rear side layer 131 is a semiconductor, and thus various types of devices can be formed on the fine objects 120 for addition of a wide variety of functions.

Also in this embodiment, still another case is described in which the fluid 121 introduced onto the substrate 110 and containing the fine objects 120 is made to flow relative to the substrate 110 in the fine object disposing step.

Thus fine objects 120 that are going to be disposed on the substrate 110 in an undesirable orientation can be washed away and only fine objects 120 that have the desirable orientation (predetermined orientation) can be disposed on the substrate 110. As a result, the orientation of the fine objects 120 can be controlled with a better yield.

Second Embodiment

A second embodiment of the invention will be described below with reference to FIGS. 10 to 17. In this embodiment, not only fine objects but also the substrate has an alignment structure, and the fine objects are effectively controlled for their alignment in their arrangement onto the substrate depending on combinations of the alignment structure of the fine objects and the alignment structure of the substrate.

(Substrate Preparing Step)

Figure 10:
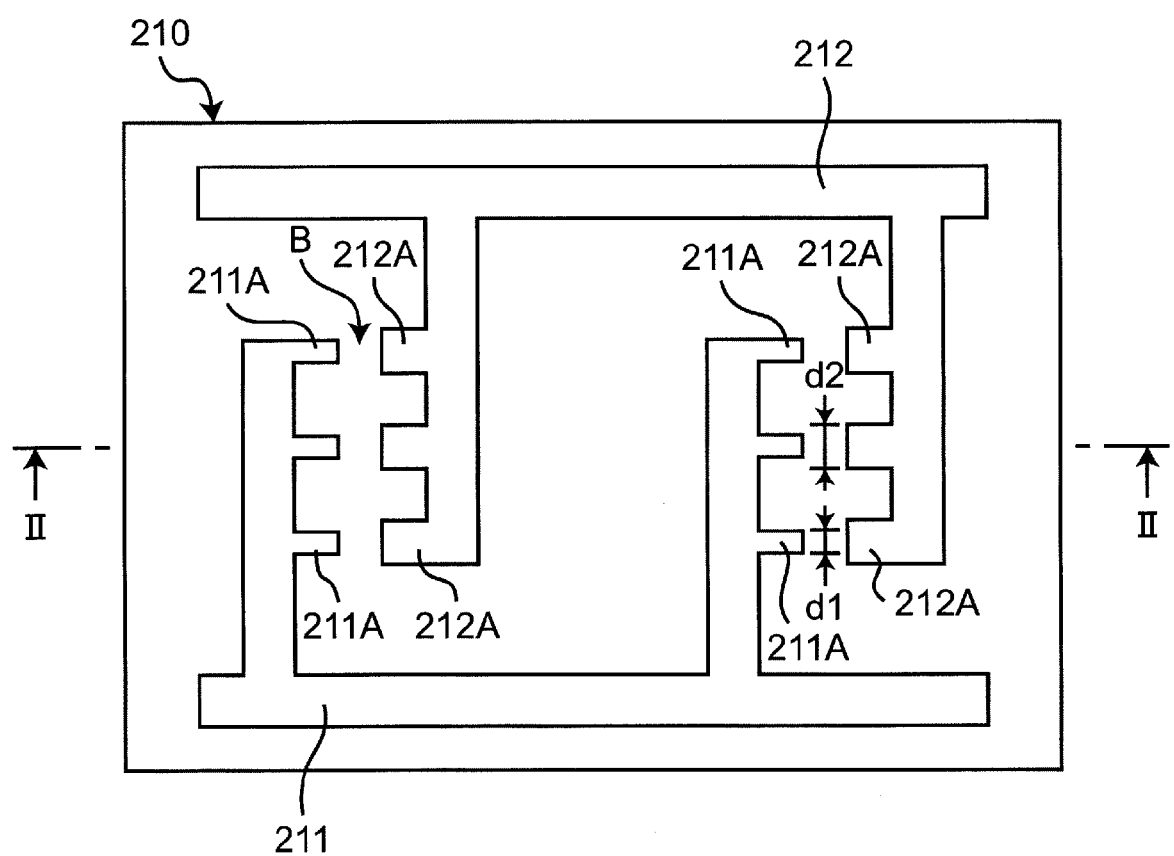
FIG. 10 is a plan view of a substrate prepared in a second embodiment of the disposing method for fine objects of the invention.

In this step, a substrate 210 with a first electrode 211 and a second electrode 212 formed on its surface as shown in FIG. 10 is prepared. In this case, the substrate 210 is an insulated substrate and the first, second electrodes 211, 212 are metal electrodes. Material and fabrication method for the substrate and the electrodes may be the same as in the first embodiment.

Surfaces of the first, second electrodes 211, 212 may be covered with an insulating film, which is not shown. In this case, the following effects are produced. In the later fine object disposing step, a voltage is applied between the first electrode 211 and the second electrode 212 with a liquid introduced onto the substrate 210, in which case any flow of electric current between the electrodes 211, 212 can be prevented. Such a current may cause a voltage drop in the electrodes 211, 212 to make a cause of arrangement failures or otherwise may cause dissolution of the electrodes due to an electrochemical effect. The insulating film for covering the first, second electrodes 211, 212 may be given, for example, by using a silicon oxide film or a silicon nitride film. Without coverage by such an insulating film, on the other hand, the first, second electrodes 211, 212 and the fine objects 220 can be electrically connected to each other with simplicity, making it easier to utilize the first, second electrodes 211, 212 for interconnection.

A later-described place where the fine objects are disposed is determined by a place B where facing portions 211A, 212A of the first, second electrodes 211, 212 face each other. That is, in the later-described fine object disposing step, the fine objects are disposed at the facing place B of the first, second electrodes 211, 212 so as to be bridged between the first, second electrodes 211, 212. Therefore, a distance between the facing portion 211A of the first electrode 211 and the facing portion 212A of the second electrode 212 in the facing place B of the first, second electrodes 211, 212 is desirably slightly shorter than a length of each fine object. As an example, under the condition that the fine object is elongate strip-shaped and 20 µm long, the distance between the facing portion 211A of the first electrode 211 and the facing portion 212A of the second electrode 212 is desirably set to 12 μm to 18 μm. That is, the distance is desirably set to about 60 to 90% of the length of the fine object, more preferably about 80 to 90% of the length.

The substrate 210 has an alignment structure that a width d1 of the facing portion 211A of the first electrode 211 and a width d2 of the facing portion 212A of the second electrode 212 differ from each other at the place where the first electrode 211 and the second electrode 212 face each other. More specifically, as shown in FIG. 10, the width d1 of the facing portion 211A of the first electrode 211 is narrower than the width d2 of the facing portion 212A of the second electrode 212 at the place B where the facing portions 211A, 212A of the first, second electrodes 211, 212 face each other.

(Fine Objects)

Next, fine objects to be disposed on the substrate 210 will be described. In this case, two kinds of fine objects are given by way of example.

Figure 11A:
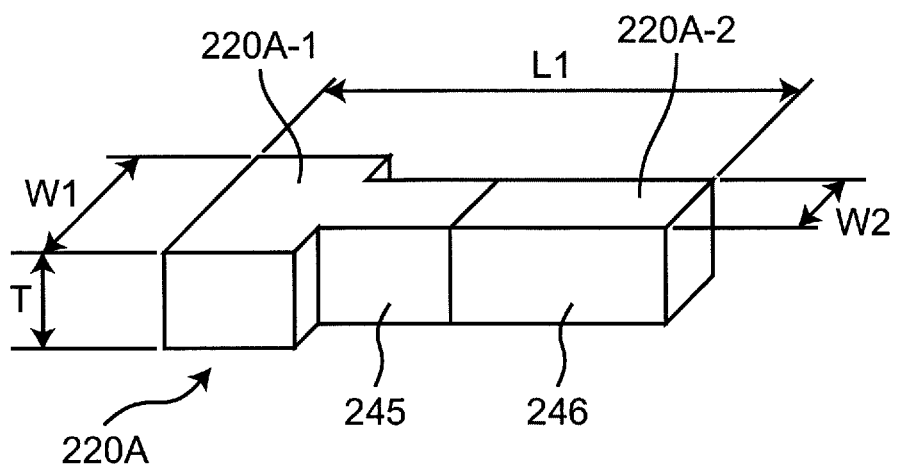
FIG. 11A is a perspective view of a first example of the fine object that is disposed in the second embodiment.

As shown in FIG. 11A, a fine object 220A, which is a first example of the fine object, is elongate bar-like shaped as a whole and has a T-like shape in which a width W1 of one end portion 220A-1 is larger than a width W2 of the other end portion 220A-2 of the fine object 220A. In the later fine object disposing step, the one end portion 220A-1 and the other end portion 220A-2 of the fine object 220A are disposed in correspondence to the facing portion 212A of the second electrode 212 and the facing portion 211A of the first electrode 211, respectively, in a place proper for arrangement on a substrate 210 proper for arrangement. That is, the fine object 220A is disposed so as to be bridged between the first electrode 211 and the second electrode 212 in a way that the one end portion 220A-1 overlaps with the facing portion 212A of the second electrode 212 while the other end portion 220A-2 overlaps with the facing portion 211A of the first electrode 211. In the example shown in FIG. 11A, the fine object 220A, which is made from silicon, is divided into two regions, i.e., an n-type impurity region 245 is formed on one side including the wider end portion 220A-1 while a p-type impurity region 246 is formed on its opposite side. Therefore, the fine object 220A has a function as a diode element.

Figure 11B:
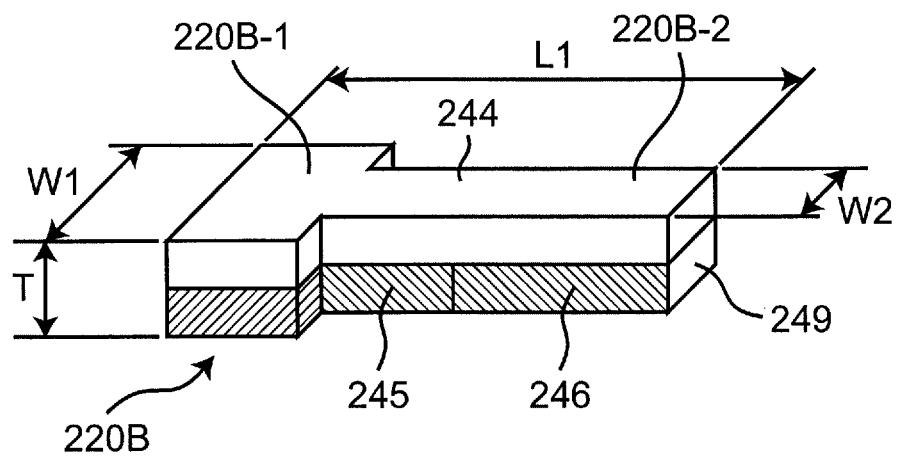
FIG. 11B is a perspective view of a second example of the fine object that is disposed in the second embodiment.

Meanwhile, as shown in FIG. 11B, a fine object 220B, which is a second example of the fine object, has one end portion 220B-1 of a wider width W1 and the other end portion 220B-2 of a narrower width W2, thus having a T-like shape as a whole like the fine object 220A. Further, the fine object 220B of this second example has a front side surface and a rear side surface, and a front side layer 244 being a front-side portion and a rear side layer 249 being a rear-side portion of the fine object 220B are made from materials different in dielectric constant from each other, respectively. As will be described later, effects as an alignment structure are produced on condition that a material for forming the front side layer 244 of the fine object 220B and a material for forming its rear side layer 249 differ from each other, where materials of the front side layer 244 and the rear side layer 249 may be given in arbitrary combinations. However, because the produced effects increase with increasing difference in dielectric constant between the front side layer 244 and the rear side layer 249, there exist preferred combinations shown below.

A first preferred combination is that the front side layer 244 of the fine object 220B is formed from a dielectric material while the rear side layer 249 is formed from a metal. A metal, in which surface charge is generated at low frequencies until its internal electric field is dissipated, has a substantially infinite dielectric constant. A second preferred combination is that the front side layer 244 of the fine object 220B is formed from a dielectric material while the rear side layer 249 is formed from a semiconductor. A semiconductor, in which free carriers existing in its inside can be induced to its surfaces at low frequencies, also has a substantially infinite dielectric constant at low frequencies as in the case of metal. However, semiconductors have not so high following frequencies as those of metals, and show a behavior close to that of dielectric materials at sites where a depletion layer is formed. A large advantage of the second preferred combination is that the fine object 220B can be made to function as various devices. In this embodiment, the front side layer 244 of the fine object 220B is formed from a dielectric material (silicon oxide film) while the rear side layer 249 is made up of the n-type impurity region 245 and the p-type impurity region 246 formed from silicon. Therefore, the fine object 220B has a function as a diode.

The fine object 220B of this second example also has a T-like shape as in the case of the fine object 220A of the foregoing first example. In the later-described fine object disposing step, the fine object 220B is disposed so as to be bridged between the facing portion 211A of the first electrode 211 and the facing portion 212A of the second electrode 212 in a way that the one end portion 220B-1 overlaps with the facing portion 212A of the second electrode 212 while the other end portion 220B-2 overlaps with the facing portion 211A of the first electrode 211. Further, since the fine object 220B has a difference in dielectric constant between the front side layer 244 and the rear side layer 249, it becomes possible to control which one of the front side layer 244 and the rear side layer 249 is aligned to face the upside (a side counter to the electrodes 211, 212).

The fine objects 220A, 220B of the first, second examples in this embodiment each have an alignment structure. The alignment structure of the fine object 220A is that the fine object 220A has two portions of mutually different sizes, i.e., the other end portion 220A-2 corresponding to the facing portion 211A of the first electrode 211 and the one end portion 220A-1 corresponding to the facing portion 212A of the second electrode 212 in the predetermined positions. Also, the alignment structure of the fine object 220B is that the fine object 220B has two portions of mutually different sizes, i.e., the other end portion 220B-2 corresponding to the facing portion 211A of the first electrode 211 and the one end portion 220B-1 corresponding to the facing portion 212A of the second electrode 212 in the predetermined positions. The fine object 220B has a further alignment structure, and the further alignment structure is that a front side surface and a rear side surface are specified for the fine object 220B, where the dielectric constant of the front side layer (insulator) 244 of the front side surface and the dielectric constant of the rear side layer (silicon) 249 of the rear side surface are different from each other.

It is an example of the above definition that the fine objects 220A, 220B each have a T-like shape, and those objects may also have other shapes as far as the objects have the above-described features. As to sizes, the fine objects 220A, 220B may have, for example, a longer side edge L1 of 10 μm, a maximum value W1 of the shorter side edge (an end at which the n-type impurity region 245 is present) set to 4 μm, a minimum value W2 of the shorter side edge (an end at which the p-type impurity region 246 is present) set to 2 μm, and a thickness T of 0.5 μm, but these values are not limitative.

FIGS. 12A to 12E are views showing a method for fabricating the fine object 220B. The fine object 220A differs from the fine object 220B only in that the fine object 220A has no insulator 244. Therefore, as to the fine object 220A, it is proper to exclude the formation of the insulator 244, or to remove the insulator 244, in the method of forming the fine object 220B.

Figure 12A:
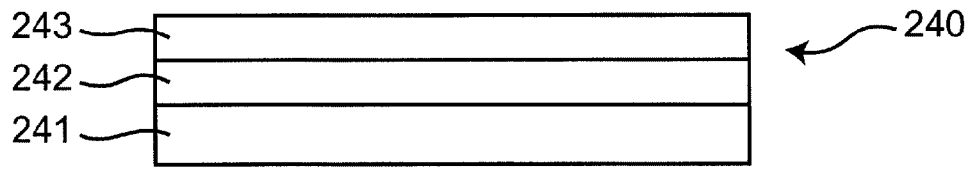
FIG. 12A is a sectional view for explaining a method of fabricating the second example of the fine object.

First, an SOI substrate 240 as shown in FIG. 12A is prepared. The SOI substrate 240 is composed of a silicon substrate 241, a BOX layer 242 made of a silicon oxide film, and an SOI layer 243.

Figure 12B:
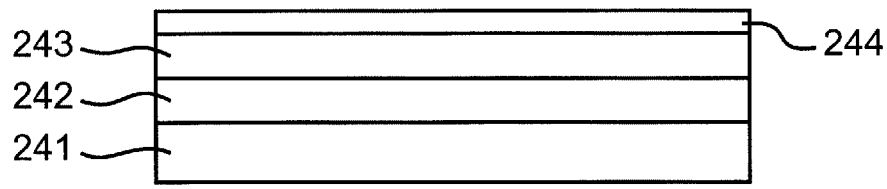
FIG. 12B is a sectional view for explaining the method of fabricating the second example of the fine object.

Next, as shown in FIG. 12B, an insulating film 244 of a silicon nitride film is formed on the SOI layer 243. This insulating film 244 can be formed by CVD process.

Figure 12C:
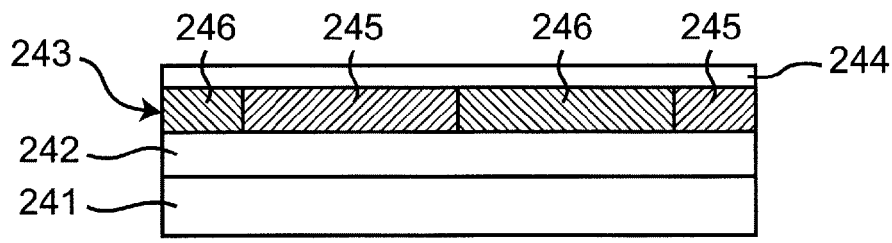
FIG. 12C is a sectional view for explaining the method of fabricating the second example of the fine object.

Next, as shown in FIG. 12C, an n-type impurity region 245 and a p-type impurity region 246 are formed in the SOI layer 243. The n-type, p-type impurity regions 245, 246 can be formed by ion-implanting arsenic and boron and performing annealing for activation. As a result, a pn junction is formed at a boundary between the n-type impurity region 245 and the p-type impurity region 246.

Figure 12D:
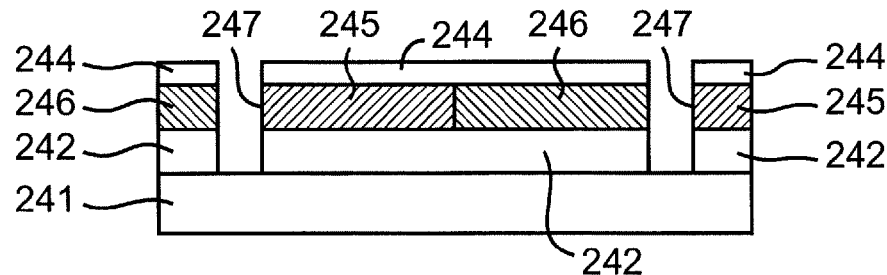
FIG. 12D is a sectional view for explaining the method of fabricating the second example of the fine object.

Next, as shown in FIG. 12D, a trench 247 is formed on the SOI substrate 240 at least until the BOX layer 242 is exposed. This trench 247 can be formed by normal photolithography process and dry etching process applied to the SOI substrate 240.

Figure 12E:
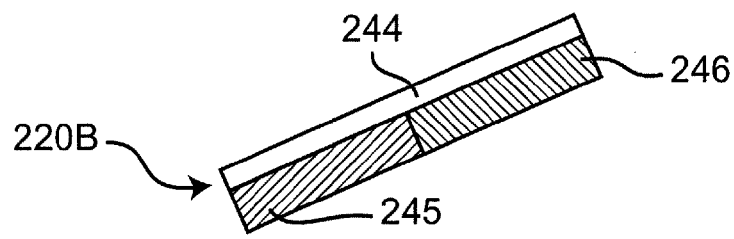
FIG. 12E is a sectional view for explaining the method of fabricating the second example of the fine object.

Next, as shown in FIG. 12E, the SOI substrate 240 is immersed into a hydrofluoric acid solution so that the BOX layer 242 made of a silicon oxide film is dissolved to separate the fine object 220B from the SOI substrate 240. In this step, since the insulating film 244 made of a silicon oxide film remains unsolved, there can be obtained a fine object 220B having a front side layer 244, which is an insulating film 244, and a rear side layer 249 made of a semiconductor (n-type, p-type impurity regions 245, 246). This fine object 220B is a pn junction-containing device (diode), and on which side of the first electrode 211 side and the second electrode 212 side of the substrate 210 the n-type, p-type impurity regions 245, 246 of the fine object 220B are placed is very important because the device has polarity, where controlling not only the place of disposition but also the alignment of the device is important.

(Fluid Introducing Step)

Figure 13:
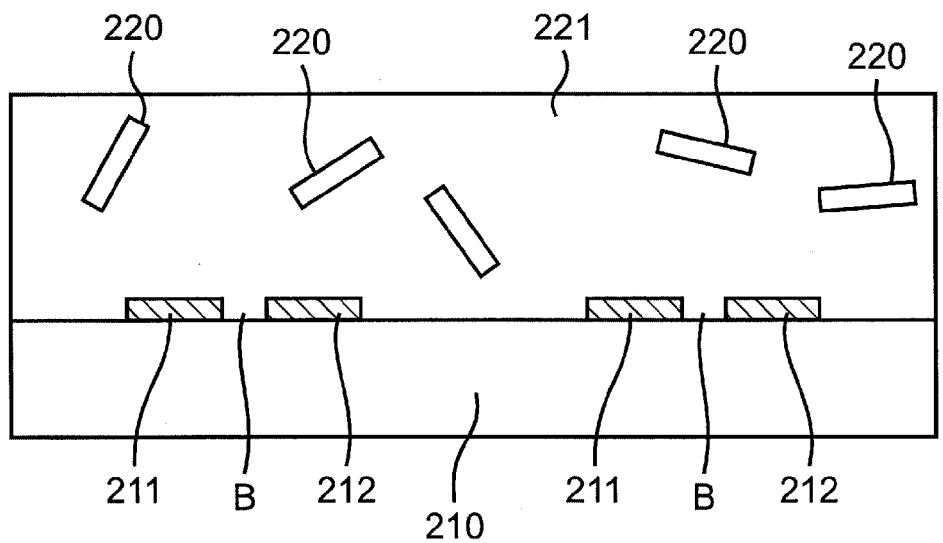
FIG. 13 is a sectional view, taken along the line II-II of FIG. 10, showing an aspect that liquid is introduced onto the substrate.

In this step, as shown in FIG. 13, a fluid 221 containing fine objects 220 (fine objects 220A or fine objects 220B) is introduced onto the substrate 210. The fine objects 220 are dispersed in the fluid 221. FIG. 13 is a sectional view showing an aspect that the fluid 221 has been introduced onto the substrate 210, in a cross section taken along the line II-II of FIG. 10.

Constituents of the fluid 221 may be the same as those of the fluid 121 described in the foregoing first embodiment.

In addition, although not shown, a cover is preferably provided above the substrate 210 so as to face the substrate. This cover is set in parallel to the substrate 210 with a uniform gap (e.g., 500 μm) provided between the substrate 210 and the cover. The gap is filled with the fluid 221 containing the fine objects 220. As a result, it becomes possible to run the fluid 221 into a channel of the gap at a uniform velocity in the fine object disposing step, thus making it possible to dispose the fine objects 220 uniformly on the substrate 210. Moreover, in the next-described fine object disposing step, evaporation of the fluid 221 that causes convection can be prevented, so that disturbance of the disposition of the fine objects 220 can be prevented.

(Fine Object Disposing Step)

Figure 14:
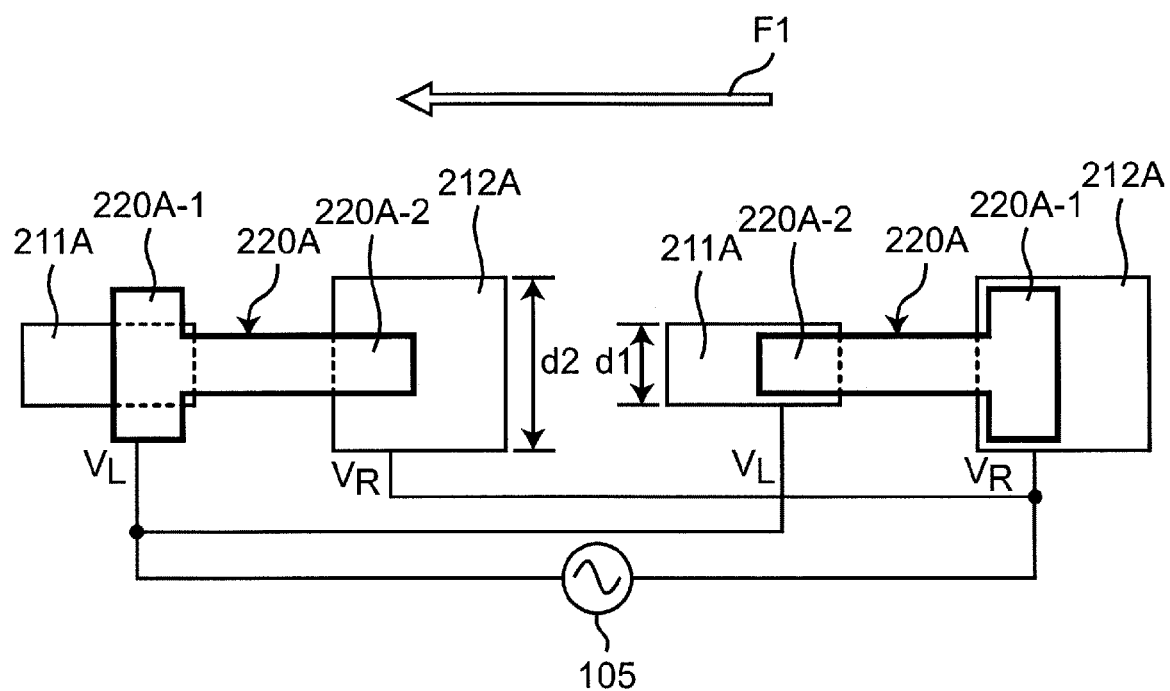
FIG. 14 is a schematic view showing an aspect that a voltage is applied between first and second electrodes in a fine object disposing step in the second embodiment.
Figure 15A:
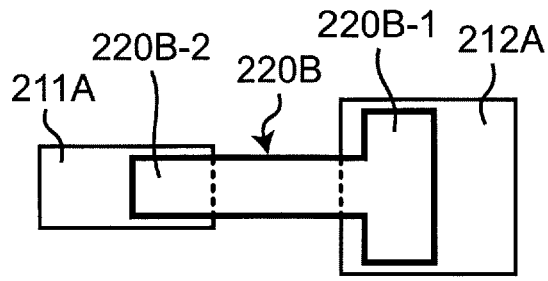
FIG. 15A is a schematic view for explaining a principle on which the fine objects are disposed with their orientation uniformized in areas where the first and second electrodes face each other in the fine object disposing step in the second embodiment.
Figure 15B:
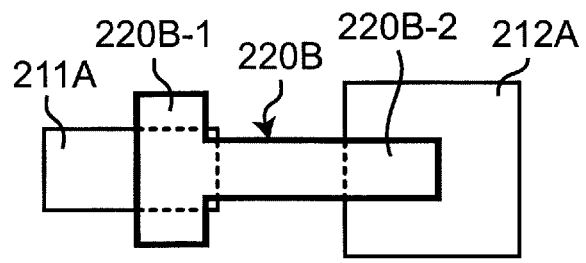
FIG. 15B is a schematic view for explaining the principle on which the fine objects are disposed with their orientation uniformized in the areas where the first and second electrodes face each other in the fine object disposing step in the second embodiment.
Figure 15C:
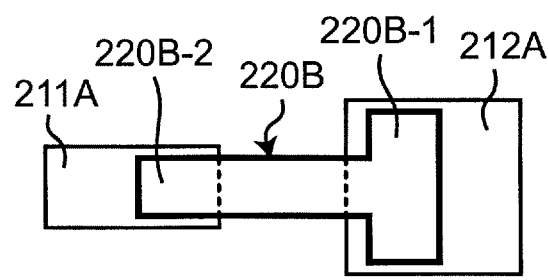
FIG. 15C is a schematic view for explaining the principle on which the fine objects are disposed with their orientation uniformized in the areas where the first and second electrodes face each other in the fine object disposing step in the second embodiment.
Figure 15D:
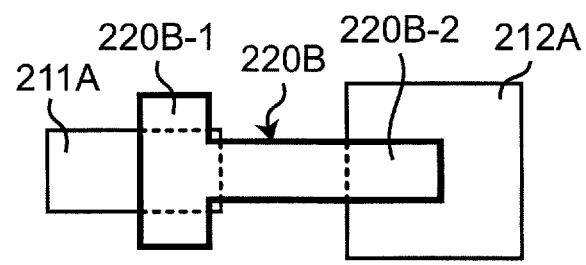
FIG. 15D is a schematic view for explaining the principle on which the fine objects are disposed with their orientation uniformized in the areas where the first and second electrodes face each other in the fine object disposing step in the second embodiment.
Figure 15E:
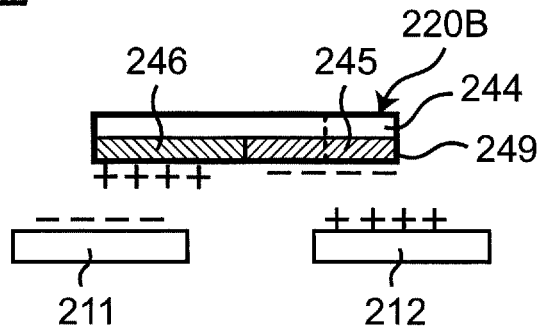
FIG. 15E is a sectional view corresponding to FIG. 15A.
Figure 15F:
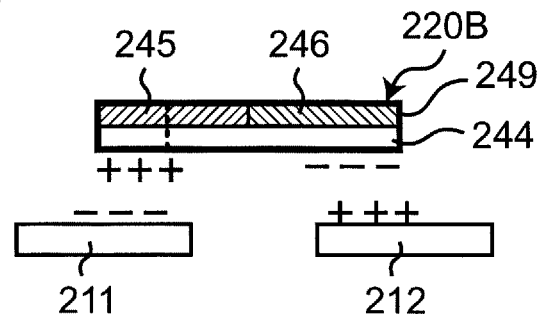
FIG. 15F is a sectional view corresponding to FIG. 15B.
Figure 15G:
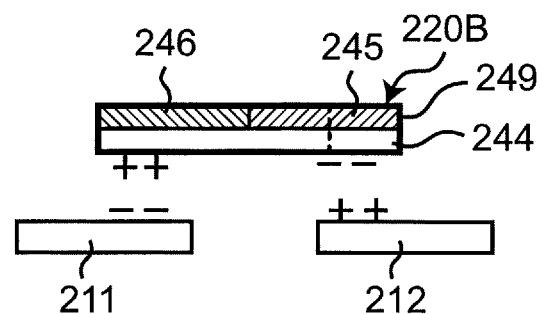
FIG. 15G is a sectional view corresponding to FIG. 15C.
Figure 15H:
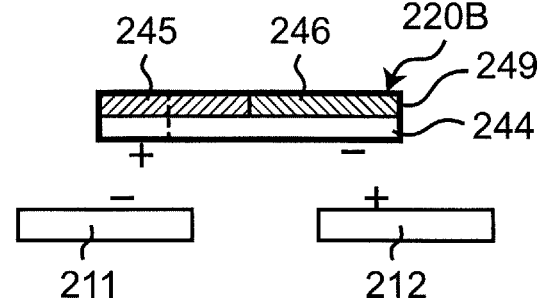
FIG. 15H is a sectional view corresponding to FIG. 15D.
Figure 16:
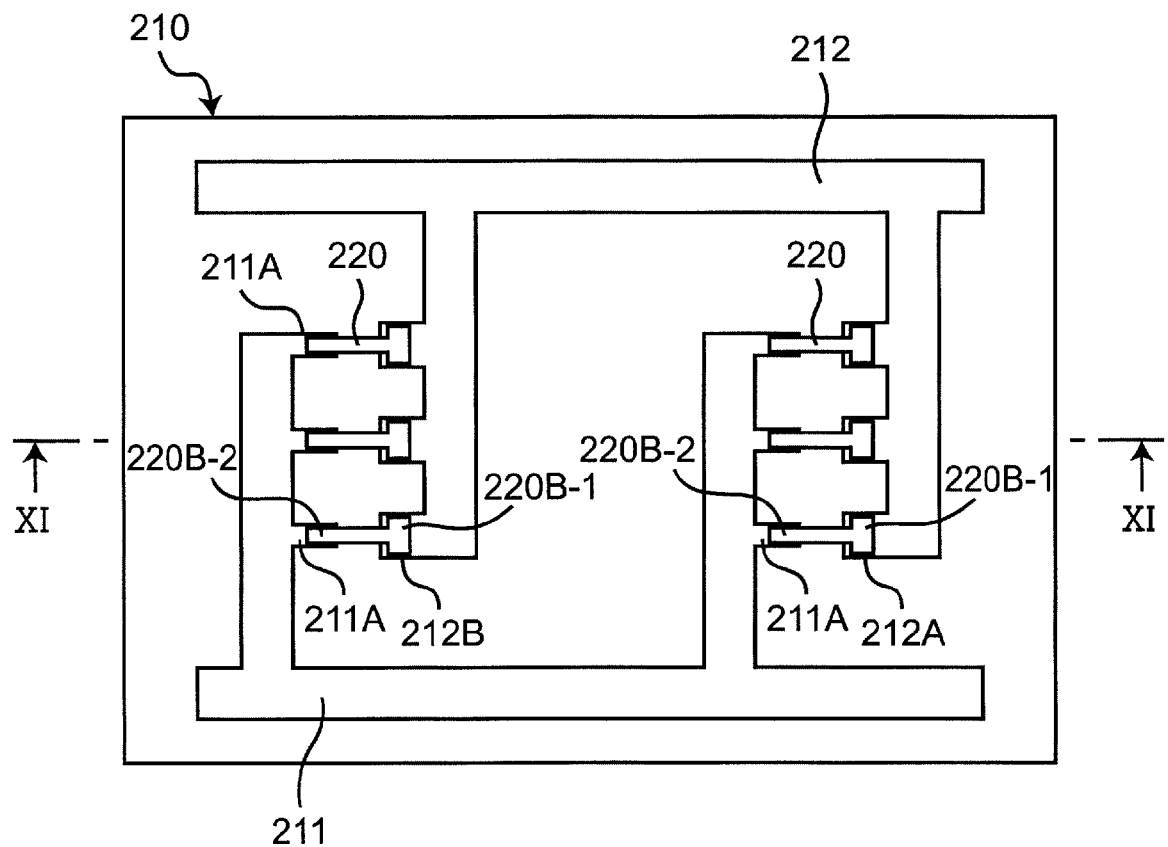
FIG. 16 is a plan view showing a state in which the fine objects are disposed at predetermined positions and in a predetermined orientation on the substrate in the second embodiment.
Figure 17:
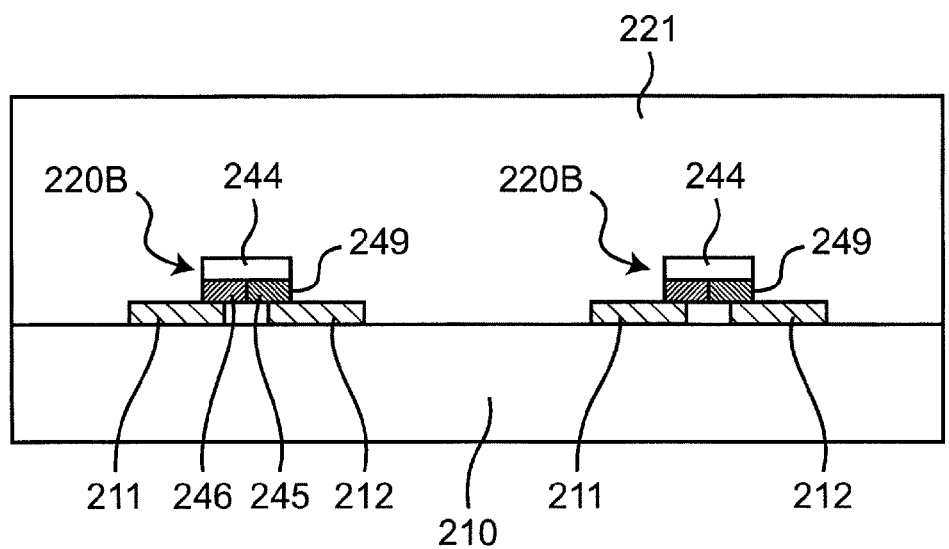
FIG. 17 is a sectional view taken along the line XI-XI of FIG. 16.

In this step, after the above-described fluid introducing step, as shown in FIG. 14, FIGS. 15A to 15D and FIGS. 15E to 15H, a voltage is applied between the first electrode 211 and the second electrode 212, so that the fine objects 220 are resultantly disposed in a predetermined orientation at predetermined positions on the substrate 210 as shown in the plan view of FIG. 16 and the sectional view of FIG. 17. It is noted that FIG. 17 is a sectional view taken along the line XI-XI of FIG. 16. The fine objects 220 represent the fine objects 220A or the fine objects 220B.

FIG. 14 explains a principle on which the fine objects 220A are disposed in a uniform orientation at places where the facing portion 211A of the first electrode 211 and the facing portion 212A of the second electrode 212 face each other. Such an AC voltage as shown in FIG. 6 is applied between the first electrode 211 and the second electrode 212 as in the foregoing first embodiment. Each fine object 220A has a T-like shape, where a larger-in-width end portion 220A-1 is referred to as head portion while the other end portion 220A-2 is referred to as leg portion. Also, as already described, the width d1 of the facing portion 211A of the first electrode 211 is narrower than the width d2 of the facing portion 212A of the second electrode 212.

As to the left-side fine object 220A in FIG. 14, the head portion 220A-1 overlaps with the facing portion 211A of the first electrode 211, and the leg portion 220A-2 overlaps with the facing portion 212A of the second electrode 212. On the other hand, as to the right-side fine object 220A in FIG. 14, the head portion 220A-1 overlaps with the facing portion 212A of the second electrode 212, and the leg portion 220A-2 overlaps with the facing portion 211A of the first electrode 211. As apparent from FIG. 14, the right-side fine object 220A in FIG. 14 is larger in the overlapping area with the first, second electrodes 211, 212, than the left-side fine object 220A in FIG. 14. Therefore, more charge is induced to the right-side fine object 220A than to the left-side fine object 220A, so that stronger attractive force acts between the first, second electrodes 211, 212. Thus, the head portion 220A-1 of the fine object 220A can be disposed selectively at a predetermined position on the substrate 210 in such an orientation as to overlap with the facing portion 212A of the second electrode 212.

FIGS. 15A to 15D and FIGS. 15E to 15H explain a principle on which the fine objects 220B are disposed in a uniform orientation in areas where the facing portions 211A, 212A of the first, second electrodes 211, 212 face each other. FIGS. 15E to 15H are sectional views corresponding to the plan views of FIG. 15A to 15D.

An AC voltage similar to that of the foregoing first embodiment (see FIG. 6) is applied between the first electrode 211 and the second electrode 212. For the fine object 220B, a front side surface and a rear side surface are specified, where the front side layer 244 and the rear side layer 249 differ in dielectric constant from each other. Therefore, with the fine object 220B, it becomes possible to control the orientation as to which one side of the first electrode 211 side and the second electrode 212 side the head portion 220B-1 and the leg portion 220B-2 are overlapped with, and moreover which one of the front side layer 244 and the rear side layer 249 is aligned to face the upside (a side counter to the electrodes 211, 212).

The fine object 220B has two degrees of freedom as to which one of the first electrode 211 side and the second electrode 212 side the head portion 220B-1 and the leg portion 220B-2 are overlapped with, respectively, as well as two degrees of freedom as to which one of the front side layer 244 and the rear side layer 249 is aligned to face the upside, thus totally four degrees of freedom for alignment. The fine objects 220B in these four ways of alignment are shown in FIGS. 15A, 15B, 15C and 15D as well as FIGS. 15E, 15F, 15G and 15H.

As apparent from the description hereinabove, the way of alignment shown in FIGS. 15A and 15E yields the greatest attractive force acting between the fine object 220B and the first, second electrodes 211, 212, among the four ways of alignment of the fine object 220B shown in FIGS. 15A and 15E, FIGS. 15B and 15F, FIGS. 15C and 15G, and FIGS. 15D and 15H. That is, induced electric charge becomes greatest in quantity in the case where the front side layer 244 made of an insulator film is aligned upward while the rear side layer 249 composed of the n-type, p-type impurity regions 245, 246 formed from silicon is aligned so as to face the substrate 210 as shown in FIGS. 15A and 15E and where the head portion 220B-1 is overlapped with the facing portion 212A of the second electrode 212 as shown in FIGS. 15A and 15E. In other words, the attractive force becomes greatest in the case where the rear side layer 249, which is the higher-dielectric-constant side of the fine object 220B, faces the electrodes 211, 212 and where the larger-in-width head portion 220B-1 of the fine object 220B and the facing portion 212A of the larger-in-width electrode 212 are overlapped with each other. Thus, as shown in FIGS. 16 and 17, the fine object 220B can be disposed selectively at a predetermined position on the substrate 210 in such a way that the head portion 220B-1 of the fine object 220B is overlapped with the second electrode 212 and moreover the n-type, p-type impurity regions 245, 246 made of silicon, i.e. rear side layer 249, face the substrate 210.

During this fine object disposing step, preferably, the fluid 221 containing the fine objects 220 (fine objects 220A or fine objects 220B) introduced onto the substrate 210 is kept fluidized relative to the substrate 210. As a result of this, fine objects 220A of a disposition shown on the left side of FIG. 14, as well as fine objects 220A, 220B to be disposed on the substrate 210 in such undesirable orientations as those of the fine objects 220B disposed as shown in FIGS. 15B to 15D and FIGS. 15F to 15H, can be flushed away while fine objects 220A disposed as shown on the right side of FIG. 14, as well as fine objects 220 of desirable orientations disposed such as fine objects 220B disposed as shown in FIGS. 15A and 15E, can be disposed so as to be left on the substrate 210. Thus, the alignment of the fine objects 220 can be controlled with higher yield.

In this way, as shown on the right side of FIG. 14 and in FIGS. 15A and 15E, the fine objects 220 (fine objects 220A or 220B) can be arranged on the substrate 210 at predetermined positions and in a predetermined orientation.

With IPA used as the fluid, the frequency of the AC voltage fed to the first electrode 211 is preferably set to 10 Hz to 1 MHz, more preferably 50 Hz to 1 kHz, which makes the arrangement most stable. Further, the AC voltage to be applied between the first electrode 211 and the second electrode 212 is not limited to sine waves and may be any one that periodically varies such as rectangular waves, triangular waves and sawtooth waves. The AC voltage VPPL (double of amplitude) fed to the first electrode 211 may be 0.1 to 10 V, where voltages lower than 0.1 V result in worse arrangement of the fine objects 220 while voltages higher than 10 V cause the fine objects 220 to be immediately fixed onto the substrate 210 with a result of worse disposition yield. Therefore, the voltage is preferably set to 1 to 5 V, more preferably to about 1 V.

Next, after completion of the disposition of the fine objects 220 onto the substrate 210, the substrate 210 is heated with the voltage application maintained, so that the liquid is evaporated to fulfill drying, making the fine objects 220 fixed onto the substrate 210. Otherwise, after completion of the disposition of the fine objects 220, a sufficiently high voltage (10 to 100 V) is applied to the first electrode 211 and the second electrode 212 so that the fine objects 220 are fixed onto the substrate 210, and with the voltage application stopped, the substrate 210 is dried.

(Interconnection Step)

In this step, subsequently to the fine object disposing step, the fine objects (devices) 220 disposed on the substrate 210 are interconnected. The interconnection step of this embodiment can be fulfilled in the same way as in the first embodiment. Therefore, its detailed description and figures are omitted.

The fine object 220 may be other than a diode, and may be a light emitting diode as an example. Further, the fine object 220 may be one which contains integrated circuits and which has two terminals to be connected to outside, the two terminals being formed each at the head portion 220A-1, 220B-1 and the leg portion 220A-2, 220B-2 of the fine object 220. In this embodiment, the head portion and the leg portion are specified for the fine object 220, being effective for cases where the fine objects 220 need to be disposed with alignment of the head portion and the leg portion specified relative to the substrate 210.

(Major Effects)

In this embodiment, as to the substrate 210 to be prepared in the substrate preparing step, the first electrode 211 and the second electrode 212 are formed on the substrate 210, and the predetermined positions are defined by the areas where the first electrode 211 and the second electrode 212 face each other. Also, in the fine object disposing step, the voltage is applied between the first electrode 211 and the second electrode 212, by which the fine objects are disposed at the predetermined positions.

With the above constitution, regions where the fine objects 220 are arranged can be freely defined on the substrate 210 by the first electrode 211 and the second electrode 212 formed on the substrate 210. With the method of disposing the fine objects 220 on the substrate 210 in the constitution, even when a large number of the fine objects 120 are arranged, time and costs required for the disposing step hardly vary because the large number of areas where the first electrodes 211 and the second electrode 212 face each other, i.e. the facing portions 211A, 212A, have only to be provided. Besides, the method is quite suitable for improving the yield of the disposition because the forces acting between the substrate 210 and the fine objects 220 can be freely changed by regulation of the voltage applied between the first, second electrodes 211, 212. For instance, the fine objects 220 can be fixed to the substrate 210 by increase in the voltage after the completion of the disposition of the fine objects 220 as described in the first embodiment. Furthermore, the yield of the disposition can be further increased because the fine object disposing step can be started by the application of the voltage after sufficient stabilization of the flow of the fluid posterior to the fluid introducing step, for instance.

Also in this embodiment, the alignment structure of the fine objects 220 is that each fine object 220 has two portions of mutually different sizes (head portions 220A-1, 220B-1 and leg portions 220A-2, 220B-2) corresponding to the first electrode 211 and the second electrode 212, respectively, in the predetermined positions as shown in FIG. 16. Further, the substrate 210 also has an alignment structure, and the alignment structure of the substrate 210 is that the width d1 of the facing portion 211A of the first electrode 211 and the width d2 of the facing portion 212A of the second electrode 212 differ from each other.

With the above constitution, orientation of the fine objects 220 in their disposition onto the substrate 210 can effectively be controlled by combinations between alignment structures of the fine objects 220 and alignment structures of the substrate 210, thus making it possible to dispose the fine objects 220 at predetermined positions on the substrate 210 in a predetermined orientation with high yield.

Also in this embodiment, the fine object 220B has a further alignment structure, and the alignment structure is that a front side surface and a rear side surface are defined on the fine object 220B as shown in FIG. 17, where the dielectric constant of the front side layer (insulator) 244 of the front side surface and the dielectric constant of the rear side layer (silicon) 249 of the rear side surface differ from each other. As a result of this, the fine objects 220B can be disposed on the substrate 210 with their position and orientation (including front/rear orientation) controlled.

In this embodiment, a case is described in which the fluid 221 containing the fine objects 220 introduced onto the substrate 210 is fluidized relative to the substrate 210 in the fine object disposing step.

As a result of this, fine objects 220 that are going to be disposed onto the substrate 210 in undesirable orientations are washed away, so that fine objects 220 only in a desirable orientation (predetermined orientation) can be disposed onto the substrate 210. Thus, the orientation of the fine objects 220 can be controlled with better yield.

Third Embodiment

Next, a third embodiment of the invention will be described with reference to FIGS. 18 to 24. This embodiment is so constituted that alignment of fine objects 320 in their disposition onto a substrate 310 is effectively controlled by combinations of an alignment structure of the fine objects 320 and an external magnetic field generally parallel to the surface of the substrate 310.

(Substrate Preparing Step)

Figure 18:
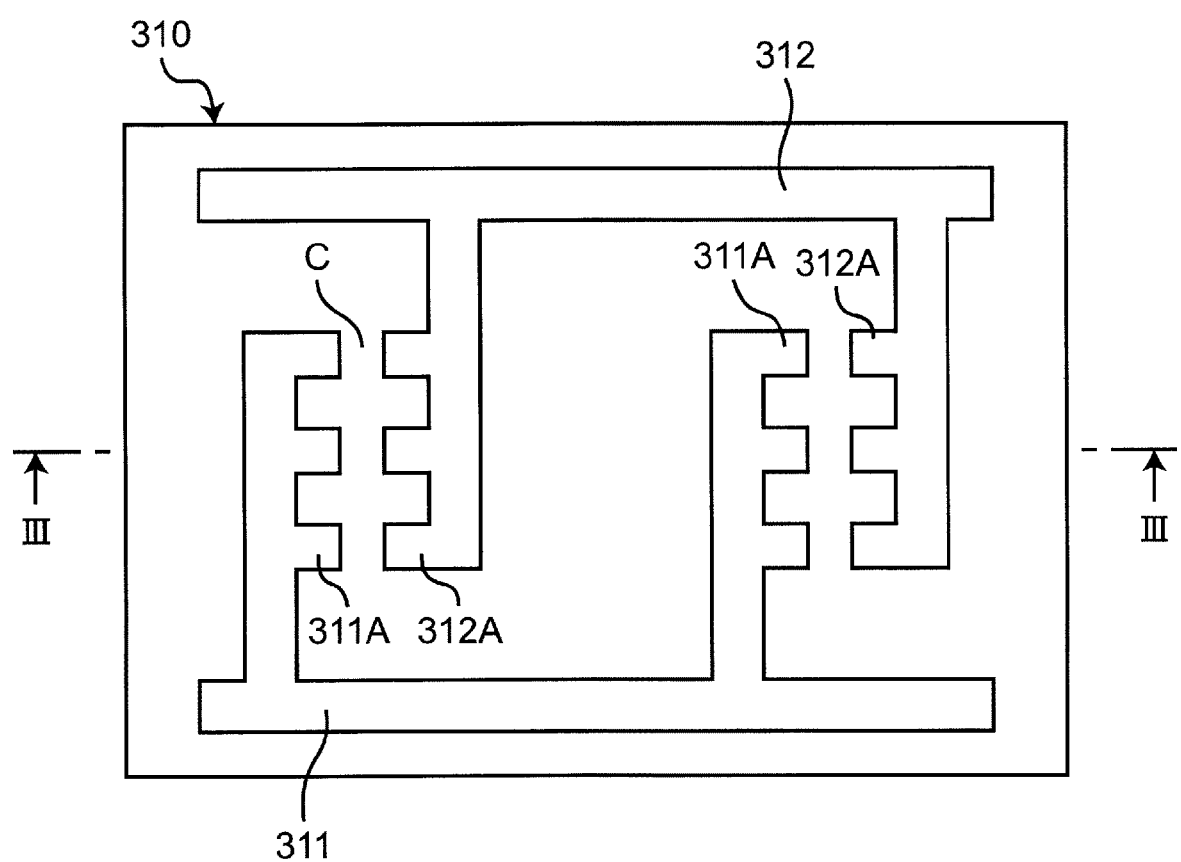
FIG. 18 is a plan view of a substrate prepared in a third embodiment of a disposing method for fine objects of the invention.

In this step, a substrate 310 having a first electrode 311 and a second electrode 312 formed on its surface as shown in FIG. 18 is prepared. In this case, the substrate 310 is an insulated substrate and the first, second electrodes 311, 312 are metal electrodes. Material and fabrication method for the substrate 310 and the electrodes 311, 312 may be the same as in the first embodiment.

Surfaces of the first, second electrodes 311, 312 may be covered with an insulating film, which is not shown. In this case, the following effects are produced. In the later fine object disposing step, a voltage is applied between the first electrode 311 and the second electrode 312 with a liquid introduced onto the substrate 310, in which case any flow of electric current between the electrodes 311, 312 can be prevented. Such a current may cause a voltage drop in the electrodes 311, 312 to make a cause of arrangement failures or otherwise may cause dissolution of the electrodes due to an electrochemical effect. The insulating film for covering the first, second electrodes 311, 312 may be given, for example, by using a silicon oxide film or a silicon nitride film. Without coverage by such an insulating film, on the other hand, the first, second electrodes 311, 312 and the fine objects 320 can be electrically connected to each other with simplicity, making it easier to utilize the first, second electrodes 311, 312 for interconnection.

A place where the fine objects are disposed is determined by a place C where facing portions 311A, 312A of the first, second electrodes 311, 312 face each other. That is, in the later-described fine object disposing step, the fine objects 320 are disposed at the facing place C of the facing portions 311A, 312A of the first, second electrodes 311, 312 so as to be bridged between the first, second electrodes 311, 312. Therefore, a distance between the facing portion 311A of the first electrode 311 and the facing portion 312A of the second electrode 312 in the facing place C of the first, second electrodes 311, 312 is desirably slightly shorter than a length of each fine object 320. As an example, under the condition that the fine object 320 is elongate strip-shaped and 20 μm long, the distance between the facing portion 311A of the first electrode 311 and the facing portion 312A of the second electrode 312 is desirably set to 12 μm to 18 μm. That is, the distance is desirably set to about 60 to 90% of the length of the fine object 320, more preferably about 80 to 90% of the length.

(Fine Objects)

Next, fine objects 320 to be disposed on the substrate 310 will be described.

Figure 19:
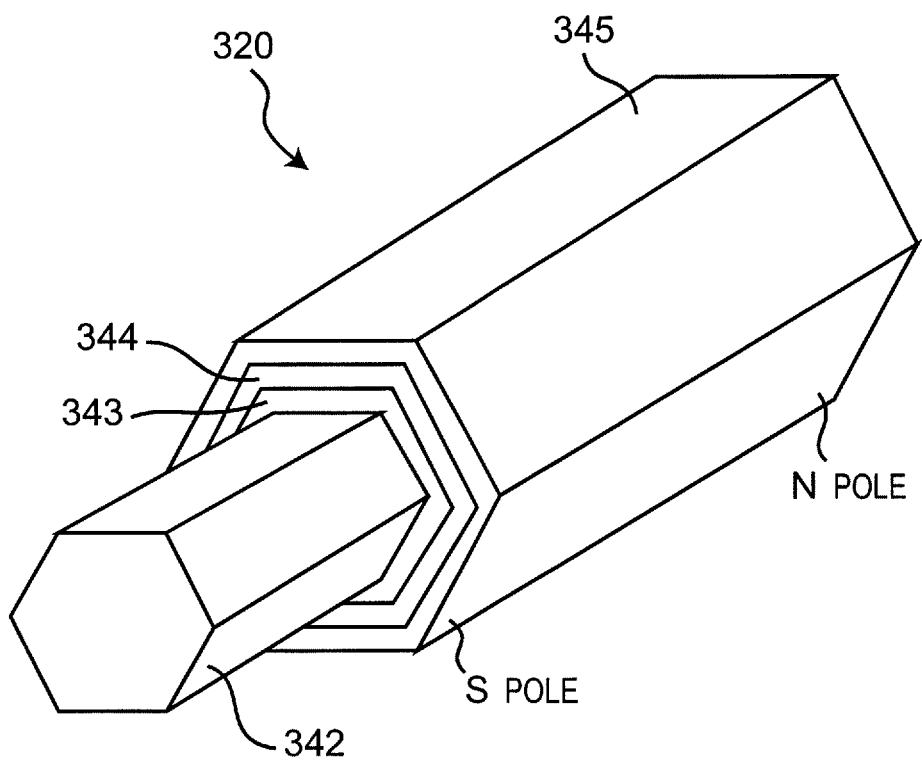
FIG. 19 is a perspective view of a fine object that is disposed in the third embodiment.

As shown in FIG. 19, a fine object 320 is elongate bar-like shaped as a whole, and has a core 342 covered around with tri-layer shells 343, 344, 345, the core 342 being exposed at one end of the fine object 320 without the shells. Out of the tri-layer shells 343, 344, 345, the outermost-layer shell 345 is a magnetized ferromagnetic material. More specifically, a GaN (gallium nitride) core 342 of n-type conductive type is surrounded around by an InGaN (indium gallium nitride) shell 343, outside of which is surrounded by a GaN (gallium nitride) shell 344 of p-type conductive type, while a ferrite shell 345 magnetized along a lengthwise direction of the fine object is formed as an outermost-layer shell.

An alignment structure of the fine object 320 is fulfilled by the ferrite shell 345, which is a ferromagnetic material magnetized along the lengthwise direction of the fine object 320.

The fine object 320 has a function as a light emitting diode element in which the InGaN shell 343 sandwiched by the n-conductive type GaN core 342 and the p-conductive type GaN shell 344 serves as an active layer.

The fine object 320 may be so sized that, for example, the n-conductive type GaN core 342 has a diameter of 1 μm, the InGaN shell 343 is 5 nm thick, the p-conductive type GaN shell 344 is 100 nm thick, the ferrite shell 345 is 200 nm thick, and the n-conductive type GaN core 342 is 20 μm long while the exposed portion of the n-conductive type GaN core 342 is 5 μm long. In addition, the sizes are not limited to those described above, and a so-called nanowire in which the n-conductive type GaN core 342 has a diameter of 100 nm may be adopted as an example.

FIGS. 20A to 20F are views showing a method for fabricating the fine object 320.

Figure 20A:
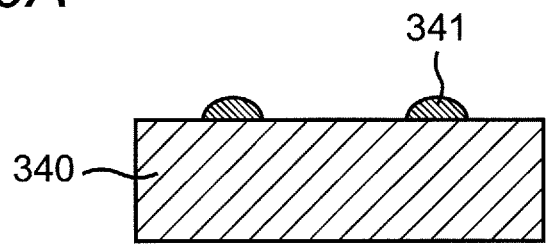
FIG. 20A is a sectional view for explaining a method of fabricating the fine object.

First, as shown in FIG. 20A, a metal catalyst (Ni catalyst 341) is formed in a granular shape on a GaN substrate 340. This can be achieved by depositing Ni on the GaN substrate by sputtering and then aggregating the deposits by annealing. Otherwise, that may be achieved by immersing a GaN substrate into a solution containing Ni colloid.

Figure 20B:
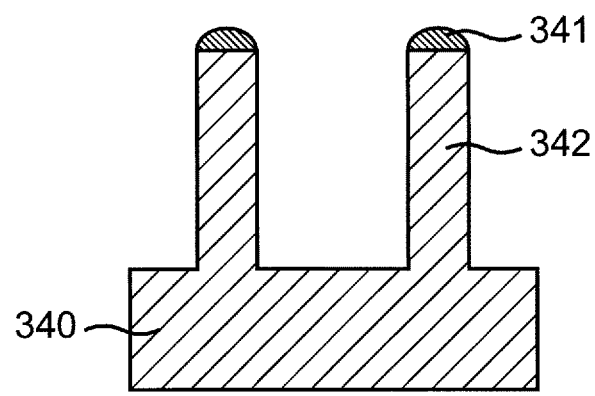
FIG. 20B is a sectional view for explaining the method of fabricating the fine object.

Next, as shown in FIG. 20B, n-conductive type GaN is crystal grown by using an MOCVD (Metal Organic Chemical Vapor Deposition) apparatus, so that an n-conductive type GaN core 342 is formed. The GaN core 342 of this conductive type is grown to a length of 20 μm with a diameter of 1 μm as an example. With the growth temperature set to about 800° C., with use of trimethylgallium (TMG) and ammonia ($NH_3$) as growth gases, and with feed of silane ($SiH_4$) as an n-type impurity as well as feed of hydrogen ($H_2$) as a carrier gas, the Si-doped n-conductive type GaN core 342 can be grown.

Figure 20C:
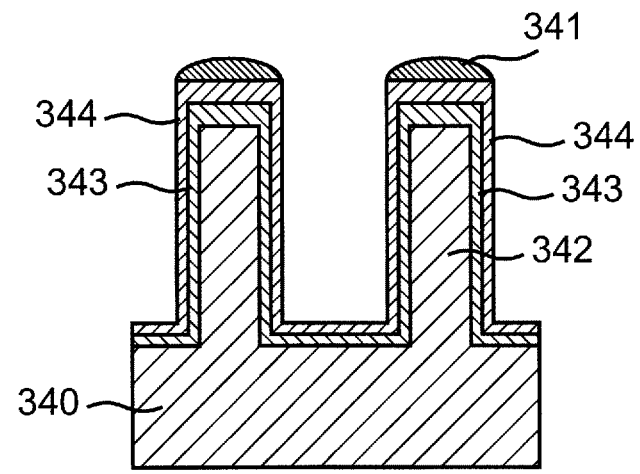
FIG. 20C is a sectional view for explaining the method of fabricating the fine object.

Next, as shown in FIG. 20C, an InGaN layer 343 is formed to a thickness of 5 nm all over the n-conductive type GaN core 342 and the GaN substrate 340 by MOCVD. This may be fulfilled at a temperature of 900° C. with use of TMG, trimethylindium (TMI) and $NH_3$ and with feed of $H_2$ as a carrier gas. Subsequently, a p-conductive type GaN layer 344 is formed to a thickness of 100 nm all over the InGaN layer 343 by MOCVD. This can be formed at a temperature of 900° C. with use of TMG and NH$_3$ and with feed of CP$_2$Mg (biscyclopentadienyl magnesium) for p-type impurity and feed of H$_2$ as the carrier gas.

Figure 20D:
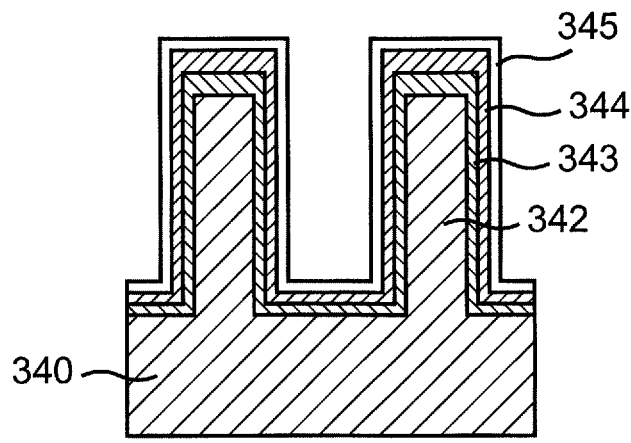
FIG. 20D is a sectional view for explaining the method of fabricating the fine object.

Next, as shown in FIG. 20D, the Ni catalyst 341 on the p-conductive type GaN layer 344 is etched and removed, followed by cleaning, and the p-conductive type GaN layer 344 is activated by annealing. Subsequently, a ferrite shell 345 is deposited to a thickness of 200 nm all over the p-conductive type GaN layer 344 by laser ablation or plating.

Figure 20E:
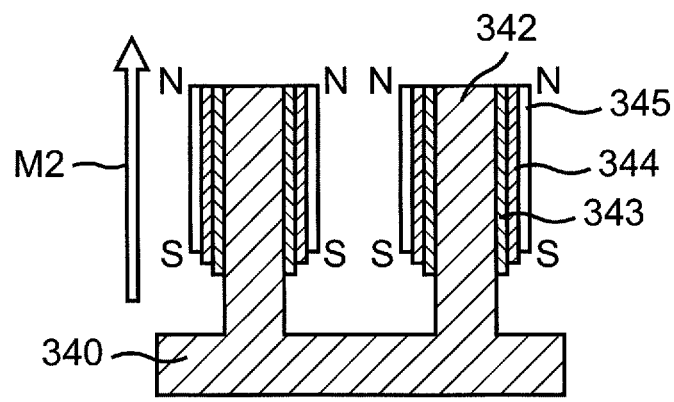
FIG. 20E is a sectional view for explaining the method of fabricating the fine object.

Next, as shown in FIG. 20E, selective etching is applied vertically to the substrate by RIE (Reactive Ion Etching), which is a dry etching, so that the ferrite shell 345, the p-conductive type GaN layer 344, the InGaN layer 342, and the GaN substrate 340 are etched. As a result, the n-conductive type GaN core 342 is formed into such a shape as to have no shell at roots near the GaN substrate 340 and, in upper portion, be covered with shells (InGaN shell 343, p-conductive type GaN shell 344 and ferrite shell 345). Thereafter, as indicated by arrow M2, an external magnetic field is applied vertically to the GaN substrate 340, and the ferrite shell 345 is magnetized vertically to the surface of the GaN substrate 340. As shown in FIG. 20E, the ferrite shell 345 is so magnetized that one side on which the n-type GaN core 342 is projected forms S pole while the other side on which no n-type GaN core 342 is projected forms N pole.

Figure 20F:
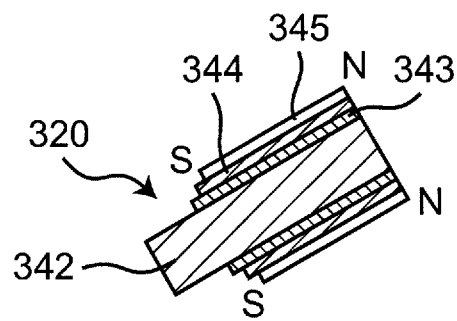
FIG. 20F is a sectional view for explaining the method of fabricating the fine object.

Next, as shown in FIG. 20F, with the GaN substrate 340 immersed in a liquid, ultrasonic waves are applied thereto so that the fine objects 320 are separated from the GaN substrate 340.

This fine object 320 is a pn junction-containing device (light emitting diode), and has the n-conductive type GaN core 342 exposed on one end. The portion where the n-conductive type GaN core 342 is exposed serves as a preferred portion for providing interconnection for electrical connection with the n-conductive type GaN core 342. On the other hand, with interconnection provided at a shell-covered portion, electrical connection with the p-conductive type GaN shell 344 can be made. It can be understood from this that for interconnections with the fine objects 320 to be fulfilled later, it is important to control the alignment (orientation) of the fine object 320. That is, since the device by the fine object 320 has polarity (n-type, p-type), it is quite important on which side of the first electrode 311 side and the second electrode 312 side of the substrate 310 the portion of the fine object 320 where the n-conductive type GaN core 342 is exposed is placed, and controlling not only the place of disposition but also the alignment of the fine object 320 becomes important.

(Fluid Introducing Step)

Figure 21:
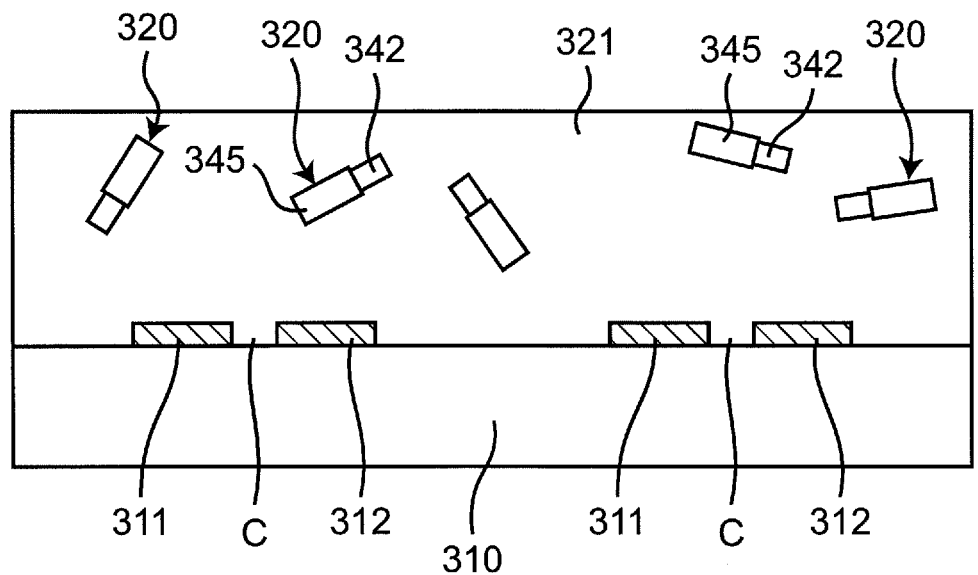
FIG. 21 is a sectional view, taken along the line III-III of FIG. 18, showing an aspect that liquid is introduced onto the substrate.

In this step, as shown in FIG. 21, a fluid 321 containing fine objects 320 is introduced onto the substrate 310. The fine objects 320 are dispersed in the fluid 321. FIG. 21 is a sectional view showing an aspect that the fluid 321 has been introduced onto the substrate 310, in a cross section taken along the line III-III of FIG. 18.

Constituents of the fluid 321 may be the same as those of the fluid 121 described in the foregoing first embodiment.

In addition, although not shown, a cover is preferably provided above the substrate 310 so as to face the substrate 310. This cover is set in parallel to the substrate 310 with a uniform gap (e.g., 500 μm) provided between the substrate 310 and the cover. The gap is filled with the fluid 321 containing the fine objects 320. As a result, it becomes possible to run the fluid 321 into a channel of the gap at a uniform velocity in the fine object disposing step, thus making it possible to dispose the fine objects 320 uniformly on the substrate 310. Moreover, in the subsequent fine object disposing step, evaporation of the fluid 321 that causes convection can be prevented, so that disturbance of the disposition of the fine objects 320 can be prevented.

(Fine Object Disposing Step)

Figure 22:
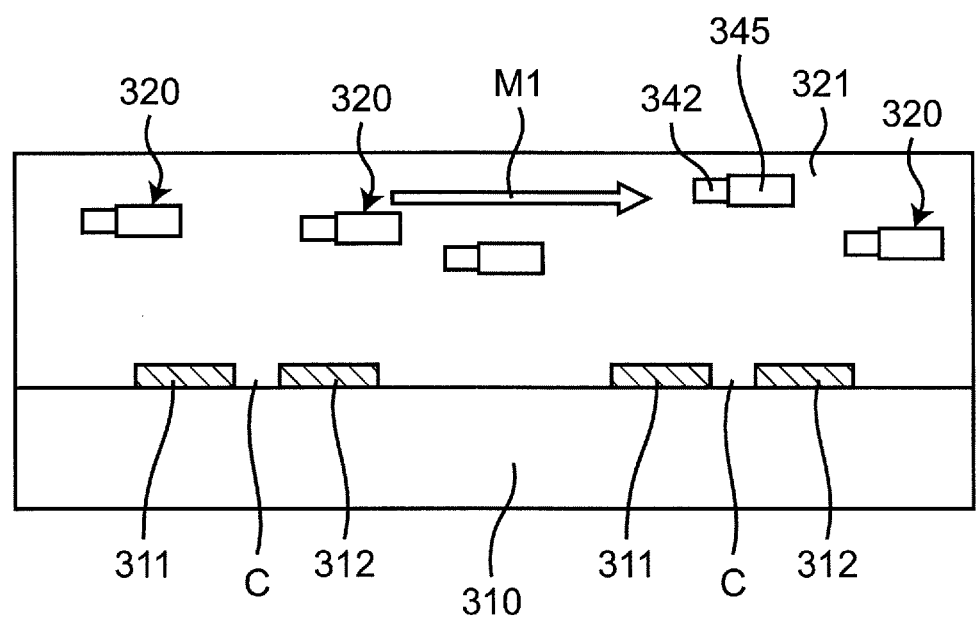
FIG. 22 is a schematic view showing a state in which a voltage is applied between first and second electrodes and in which an external magnetic field parallel to a surface of the substrate is applied in a fine object disposing step in the third embodiment.
Figure 23:
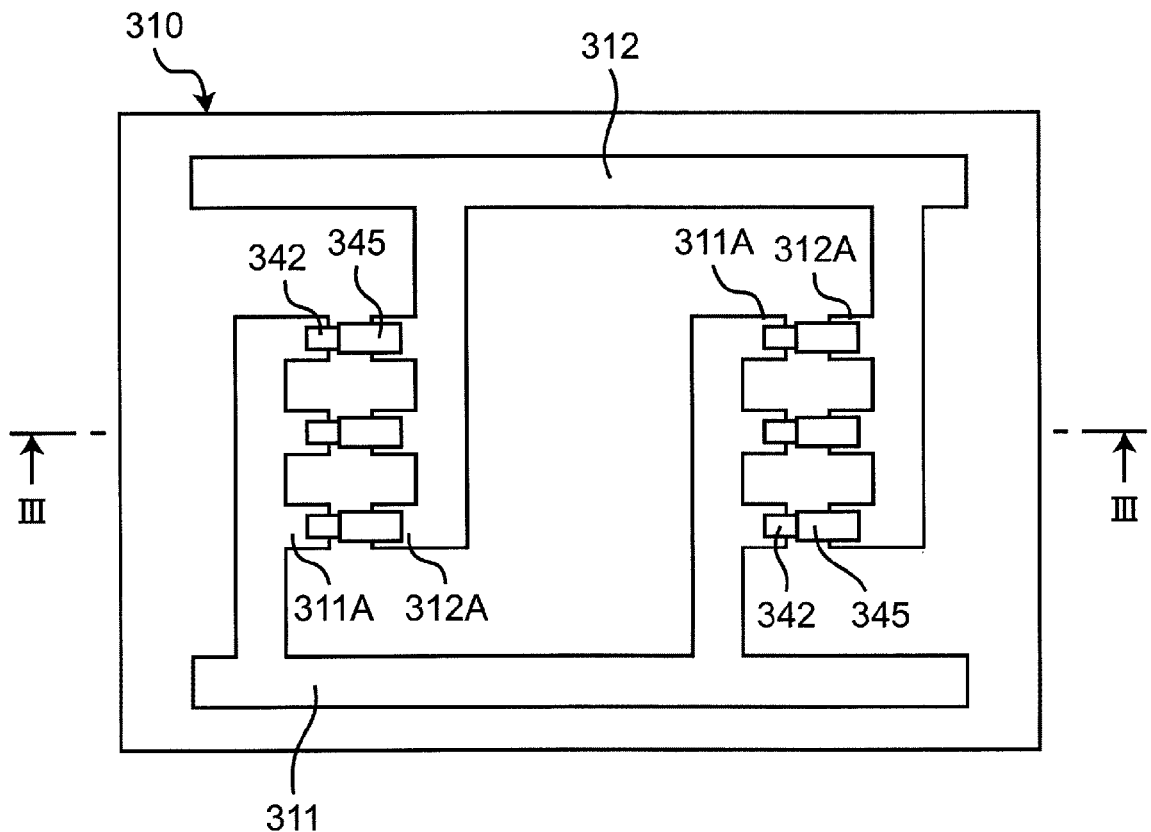
FIG. 23 is a plan view showing a state in which the fine objects are arranged with their orientation uniformized between the first and second electrodes in the fine object disposing step in the third embodiment.
Figure 24:
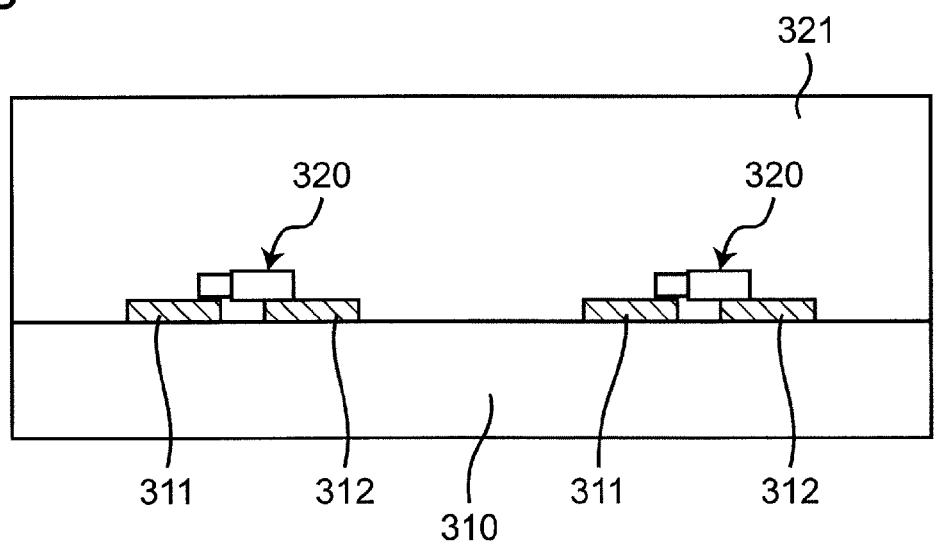
FIG. 24 is a sectional view taken along the line III-III of FIG. 23.

In this step, after the fluid introducing step, as shown in FIG. 22, a voltage is applied between the first electrode 311 and the second electrode 312, and further an external magnetic field M1 is applied in generally parallel to a surface of the substrate 310, so that the fine objects 320 are resultantly disposed in a predetermined orientation at predetermined positions on the substrate 310 as shown in the plan view of FIG. 23 and the sectional view of FIG. 24. It is noted that FIG. 24 is a sectional view taken along the line III-III of FIG. 23.

FIG. 22 explains a principle on which the fine objects 320 are disposed in an uniformized alignment at places where the first, second electrodes 311, 312 face each other. The external magnetic field M1 is applied in parallel to the surface of the substrate 310. Since the ferrite shell 345 that is the outermost-layer shell of each fine object 320 is magnetized in the lengthwise direction of the fine object 320 as already described, the fine objects 320 are arrayed so as to be aligned along the external magnetic field M1. In this state, an AC voltage similar to that of the first embodiment (see FIG. 6) is applied between the first electrode 311 and the second electrode 312. As a result of this, the fine objects 320 are disposed in an uniformized alignment at predetermined positions on the substrate 310 specified by the place where the facing portions 311A, 312A of the first, second electrodes 311, 312 face each other as shown in FIGS. 23 and 24.

In this way, as shown in FIGS. 23 and 24, the fine objects 320 can be arranged on the substrate 310 at predetermined positions and in a predetermined orientation.

With IPA used as the fluid 321, the frequency of the AC voltage fed to the first electrode 311 is preferably set to 10 Hz to 1 MHz, more preferably 50 Hz to 1 kHz, which makes the arrangement most stable. Further, the AC voltage to be applied between the first electrode 311 and the second electrode 312 is not limited to sine waves and may be any one that periodically varies such as rectangular waves, triangular waves and sawtooth waves. The AC voltage V$_{PPL}$ (double of amplitude) fed to the first electrode 311 may be 0.1 to 10 V, where voltages lower than 0.1 V result in worse arrangement of the fine objects 320 while voltages higher than 10 V cause the fine objects 320 to be immediately fixed onto the substrate 310 with a result of worse disposition yield. Therefore, the voltage V$_{PPL}$ is preferably set to 1 to 5 V, more preferably to about 1 V.

Next, after completion of the disposition of the fine objects 320 onto the substrate 310, the substrate 310 is heated with the voltage application to the electrodes 311, 312 maintained, so that the liquid 321 is evaporated to fulfill drying, making the fine objects 320 fixed onto the substrate 310. Otherwise, after completion of the disposition of the fine objects 320, a sufficiently high voltage (10 to 100 V) is applied to the first electrode 311 and the second electrode 312 so that the fine objects 320 are fixed onto the substrate 310, and with the voltage application stopped, the substrate 310 is dried.

(Interconnection Step)

In this step, after the fine object disposing step, the fine objects (devices) 320 disposed on the substrate 310 are interconnected. The interconnection step of this embodiment can be fulfilled in the same way as in the first embodiment. In a later-described twelfth embodiment, a method for fabricating a light emitting apparatus from the state of FIGS. 23 and 24 in this embodiment will be described in detail. Further in a later-described thirteenth embodiment, a display apparatus that is another application example will be mentioned.

The fine object 320 may be other than a light emitting diode, and may be a diode as an example. This embodiment is effective for cases where the fine objects, for which one end and the other end in the lengthwise direction are specified by different physical properties, need to be disposed with alignment of the one end and the other end specified relative to the substrate 310 as in the case of the fine objects 320.

(Major Effects)

In this embodiment, as to the substrate 310 to be prepared in the substrate preparing step, the first electrode 311 and the second electrode 312 are formed on the substrate 310, and the predetermined positions are defined by the areas where the first electrode 311 and the second electrode 312 face each other. Also, in the fine object disposing step, the voltage is applied between the first electrode 311 and the second electrode 312, by which the fine objects are disposed at the predetermined positions.

With the above constitution, regions where the fine objects 320 are arranged can be freely defined on the substrate 310 by the first electrode 311 and the second electrode 312. With the method of disposing the fine objects 320 on the substrate 310 in the constitution, even when a large number of the fine objects 320 are arranged, time and costs required for the disposing step hardly vary because the large number of areas where the first electrodes 311 and the second electrode 312 face each other, i.e. the facing portions 311A, 312A, have only to be provided. Besides, the method is quite suitable for improving the yield of the disposition because the forces acting between the substrate 310 and the fine objects 320 can be freely changed by regulation of the voltage applied between the first, second electrodes 311, 312. For instance, the fine objects 320 can be fixed to the substrate 310 by increase in the voltage after the completion of the disposition of the fine objects 320 as described in the first embodiment. Furthermore, the yield of the disposition can be further increased because the fine object disposing step can be started by the application of the voltage after sufficient stabilization of the flow of the fluid 321 posterior to the fluid introducing step, for instance.

Also in this embodiment, the alignment structure of the fine object 320 is that the fine object 320 has a ferrite shell 345 that is a magnetized ferromagnetic material. Then, in the fine object disposing step, the fine objects 320 are aligned in a predetermined orientation by an external magnetic field.

As a result of this, the fine objects 320 can be disposed on the substrate 310 with the position and orientation of the fine objects controlled. With this constitution, without imparting an alignment structure to the substrate 310, the fine objects 320 can be disposed in a predetermined orientation at predetermined positions on the substrate 310 simply with high yield. Also, in the fine object disposing step, there is no need for fluidizing the fluid 321 containing the fine objects 320 relative to the substrate 310 for improvement of the yield in the alignment of the fine objects 320 into the predetermined orientation. Therefore, the fine objects 320 are free from disturbance of their orientation by the flow of the fluid 321, so that the fine objects 320 can be disposed on the substrate 310 in a uniform orientation with quite high yield.

In particular, in this embodiment, the external magnetic field M1 is directed generally parallel to the surface of the substrate 310. In this case, it becomes possible to dispose the fine objects 320 at predetermined positions on the substrate 310 under control of the orientation of the fine objects 320 with respect to an axial direction parallel to the surface of the substrate 310.

Fourth Embodiment

Next, a fourth embodiment of the invention will be described with reference to FIGS. 25 to 31. This embodiment is so constituted that the orientation of fine objects in their disposition onto the substrate is effectively controlled by combinations between the alignment structure of the fine objects and an external magnetic field generally vertical to the surface of the substrate.

(Substrate Preparing Step)

Figure 25:
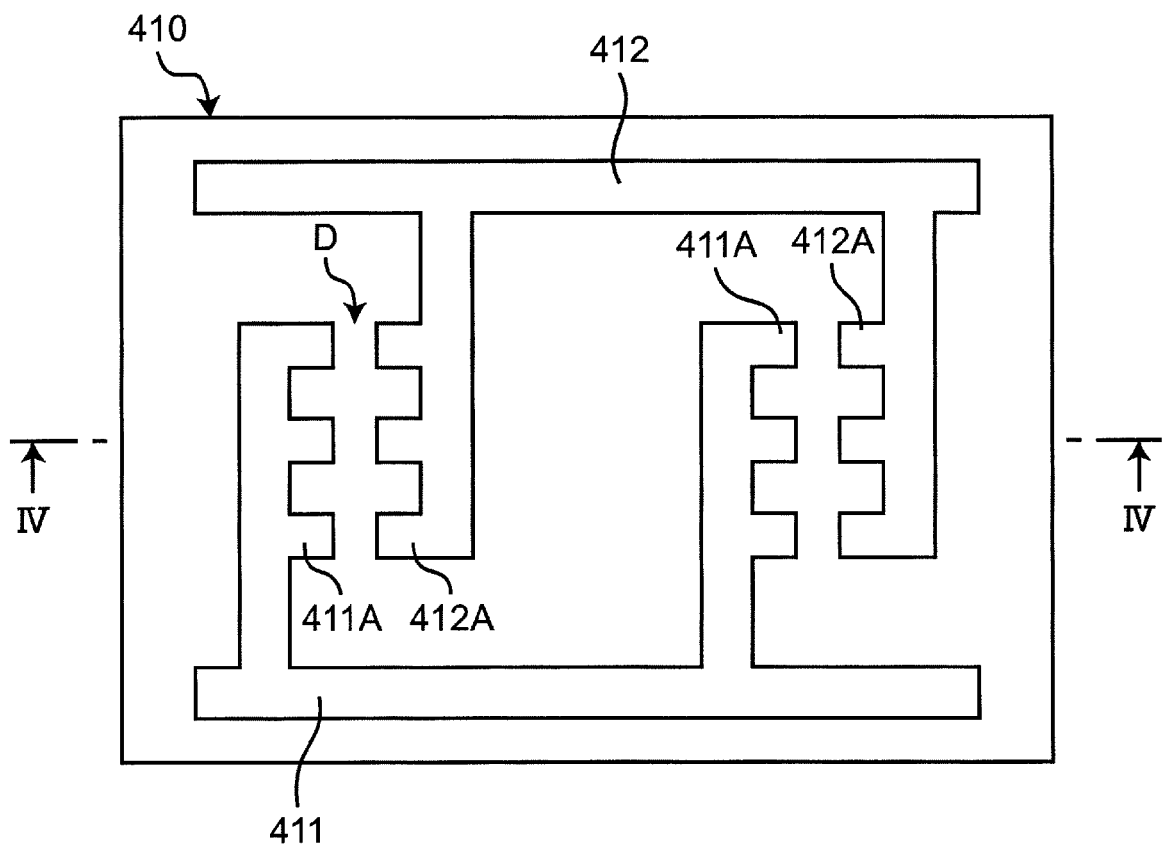
FIG. 25 is a plan view of a substrate prepared in a fourth embodiment of a disposing method for fine objects of the invention.

In this step, a substrate 410 in which a first electrode 411 and a second electrode 412 are formed on a surface thereof as shown in FIG. 25 is prepared. In this case, the substrate 410 is an insulated substrate and the first, second electrodes 411, 412 are metal electrodes. Material and fabrication method for the substrate 410 and the electrodes 411, 412 may be the same as in the first embodiment.

Surfaces of the first, second electrodes 411, 412 may be covered with an insulating film, which is not shown. In this case, the following effects are produced. In the later fine object disposing step, a voltage is applied between the first electrode 411 and the second electrode 412 with a liquid introduced onto the substrate 410, in which case any flow of electric current between the electrodes 411, 412 can be prevented. Such a current may cause a voltage drop in the electrodes to make a cause of arrangement failures of the fine objects or otherwise may cause dissolution of the electrodes due to an electrochemical effect. The insulating film for covering the first, second electrodes 411, 412 may be given, for example, by using a silicon oxide film or a silicon nitride film. Without coverage by such an insulating film, on the other hand, the first, second electrodes 411, 412 and the later-described fine objects 420 can be electrically connected to each other with simplicity, making it easier to utilize the first, second electrodes 411, 412 for interconnection.

Areas where the fine objects 420 are disposed are defined by areas D where facing portions 411A, 412A of the first, second electrodes 411, 412 face each other. That is, in the later-described fine object disposing step, the fine objects 420 are disposed in the areas D where the facing portions 411A, 412A of the first, second electrodes 411, 412 face each other, so as to bridge the first, second electrodes 411, 412. Therefore, it is desirable that a distance between the first electrode 411 and the second electrode 412 in each area A where the facing portions 411A, 412A of the first, second electrodes 411, 412 face each other is slightly shorter than a length of each fine object 420. As an example, on condition that the fine object is elongate strip-shaped and 20 µm long, the distance between the facing portion 411A of the first electrode 411 and the facing portion 412A of the second electrode 412 is desirably set to 12 µm to 18 µm. That is, the distance is desirably set to about 60 to 90% of the length of the fine object, more preferably about 80 to 90% of the length.

(Fine Objects)

Figure 26:
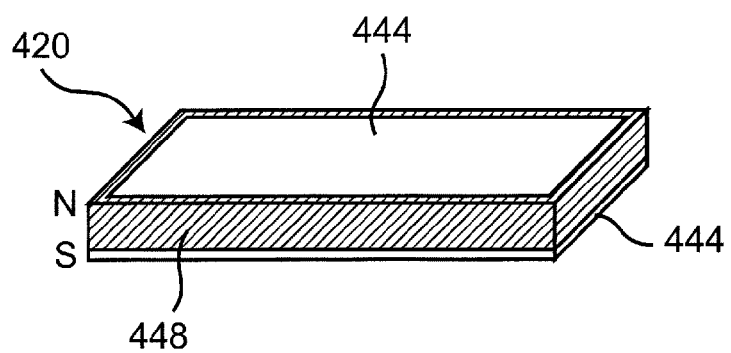
FIG. 26 is a perspective view of a fine object that is disposed in the fourth embodiment.

Next, fine objects to be disposed on the substrate 410 will be described. As shown in FIG. 26, a fine object 420 is strip-shaped and has a front side portion including a front side surface and a rear side portion including a rear side surface. That is, in the front side portion of the fine object 420, periphery of a silicon nitride film 444 exposed in a rectangular shape is surrounded in a frame shape by a ferrite layer 448. Also, in the rear side portion of the fine objects 420, the silicon nitride film 444 surrounds a later-described n-type impurity region 445 in a frame shape.

In addition, the fine object 420 has only to have the front side surface and the rear side surface defined thereon, does not necessarily have to be strip-shaped, and may be formed into circular, elliptical, polygonal or other shapes. The fine object may be sized to have, for example, a longer side length of 10 μm, a shorter side length of 5 μm, and a thickness of 0.5 μm, but this is not limitative.

In the fine object 420, the silicon nitride film 444 is formed in the front side portion. On the other hand, although not shown in FIG. 26, a p-type impurity region 446 is formed in the rear side portion so as to be sandwiched by the silicon nitride film 444 and the n-type impurity region 445 in the fine object 420 (see FIG. 27G). That is, the fine object 420 functions as a pn junction-containing diode. A ferrite layer 448 is formed also in side faces of the fine object 420, and the ferrite layer 448 is magnetized in the thicknesswise direction of the fine object 420.

The alignment structure of the fine object 420 is the ferrite layer 448, which is a ferromagnetic material magnetized in the thicknesswise direction of the fine object 420.

FIGS. 27A to 27G are views showing a method for fabricating the fine object 420.

Figure 27A:
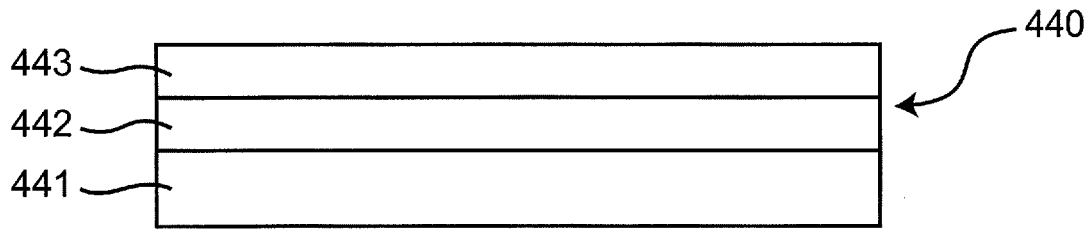
FIG. 27A is a sectional view for explaining a method of fabricating the fine object.

First, an SOI substrate 440 as shown in FIG. 27A is prepared. The SOI substrate 440 is composed of a silicon substrate 441, a BOX layer 442 made of a silicon oxide film, and an SOI layer 443.

Figure 27B:
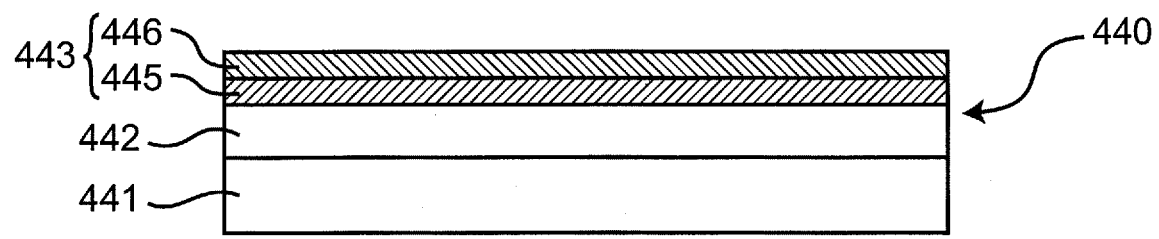
FIG. 27B is a sectional view for explaining the method of fabricating the fine object.

Next, as shown in FIG. 27B, an n-type impurity region 445 and a p-type impurity region 446 are formed in layers in the SOI layer 443. The n-type, p-type impurity regions 445, 446 can be formed by ion-implanting arsenic and boron and performing annealing for activation. As a result, a pn junction is formed at a boundary between the n-type impurity region 445 and the p-type impurity region 446.

Figure 27C:
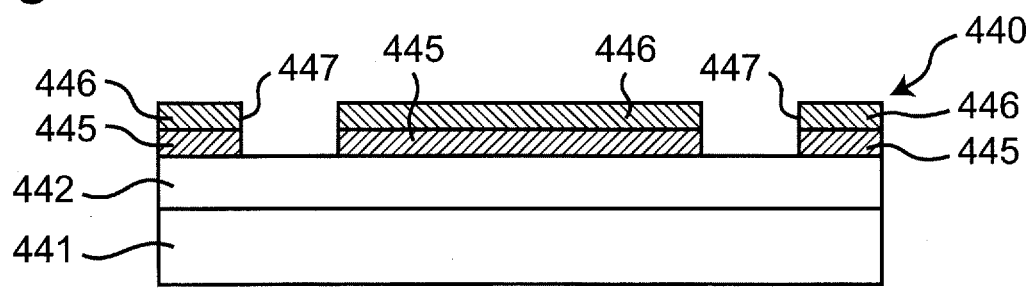
FIG. 27C is a sectional view for explaining the method of fabricating the fine object.

Next, as shown in FIG. 27C, a trench 447 is formed on the SOI substrate 440 at least until the BOX layer 442 is exposed. This trench 447 can be formed by normal photolithography process and dry etching process applied to the SOI substrate 440.

Figure 27D:
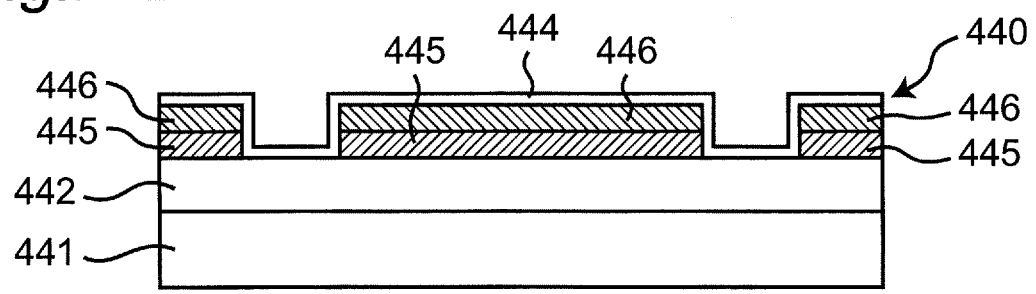
FIG. 27D is a sectional view for explaining the method of fabricating the fine object.

Next, as shown in FIG. 27D, a silicon nitride film 444 is deposited on the overall surface of the SOI substrate 440. This silicon nitride film 444 can be formed by CVD process.

Figure 27E:
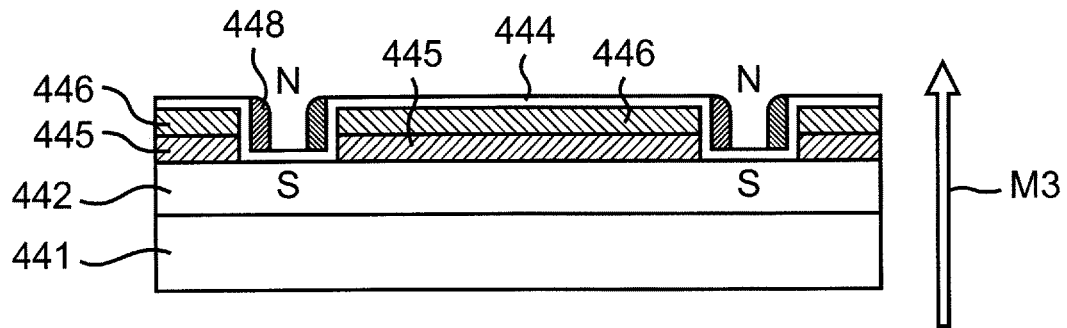
FIG. 27E is a sectional view for explaining the method of fabricating the fine object.

Next, as shown in FIG. 27E, a ferrite is deposited on the overall surface of the SOI substrate 440 by laser ablation or plating and thereafter etched back by dry etching, by which a side-wall insulating film (ferrite layer 448) is formed. Thereafter, an external magnetic field is applied in a direction vertical to the surface of the SOI substrate 440 (in a direction indicated by arrow M3), so that the ferrite layer 448 is magnetized in a direction vertical to the surface of the SOI substrate 440.

Figure 27F:
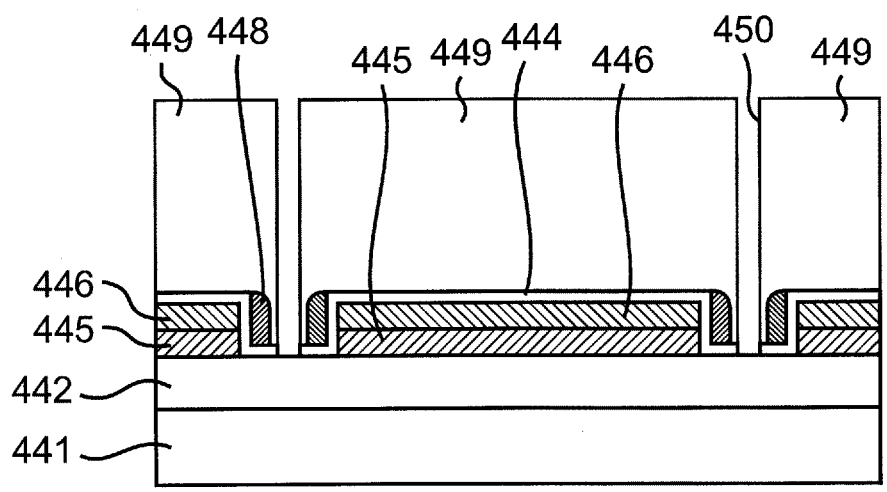
FIG. 27F is a sectional view for explaining the method of fabricating the fine object.

Next, as shown in FIG. 27F, photoresist 449 is applied onto the overall surface of the SOI substrate 440 and patterned by photolithography process, by which slits 450 of the photoresist 449 are formed at positions where the trenches 447 have been present. Then, the silicon nitride film 444 present at the slit 450 positions of the photoresist 449 is removed by etching, so that the BOX layer 442 is exposed.

Figure 27G:
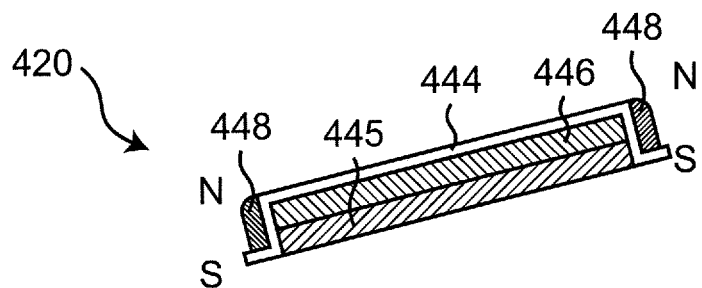
FIG. 27G is a sectional view for explaining the method of fabricating the fine object.

Next, as shown in FIG. 27G, the SOI substrate 440 is immersed into a hydrofluoric acid solution so that the BOX layer 442 made of a silicon oxide film is dissolved to separate the fine object 420 from the SOI substrate 440. In this step, since the photoresist 449 has stuck to the fine objects 420, the photoresist 449 is removed by immersion into acetone. This fine object 420 is a pn junction-containing device (diode), and the device (fine object 420) has polarity. Therefore, it is quite important whether the fine object 420 is disposed on the substrate 410 with the front side surface (silicon nitride film 444 exposed in a rectangular shape) positioned on the upper side or with the rear side surface (n-type impurity region 445) positioned on the upper side, and thus it is important to control not only the area for the disposition but also orientation (positions of the front and the rear) thereof.

As shown in FIG. 27G, the ferrite layer 448 forming the side-wall insulating film of the fine object 420 has its front surface side magnetized to N pole and the rear surface side magnetized to S pole.

(Fluid Introducing Step)

Figure 28:
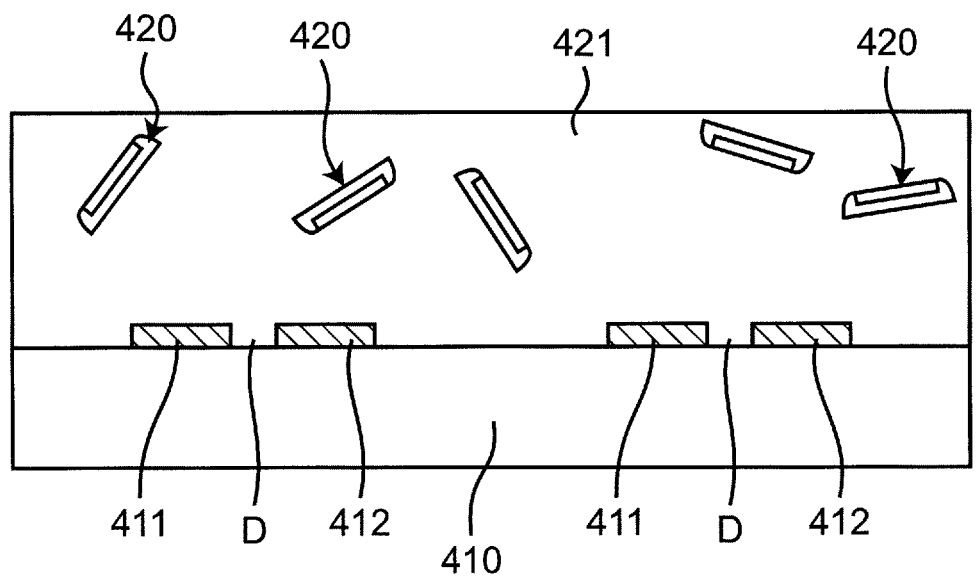
FIG. 28 is a sectional view, taken along the line IV-IV of FIG. 25, showing an aspect that liquid is introduced onto the substrate.

In this step, as shown in FIG. 28, a fluid 421 containing fine objects 420 is introduced onto the substrate 410. The fine objects 420 are dispersed in the fluid 421. FIG. 28 is a sectional view showing an aspect that the fluid 421 has been introduced onto the substrate 410, in a cross section taken along the line IV-IV of FIG. 25.

Liquids such as IPA (isopropyl alcohol), ethanol, methanol, ethylene glycol, propylene glycol, acetone, and water or mixtures thereof can be used as the fluid 421, whereas the fluid 421 is not limited thereto. Preferable properties that the fluid 421 should have are low viscosity such that the arrangement of the fine objects 420 is not hindered, ion concentration that is not remarkably high, and possession of volatility such that the substrate 410 can be dried after the arrangement of the fine objects 420. Use of a liquid having remarkably high ion concentration prevents the electric field from permeating the liquid, by prompt formation of electric double layers on the first, second electrodes 411, 412, when a voltage is applied to the first, second electrodes 411, 412, with the result that the arrangement of the fine objects 420 is inhibited.

Although not shown, a cover is preferably provided above the substrate 410 so as to face the substrate 410. The cover is provided so as to parallel the substrate 410 and a uniform clearance (e.g., 500 μm) is provided between the substrate 410 and the cover. The clearance is filled with the fluid 421 containing the fine objects 420. As a result, it becomes possible to make the fluid flow through a channel of the clearance at a uniform velocity and to uniformly dispose the fine objects 420 on the substrate 410 in the next-described fine object disposing step. This also prevents the fluid 421 from evaporating, causing convection, and disturbing the disposition of the fine objects 420 in the subsequent fine object disposing step.

(Fine Object Disposing Step)

Figure 29:
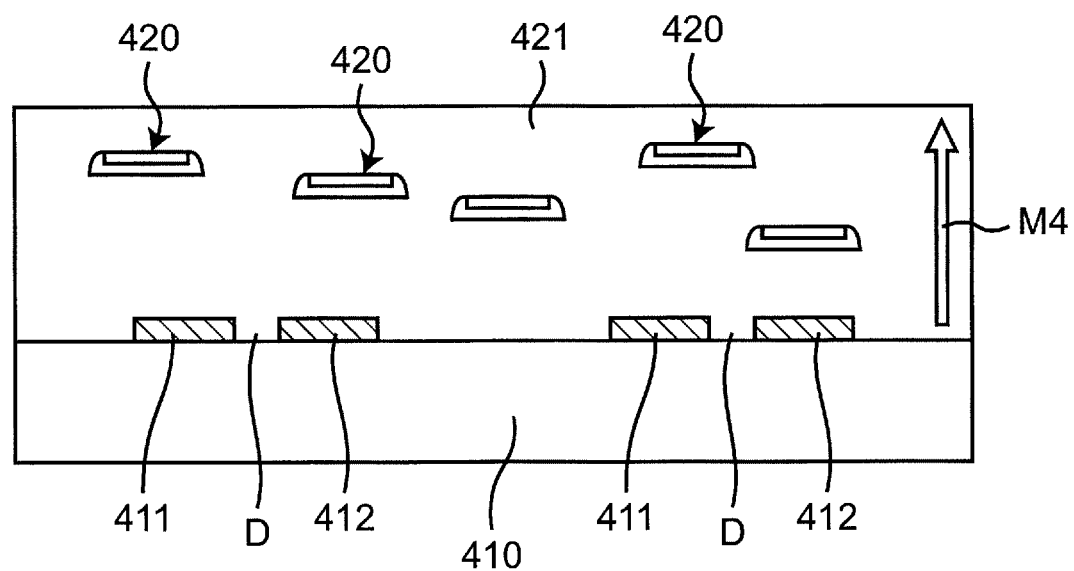
FIG. 29 is a schematic view showing a state in which a voltage is applied between first and second electrodes and in which an external magnetic field perpendicular to a surface of the substrate is applied in a fine object disposing step in the fourth embodiment.
Figure 30:
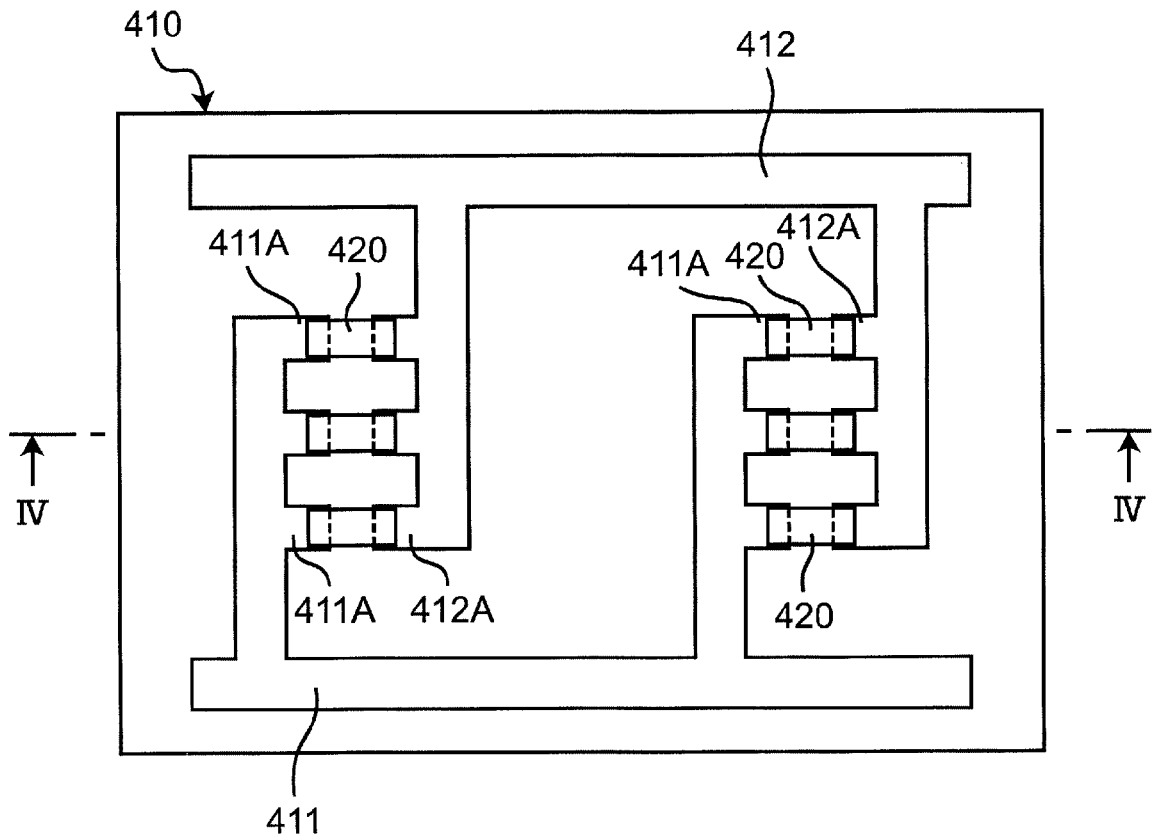
FIG. 30 is a plan view showing a state in which the fine objects are arranged with their orientation uniformized between the first and second electrodes in the fine object disposing step in the fourth embodiment.
Figure 31:
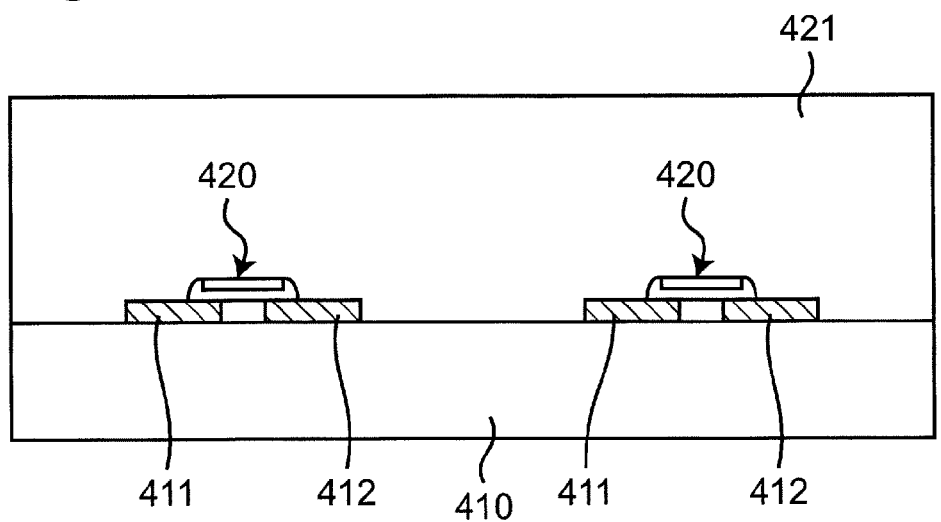
FIG. 31 is a sectional view taken along the line IV-IV of FIG. 30.

In this step, a voltage is applied between the first electrode 411 and the second electrode 412 as shown in FIG. 29 after the above-described fluid introducing step. Further, an external magnetic field is applied in a direction generally vertical to the surface of the substrate 410 (in a direction indicated by arrow M4), so that the fine objects 420 are resultantly disposed in a predetermined orientation at predetermined positions on the substrate 410 as shown in FIGS. 30 and 31. FIG. 31 shows a sectional view taken along line IV-IV of FIG. 30.

FIG. 29 illustrates a principle on which the fine objects 420 are disposed with their orientation uniformized in areas where the facing portions 411A, 412A of the first, second electrodes 411, 412 face each other. As already described, the ferrite layer 448 formed on the side faces of the fine objects 420 is magnetized in the thicknesswise direction of the fine object 420. Therefore, with an external magnetic field applied vertical to the surface of the substrate 410 in the direction indicated by the arrow M4, the fine objects 420 are arrayed with their orientation uniformized along the external magnetic field. In this state, an AC voltage similar to that of the above-described first embodiment (see FIG. 6) is applied between the first electrode 411 and the second electrode 412. As a result, as shown in FIGS. 30 and 31, the fine objects 420 are disposed with their orientation uniformized at positions on the substrate 410 specified by areas where the facing portions 411A, 412A of the first, second electrodes 411, 412 face each other.

In this way, as shown in FIGS. 30 and 31, the fine objects 420 can be arranged in the predetermined orientation at the predetermined positions on the substrate 110.

With IPA used as the fluid 421, the frequency of the AC voltage fed to the first electrode 411 is preferably set to 10 Hz to 1 MHz, more preferably 50 Hz to 1 kHz, which makes the arrangement most stable. Further, the AC voltage to be applied between the first electrode 411 and the second electrode 412 is not limited to sine waves and may be any one that periodically varies such as rectangular waves, triangular waves and sawtooth waves. The AC voltage $V_{PPL}$ (double of amplitude) fed to the first electrode 411 may be 0.1 to 10 V, where voltages lower than 0.1 V result in worse arrangement of the fine objects 420 while voltages higher than 10 V cause the fine objects 420 to be immediately fixed onto the substrate 410 with a result of worse disposition yield. Therefore, the voltage $V_{PPL}$ is preferably set to 1 to 5 V, more preferably to about 1 V.

Next, after completion of the disposition of the fine objects 420 onto the substrate 410, the substrate 410 is heated with the voltage application maintained, so that the liquid 421 is evaporated to fulfill drying, making the fine objects 420 fixed onto the substrate 410. Otherwise, after completion of the disposition of the fine objects 420, a sufficiently high voltage (10 to 100 V) is applied to the first electrode 411 and the second electrode 412 so that the fine objects 420 are fixed onto the substrate 410, and with the voltage application stopped, the substrate 410 is dried.

(Interconnection Step)

In this step, subsequent to the fine object disposing step, the fine objects (devices) 420 disposed on the substrate 410 are interconnected. The interconnection step of this embodiment can be fulfilled in the same manner as in the foregoing first embodiment. Therefore, figures and detailed description of the interconnection step are omitted.

Although the fine objects 420 that are diode elements have been described above, the fine objects 420 may be other elements, such as light emitting diodes. Furthermore, the fine objects 420 may include integrated circuits and may each have two terminals that are to be connected to outside, and the two terminals may be formed on the front side surface and the rear side surface of each fine object 420. This embodiment is effective on condition that the front side surface and the rear side surface are defined on each of the fine objects 420 and that the fine objects 420 are required to be disposed in a specified orientation of the front and rear thereof with respect to the substrate 410.

(Major Effects)

In this embodiment, as to the substrate 410 to be prepared in the substrate preparing step, the first electrode 411 and the second electrode 412 are formed on the substrate 410, and the predetermined positions are defined by the areas where the first electrode 411 and the second electrode 412 face each other. Also, in the fine object disposing step, the voltage is applied between the first electrode 411 and the second electrode 412, by which the fine objects are disposed at the predetermined positions.

With the above constitution, regions where the fine objects 420 are arranged can be freely defined on the substrate 410 by the first electrode 411 and the second electrode 412. With the method of disposing the fine objects 420 on the substrate 410 in the constitution, even when a large number of the fine objects 420 are arranged, time and costs required for the disposing step hardly vary because the large number of areas (the facing portions 411A, 412A) where the first electrodes 411 and the second electrodes 412 face each other have only to be provided. Besides, the method is quite suitable for improving the yield of the disposition because the forces acting between the substrate 410 and the fine objects 420 can be freely changed by regulation of the voltage applied between the first, second electrodes 411, 412. For instance, the fine objects 420 can be fixed to the substrate 410 by increase in the voltage after the completion of the disposition of the fine objects 420 as described in the first embodiment. Furthermore, the yield of the disposition can be increased because the fine object disposing step can be started by the application of the voltage after sufficient stabilization of the flow of the fluid posterior to the fluid introducing step, for instance.

In this embodiment, the alignment structure of the fine object 420 is that the fine object 420 includes a magnetized ferromagnetic material (ferrite layer 448). Then, in the fine object disposing step, the fine objects 420 are aligned into the predetermined orientation by an external magnetic field having the direction shown by the arrow M4.

As a result of this, the fine objects 420 can be disposed on the substrate 410 with the position and orientation of the fine objects 120 controlled. According to such a constitution, the fine objects 420 can easily be disposed in the predetermined orientation at the predetermined positions on the substrate 410 with a high yield without provision of alignment structures for the substrate 410. Also, in the fine object disposing step, there is no need for fluidizing the fluid 421 containing the fine objects 420 relative to the substrate 410 for improvement of the yield in the alignment of the fine objects 420 into the predetermined orientation. Therefore, the fine objects 420 are free from disturbance of their orientation by the flow of the fluid 421, so that the fine objects 420 can be disposed on the substrate 410 in a uniform orientation with quite high yield.

In particular, in this embodiment, the external magnetic field is directed generally vertical to the surface of the substrate 410. In this case, it becomes possible to dispose the fine objects 420 at predetermined positions on the substrate 410 with the orientation of the fine objects 420 controlled with respect to the axial direction vertical to the surface of the substrate 410. That is, as shown in this embodiment, the fine objects 420 can be disposed at the predetermined positions on the substrate 410 with front/rear orientation of the fine objects 420 uniformized.

Fifth Embodiment

Next, a fifth embodiment of the invention will be described with reference to FIGS. 32 to 36. This embodiment is so constituted that not only fine objects but also a substrate has an alignment structure, where the orientation of fine objects in their disposition onto the substrate is effectively controlled by combinations between the alignment structure of the fine objects and the alignment structure of the substrate.

(Substrate Preparing Step)

Figure 32:
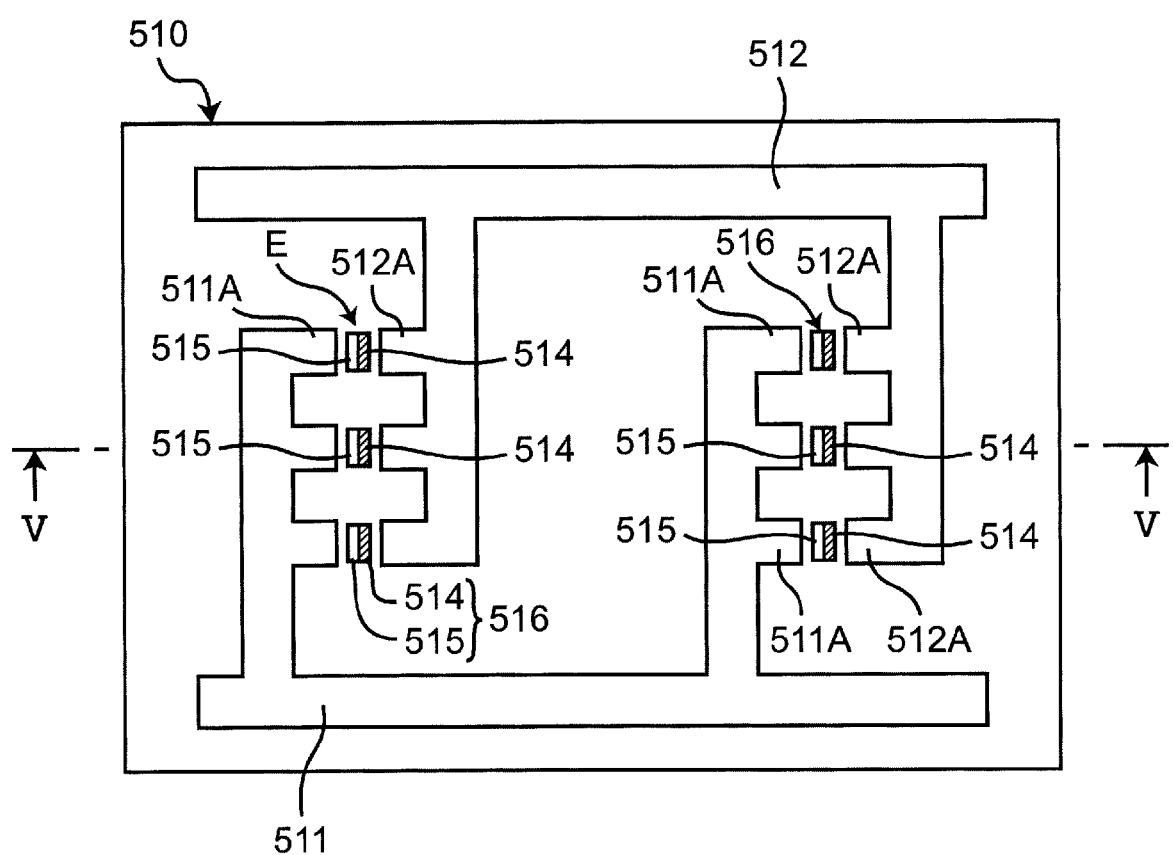
FIG. 32 is a plan view of a substrate prepared in a fifth embodiment of a disposing method for fine objects of the invention.

In this step, a substrate 510 in which a first electrode 511 and a second electrode 512 as well as a ferromagnetic pattern 516 composed of an S-pole portion 514 and an N-pole portion 515 are formed on a surface thereof as shown in FIG. 32 is prepared. In this case, the substrate 510 is an insulated substrate and the first, second electrodes 511, 512 are metal electrodes. The metal electrodes (first, second electrodes 511, 512) in desired electrode shapes can be formed on the surface of the substrate 510 by using a printing technique as an example. The first, second electrodes 511, 512 can be formed by uniform deposition of a metal film and a photoconductor film on the surface of the substrate 510, exposure and development of the photoconductor film into a desired electrode pattern, and etching of the metal film with the patterned photoconductor film used as a mask. Thereafter, a ferrite film that is a ferromagnetic material is deposited on the overall surfaces of the substrate 510 and the first, second electrodes 511, 512 by laser ablation or plating, and a ferromagnetic pattern 516 is formed by the photolithography process and etching process as described above. The ferromagnetic pattern 516 is formed at areas E where the facing portions 511A, 512A of the first, second electrodes 511, 512 face each other (i.e., places where the fine objects are to be disposed). Thereafter, an external magnetic field is applied parallel to the surface of the substrate 510 so as to magnetize the ferromagnetic pattern 516, by which the S-pole portion 514 and the N-pole portion 515 are formed.

Gold, silver, copper, tungsten, aluminum, tantalum, alloys of these or the like can be used as metal material from which the first, second electrodes 511, 512 are formed. For the ferromagnetic pattern 516, a ferromagnetic material such as iron oxide, chromium oxide and cobalt may be used instead of ferrite. Also, the substrate 510 is formed from insulator such as glass, ceramic, alumina and resin, or semiconductor such as silicon of which a surface has insulative property with a silicon oxide film formed. With use of the glass substrate, it is desirable to form a foundation insulating film such as a silicon oxide film and a silicon nitride film on a surface thereof.

Surfaces of the first, second electrodes 511, 512 may be covered with an insulating film, which is not shown. In this case, the following effects are produced. In the later fine object disposing step, a voltage is applied between the first electrode 511 and the second electrode 512 with a liquid introduced onto the substrate 510, in which case any flow of electric current between the electrodes 511, 512 can be prevented. Such a current may cause a voltage drop in the electrodes 511, 512 to make a cause of arrangement failures or otherwise may cause dissolution of the electrodes 511, 512 due to an electrochemical effect. The insulating film for covering the first, second electrodes 511, 512 may be given, for example, by using a silicon oxide film or a silicon nitride film. Without coverage by such an insulating film, on the other hand, the first, second electrodes 511, 512 and fine objects 520 can be electrically connected to each other with simplicity, making it easier to utilize the first, second electrodes 511, 512 for interconnection.

Areas where later-described fine objects are disposed are defined by areas E where facing portions 511A, 512A of the first, second electrodes 511, 512 face each other. That is, in the later-described fine object disposing step, the fine objects are disposed in the areas E where the facing portions 511A, 512A of the first, second electrodes 511, 512 face each other so as to bridge the first, second electrodes 511, 512. Therefore, it is desirable that a distance between the facing portion 511A of the first electrode 511 and the facing portion 512A of the second electrode 512 in each area E where the first, second electrodes 511, 512 face each other is slightly shorter than a length of each fine object. As an example, on condition that the fine object is elongate strip-shaped and 20 μm long, the distance between the facing portion 511A of the first electrode 511 and the facing portion 512A of the second electrode 512 is desirably set to 12 μm to 18 μm. That is, the distance is desirably set to about 60 to 90% of the length of the fine object, more preferably about 80 to 90% of the length.

The substrate 510 has the ferromagnetic pattern 516 as an alignment structure, and the ferromagnetic pattern 516 is composed of the S-pole portion 514 and the N-pole portion 515 formed in the area where the facing portion 511A of the first electrode 511 and the facing portion 512A of the second electrode 512 face each other.

(Fine Objects)

Next, fine objects to be disposed on the substrate 510 will be described.

Figure 33:
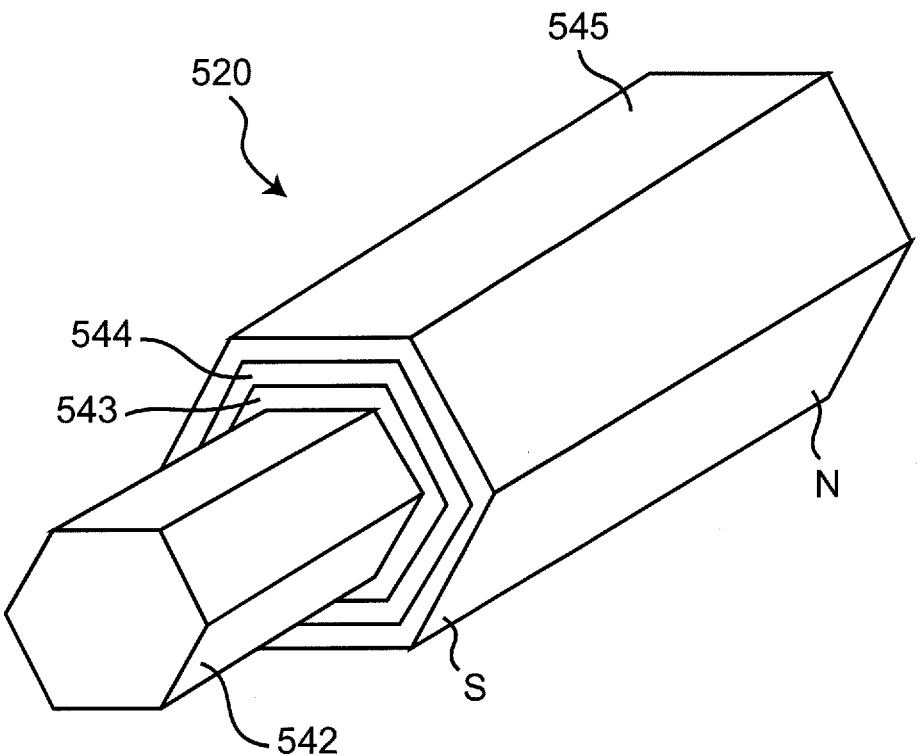
FIG. 33 is a perspective view of a fine object that is disposed in the fifth embodiment.

As shown in FIG. 33, a fine object 520 is elongate bar-like shaped as a whole, and has a core 542 covered around with tri-layer shells 543, 544, 545, the core 542 being exposed at one end of the fine object 520 without the shells. Out of the tri-layer shells, the outermost-layer shell 545 is a magnetized ferromagnetic material. More specifically, a GaN (gallium nitride) core 542 of n-type conductive type is surrounded around by an InGaN (indium gallium nitride) shell 543, outside of which is surrounded by a GaN (gallium nitride) shell 544 of p-type conductive type, while a ferrite shell 545 magnetized along a lengthwise direction of the fine object 520 is formed as an outermost-layer shell.

An alignment structure of the fine object 520 is fulfilled by the ferrite shell 545, which is a ferromagnetic material magnetized along the lengthwise direction of the fine object 520.

The fine object 520 has a function as a light emitting diode element in which the InGaN shell 543 sandwiched by the n-conductive type GaN core 542 and the p-conductive type GaN shell 544 serves as an active layer.

The fine object 520 may be so sized that, for example, the n-conductive type GaN core 542 has a diameter of 1 μm, the InGaN shell 543 is 5 nm thick, the p-conductive type GaN shell 544 is 100 nm thick, the ferrite shell 545 is 200 nm thick, and the n-conductive type GaN core 542 is 20 μm long while the exposed portion of the n-conductive type GaN core 542 is 5 μm long. In addition, the sizes are not limited to those described above, and a so-called nanowire in which the n-conductive type GaN core 542 has a diameter of 100 nm may be adopted as an example.

The fine object 520 described above is similar to the fine object 320 described in the foregoing third embodiment. Therefore, the method for fabricating the fine object 520 is also similar to the method for fabricating the fine object 320 described with reference to FIGS. 20A to 20F in the third embodiment, and so the description is omitted. As shown in FIG. 33, in the ferrite shell 545, one side on which the n-type GaN core 542 is projected forms the S pole while the other side on which the n-type GaN core 542 is not projected forms the N pole.

This fine object 520 is a pn junction-containing device (light emitting diode), and has the n-conductive type GaN core 542 exposed on one end. The portion where the n-conductive type GaN core 542 is exposed serves as a preferred portion for providing interconnection for electrical connection with the n-conductive type GaN core 542. On the other hand, with interconnection provided at a shell-covered portion, electrical connection with the p-conductive type GaN shell 544 can be made. It can be understood from this that for interconnections with the fine objects 520 to be fulfilled later, it is important to control the alignment (orientation) of the fine object 520. That is, since the fine object (device) 520 has polarity (n-type, p-type), it is quite important on which side of the first electrode 511 side and the second electrode 512 side of the substrate 510 the portion of the fine object 520 where the n-conductive type GaN core 542 is exposed is placed, and controlling not only the place of disposition but also the alignment becomes important.

(Fluid Introducing Step)

Figure 34:
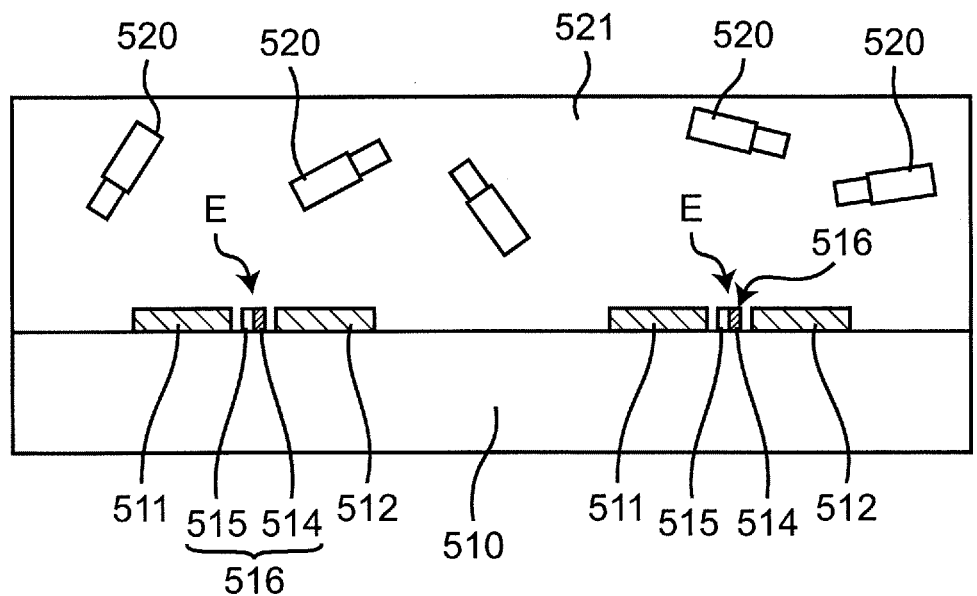
FIG. 34 is a sectional view, taken along the line V-V of FIG. 32, showing an aspect that liquid is introduced onto the substrate.

In this step, as shown in FIG. 34, a fluid 521 containing fine objects 520 is introduced onto the substrate 510. The fine objects 520 are dispersed in the fluid 521. FIG. 34 is a sectional view showing an aspect that the fluid 521 has been introduced onto the substrate 510, in a cross section taken along the line V-V of FIG. 32.

Constituents of the fluid 521 may be the same as in the foregoing first embodiment.

In addition, although not shown, a cover is preferably provided above the substrate 510 so as to face the substrate 510. This cover is set in parallel to the substrate 510 with a uniform gap (e.g., 500 μm) provided between the substrate 510 and the cover. The gap is filled with the fluid 521 containing the fine objects 520. As a result, it becomes possible to run the fluid into a channel of the gap at a uniform velocity in the subsequent fine object disposing step, thus making it possible to dispose the fine objects 520 uniformly on the substrate 510. Moreover, in the subsequent fine object disposing step, evaporation of the fluid 521 that causes convection can be prevented, so that disturbance of the disposition of the fine objects 520 can be prevented.

(Fine Object Disposing Step)

Figure 35:
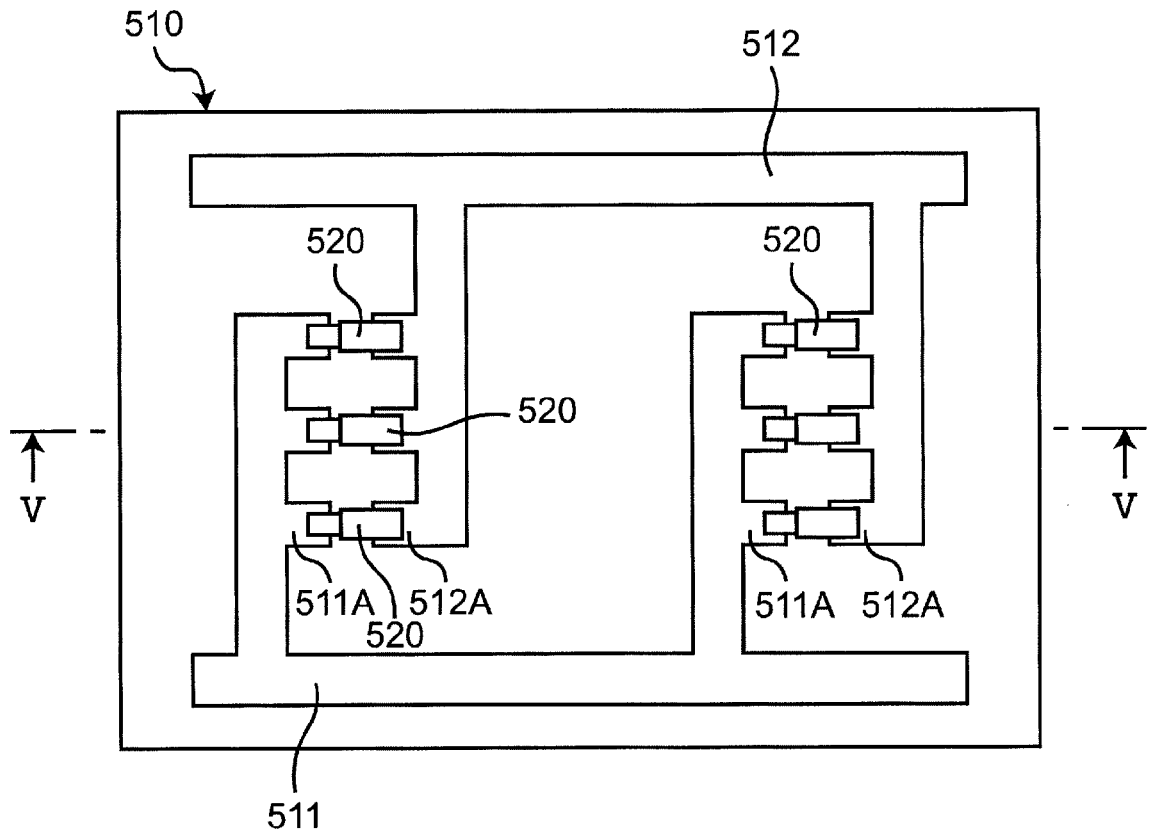
FIG. 35 is a plan view showing a state in which the fine objects are arranged with their orientation uniformized between first and second electrodes in a fine object disposing step in the fifth embodiment.
Figure 36:
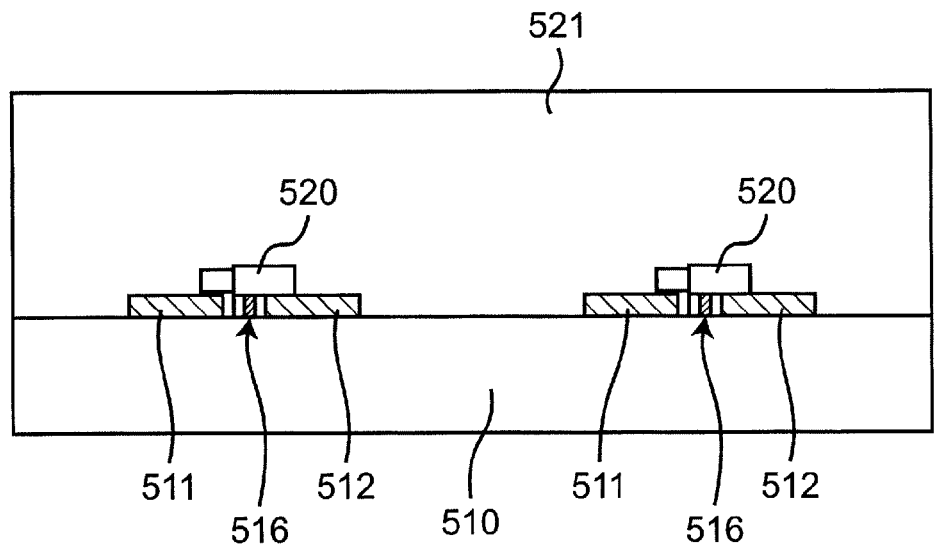
FIG. 36 is a sectional view taken along the line V-V of FIG. 35.

In this step, after the fluid introducing step, a voltage is applied between the first electrode 511 and the second electrode 512, and further interaction between the magnetized ferromagnetic pattern 516 formed on the substrate 510 and the magnetized ferrite shell 545 of the fine objects 520 causes the fine objects 520 to be aligned in their orientation. As a result of this, as shown in FIGS. 35 and 36, the fine objects 520 are disposed in a predetermined orientation at predetermined positions on the substrate 510. That is, by the mutual attraction of the N-pole portion 515 of the ferromagnetic pattern 516 and the S-pole side of the magnetized ferrite shell 545 of the fine objects 520 as well as by the mutual attraction of the S-pole portion 514 of the ferromagnetic pattern 516 and the N-pole side of the ferrite shell 545, the fine objects 520 are uniformized in orientation as shown in FIGS. 35 and 36. It is noted that FIG. 36 is a sectional view taken along the line V-V of FIG. 35.

In this way, as shown in FIGS. 35 and 36, the fine objects 520 can be arranged in a predetermined orientation at predetermined positions on the substrate 510.

With IPA used as the fluid 521, the frequency of the AC voltage fed to the first electrode 511 is preferably set to 10 Hz to 1 MHz, more preferably 50 Hz to 1 kHz, which makes the arrangement most stable. Further, the AC voltage to be applied between the first electrode 511 and the second electrode 512 is not limited to sine waves and may be any one that periodically varies such as rectangular waves, triangular waves and sawtooth waves. The AC voltage $V_{PPL}$ (double of amplitude) fed to the first electrode 511 may be 0.1 to 10 V, where voltages lower than 0.1 V result in worse arrangement of the fine objects 520 while voltages higher than 10 V cause the fine objects 520 to be immediately fixed onto the substrate 510 with a result of worse disposition yield. Therefore, the voltage $V_{PPL}$ is preferably set to 1 to 5 V, more preferably to about 1 V.

Next, after completion of the disposition of the fine objects 520 onto the substrate 510, the substrate 510 is heated with the voltage application maintained, so that the liquid 521 is evaporated to fulfill drying, making the fine objects 520 fixed onto the substrate 510. Otherwise, after completion of the disposition of the fine objects 520, a sufficiently high voltage (10 to 100 V) is applied to the first electrode 511 and the second electrode 512 so that the fine objects 520 are fixed onto the substrate 510, and with the voltage application stopped, the substrate 510 is dried.

(Interconnection Step)

In this step, after the fine object disposing step, the fine objects (devices) 520 disposed on the substrate 510 are interconnected. The interconnection step of this embodiment can be fulfilled in the same way as in the foregoing first embodiment. In a later-described twelfth embodiment, a method for fabricating a light emitting apparatus from the state of FIGS. 35 and 36 in this embodiment will be described in detail. In a later-described thirteenth embodiment, a display apparatus that is another application example will be mentioned.

The fine object 520 may be other than a light emitting diode, and may be a diode as an example. This embodiment is effective for cases where the fine objects, for which one end and the other end in the lengthwise direction are specified by different physical properties, need to be disposed with orientation of the one end and the other end specified relative to the substrate 510 as in the case of the fine objects 520.

(Major Effects)

In this embodiment, as to the substrate 510 to be prepared in the substrate preparing step, the first electrode 511 and the second electrode 512 are formed on the substrate 510, and the predetermined positions are defined by the areas where the first electrode 511 and the second electrode 512 face each other. Also, in the fine object disposing step, the voltage is applied between the first electrode 511 and the second electrode 512, by which the fine objects 520 are disposed at the predetermined positions.

With the above constitution, regions where the fine objects 520 are arranged can be freely defined on the substrate 510 by the first electrode 511 and the second electrode 512. With the method of disposing the fine objects 520 on the substrate 510 in the constitution, even when a large number of the fine objects 520 are arranged, time and costs required for the disposing step hardly vary because the large number of areas where the first electrodes 511 and the second electrode 512 face each other, i.e. the facing portions 511A, 512A, have only to be provided. Besides, the method is quite suitable for improving the yield of the disposition of the fine objects 520 because the forces acting between the substrate 510 and the fine objects 520 can be freely changed by regulation of the voltage applied between the first electrode 511 and the second electrodes 512. For instance, the fine objects 520 can be fixed to the substrate 510 by increase in the voltage after the completion of the disposition of the fine objects 520 as described in the first embodiment. Furthermore, the yield of the disposition can be increased because the fine object disposing step can be started by the application of the voltage after sufficient stabilization of the flow of the fluid 521 posterior to the fluid introducing step, for instance.

Also in this embodiment, the alignment structure of the fine object 520 is that the fine object 520 has a ferrite shell 545 that is a magnetized ferromagnetic material. Then, the substrate 510 also has an alignment structure, and the alignment structure of the substrate 510 is that the magnetized ferromagnetic pattern 516 is formed in correspondence to the predetermined positions on the substrate 510.

With the above constitution, orientation of the fine objects 520 in their disposition onto the substrate 510 can effectively be controlled by combinations between the alignment structure (ferrite shell 545) of the fine objects 520 and the alignment structure (ferromagnetic pattern 516) of the substrate 510, thus making it possible to dispose the fine objects 520 at predetermined positions on the substrate 510 in a predetermined orientation with high yield. Also, in the fine object disposing step, there is no need for fluidizing the fluid 521 containing the fine objects 520 relative to the substrate 510 for improvement of the yield in the alignment of the fine objects 520 into the predetermined orientation. Therefore, the fine objects 520 are free from disturbance of their orientation by the flow of the fluid 521, so that the fine objects 520 can be disposed on the substrate 510 in a uniform orientation with quite high yield.

Sixth Embodiment

Next, a sixth embodiment of the invention will be described with reference to FIGS. 37A to 37C. This embodiment differs from the foregoing first to fifth embodiments in that a first electrode and a second electrode are formed on the substrate in the substrate preparing step. That is, in the first to fifth embodiments, a substrate in which the first, second electrodes have previously been formed is prepared in the substrate preparing step. Instead, in this sixth embodiment, a first electrode and a second electrode are formed on the substrate by the substrate preparing step. Therefore, the sixth embodiment will be described mainly about the substrate preparing step.

(Substrate Preparing Step)

In the first to fifth embodiments, for example, a substrate 110 such as shown in FIG. 1, in which the first electrode 111 and the second electrode 112 have been formed on the surface, is prepared. In this embodiment, on the other hand, in the substrate preparing step, not that a substrate on which electrodes have previously been formed is prepared, but that a transparent substrate 610 in which a semiconductor film 619 has been formed on one surface is prepared. Then, light having an incidence region set to a certain pattern is let to be incident on the other surface of the transparent substrate 610 in the substrate preparing step so that a portion of the semiconductor film 619 corresponding to the incidence portion of the light is selectively lowered in resistance while the incidence of the light keeps going on. Then, the semiconductor film 619 selectively set to lower resistance is formed into the first electrode and the second electrode on the substrate 610. The predetermined positions are defined by places where the first electrode and second electrode formed on the substrate 610 face each other. Then, in the fine object disposing step, the voltage is applied between the first electrode and the second electrode, by which the fine objects are disposed at the predetermined positions.

A concrete example in which electrodes are formed in the substrate preparing step will be explained with reference to FIG. 37A to 37C.

First, in this substrate preparing step, a transparent substrate 610 in which an undoped amorphous silicon film 619 is deposited at a thickness of, for example, 300 nm on the surface as shown in FIG. 37A is prepared. Material of the substrate may be glass, transparent resin or the like.

Next, in the fluid introducing step, a fluid 621 containing fine objects 620 is introduced onto the substrate 610 as shown in FIG. 37B. As these fine objects 620 and fluid 621, for example, the fine objects and the fluids described in the foregoing first to fifth embodiments may be adopted.

Next, in the substrate preparing step, light is applied from a light source 655 through a photomask 650 and the transparent substrate 610 to the amorphous silicon layer 619 as shown in FIG. 37C. Since the photomask 650 has a pattern of opaque portions 651 and transparent portions 652 formed therein, a pattern formed on the photomask 650 is transferred as brightnesses and darknesses of light onto the amorphous silicon layer 619. In this case, the amorphous silicon layer 619 holds high resistance at places where no light is applied, but becomes low resistance due to induction of free carriers only at light-applied places. Therefore, a first electrode 611 and a second electrode 612 as substantially lowered-resistance portions are formed within the amorphous silicon layer 619 only while the light keeps applied from the light source 655. These first, second electrodes 611, 612 are formed, for example, into shapes having facing portions similar to those of the first, second electrodes described in the first to fifth embodiments.

Thereafter, an AC voltage is applied to the first electrode 611 and the second electrode 612, by which the fine object disposing step is fulfilled. In this process, the fine object 620 can be disposed in a predetermined orientation at predetermined positions on the substrate 610 by using the alignment structures and the external magnetic fields described in the first to fifth embodiments.

In the above-described one example, the first, second electrodes 611, 612 are formed to the substrate 610 by starting the application of light before introduction of the fluid 621 containing the fine object 620 onto the substrate 610. However, the fluid 621 may of course be introduced onto the substrate 610 after formation of the first, second electrodes 611, 612 on the substrate 610 by light application. That is, the first, second electrodes 611, 612 may be formed on the substrate 610 by applying light at least during the fine object disposing step.

(Major Effects)

In this embodiment, in the substrate preparing step, a transparent substrate 610 in which an amorphous silicon film 619 as a semiconductor film is formed on one surface is prepared, and then in the substrate preparing step, light set to a certain pattern of its incidence region is let to go incident on the other surface of the transparent substrate 610. As a result of this, the amorphous silicon film 619 as the semiconductor film in the light-incidence portion is selectively set to low resistance while the light keeps incident, by which the first electrode 611 and the second electrodes 612 are formed. Then, the predetermined positions are defined by areas where the first electrode 611 and the second electrode 612 face each other. Then in the fine object disposing step, a voltage is applied between the first electrode 611 and the second electrode 612, by which the fine objects 620 are disposed at the predetermined positions.

In the above constitution, there is no need for previously patterning electrodes on the substrate 610, and the semiconductor film (amorphous silicon) 619 may well be deposited on the transparent substrate 610. Thus, the photolithography process and the etching process for patterning of the electrodes are omitted, so that the process is simplified.

Seventh Embodiment

Next, a seventh embodiment of the invention will be described with reference to FIGS. 38 to 44. In this embodiment, not only fine objects 1420 but also a substrate 1410 has an alignment structure, where the orientation of the fine objects 1420 in their disposition onto the substrate 1410 is effectively controlled by combinations between the alignment structure of the fine objects 1420 and the alignment structure of the substrate 1410.

(Substrate Preparing Step)

Figure 38:
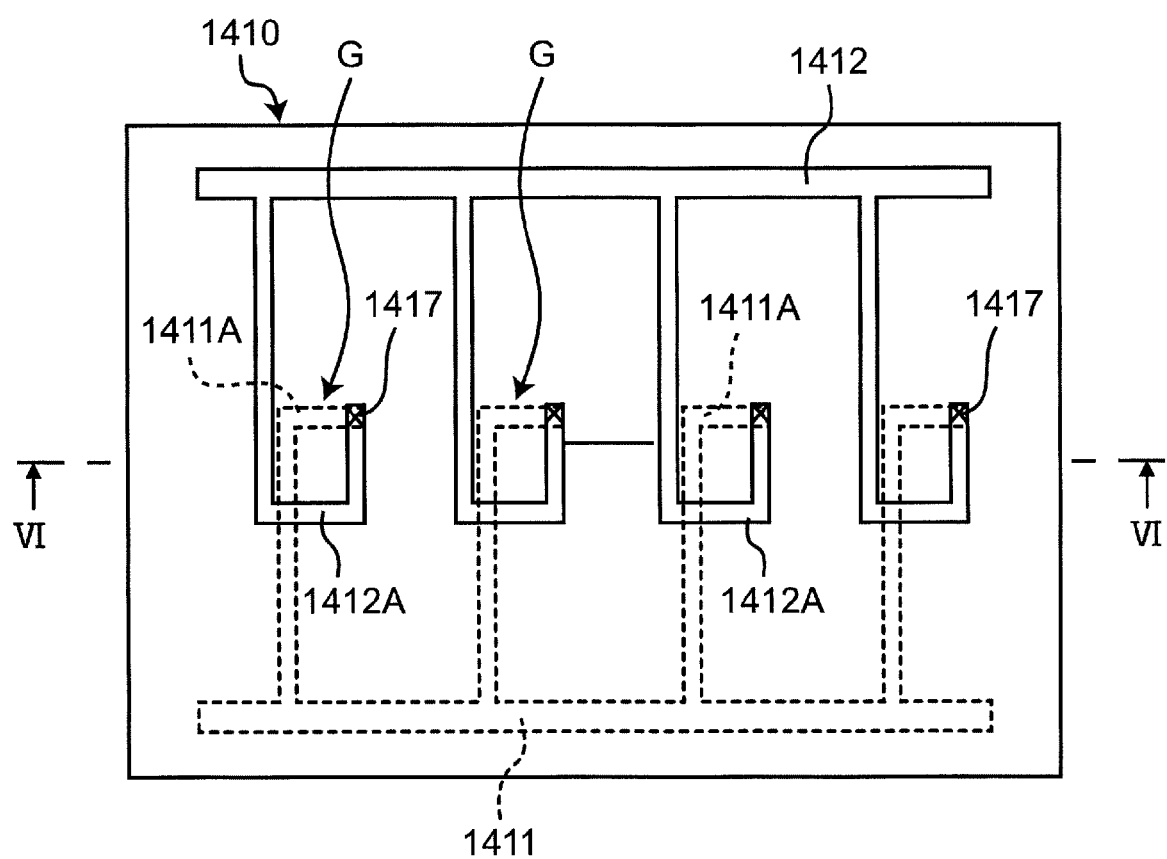
FIG. 38 is a plan view of a substrate prepared in a seventh embodiment of a disposing method for fine objects of the invention.
Figure 41:
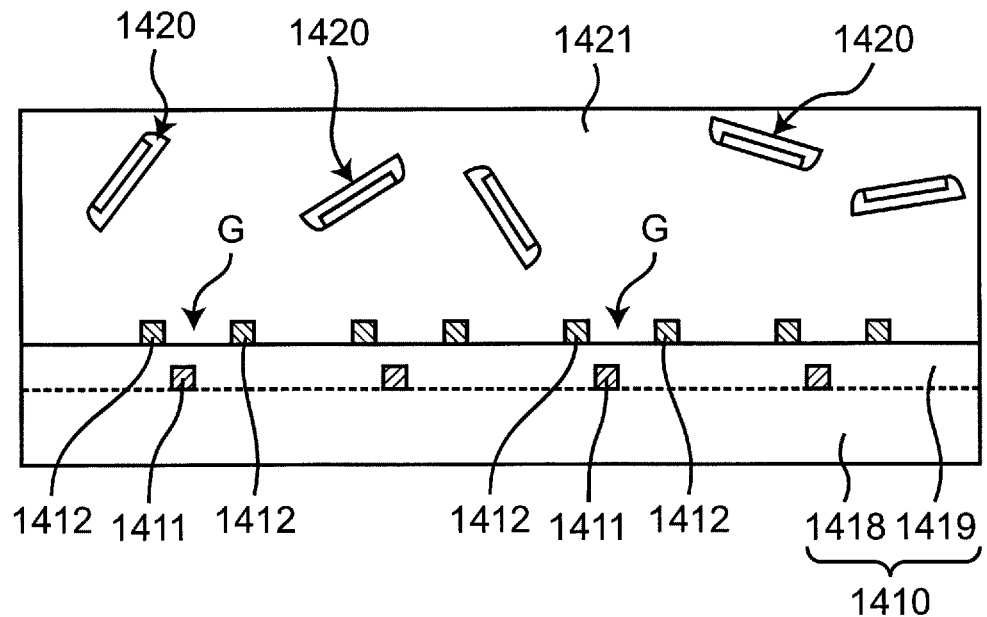
FIG. 41 is a sectional view, taken along the line VI-VI of FIG. 38, showing an aspect that liquid is introduced onto the substrate.

In this step, a substrate 1410 on which a first interconnection 1411 and a second interconnection 1412 are formed as shown in FIG. 38 is prepared. This substrate 1410, the first interconnection 1411 and the second interconnection 1412 have a double-layer interconnection structure as shown in FIG. 41. That is, the substrate 1410 is composed of a substrate base portion 1418 and an interlayer insulating film 1419 formed on the substrate base portion 1418. Then, the first interconnection 1411 is formed on the substrate base portion 1418 so as to be buried under the interlayer insulating film 1419, while the second interconnection 1412 is formed on the interlayer insulating film 1419. The first interconnection 1411 and the second interconnection 1412 are connected to each other by contacts 1417 (FIG. 38) running through the interlayer insulating film 1419. As a result, electric current can be made to flow from the first interconnection 1411 to the second interconnection 1412 and vice versa. In this case, the substrate 1410 is an insulated substrate and the first, second interconnections 1411, 1412 are metal interconnections. Materials of the substrate 1410 and the interconnections 1411, 1412 may be the same as those of the substrate and the electrodes in the first embodiment. As a fabrication method for the substrate and the interconnections, well-known multilayer interconnection techniques for LSIs and TFT substrates may be applied.

A surface of the second interconnection 1412 may be covered with an insulating film, which is not shown. In the later fine object disposing step, electric current flows through the second interconnection 1412 with a liquid introduced onto the substrate 1410, and such a current may cause dissolution of the interconnections due to an electrochemical effect. In this case, covering the surface of the second interconnection 1412 with the insulating film makes it possible to prevent such dissolution of the interconnections. The insulating film that covers the second interconnection 1412 may be given, for example, by using a silicon oxide film or a silicon nitride film. Without coverage of the first, second interconnections 1411, 1412 by such an insulating film, on the other hand, the first, second interconnections 1411, 1412 and the fine objects 1420 can be electrically connected to each other with simplicity, making it easier to utilize the first, second interconnections 1411, 1412 for interconnections of the fine objects 1420.

Bent portions 1411A, 1412A of the first, second interconnections 1411, 1412 form loops in vicinities of contacts 1417 that are connecting portions of those interconnections, and the loops each function as a magnetic field generating portion for generating a magnetic field upon a flow of electric current. Places where the fine objects 1420 are disposed are defined by places G where the coils are formed. That is, in the later-described fine object disposing step, the fine objects 1420 are disposed on the places G where the coils are formed by the first, second interconnections 1411, 1412. In addition, although two-layer interconnections are formed on the substrate 1410 to form a one-turn coil in this embodiment, forming two- or more-turn coils by three or more-layer interconnections makes it possible to generate a stronger magnetic field. Otherwise, forming a film of iron or other high magnetic-permeability materials at places G where the coils are formed on the substrate 1410 also makes it possible to generate a stronger magnetic field.

The substrate 1410 has an alignment structure, and the alignment structure is that the bent portions 1411A, 1412A of the first, second interconnections 1411, 1412 form a coil as a magnetic field generating portion at each place G so that a magnetic field is generated on the place G where a coil is formed by giving a flow of electric current through the first, second interconnections 1411, 1412.

(Fine Objects)

Figure 39:
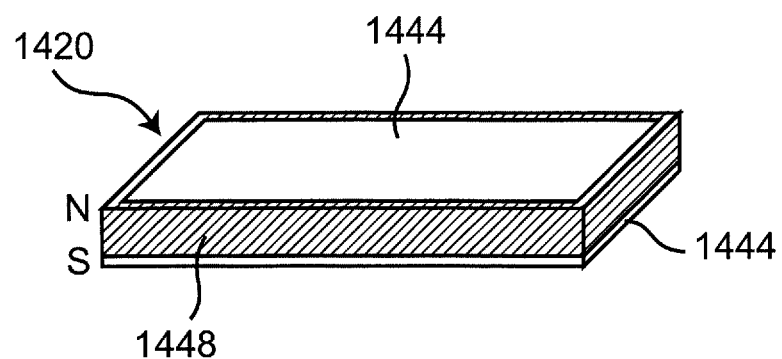
FIG. 39 is a perspective view of a fine object that is disposed in the seventh embodiment.
Figure 40:
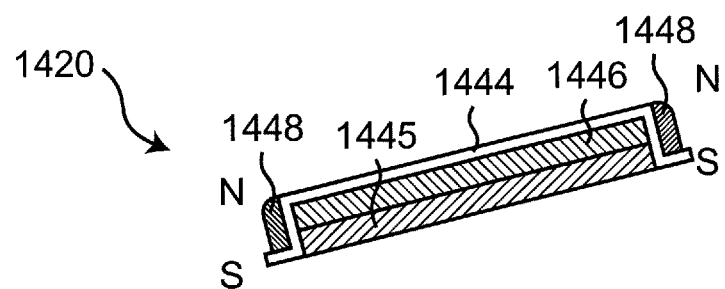
FIG. 40 is a sectional view of the fine object.

Next, fine objects 1420 to be disposed on the substrate 1410 will be described. Each fine object 1420 is the same as the fine object 420 employed in the foregoing fourth embodiment as shown in FIGS. 39 and 40. It is noted that reference sign 1444 denotes a silicon nitride film, 1448 denotes a ferrite layer, 1445 denotes an n-type impurity region, and 1446 denotes a p-type impurity region. The method for fabricating the fine object 1420 may be the same as shown in the fourth embodiment.

This fine object 1420 functions as a pn junction-containing diode. Also, a ferrite layer 1448 is formed on the side face of the fine object 1420 and magnetized along the thicknesswise direction of the fine object 1420. The alignment structure of the fine object 1420 is the ferrite layer 1448, which is a ferromagnetic material magnetized in the thicknesswise direction of the fine object 1420.

The fine object 1420 is a pn junction-containing device (diode), and it is quite important whether the fine object 1420 is disposed on the substrate 1410 with the front side surface positioned on the upper side or with the rear side surface positioned on the upper side, because the device has polarity, and thus it is important to control not only the area for the disposition but also orientation (positions of the front and the rear) thereof.

(Fluid Introducing Step)

In this step, as shown in FIG. 41, a fluid 1421 containing fine objects 1420 is introduced onto the substrate 1410. The fine objects 1420 are dispersed in the fluid 1421. FIG. 41 is a sectional view showing an aspect that the fluid 1421 has been introduced onto the substrate 1410, in a cross section taken along the line VI-VI of FIG. 38.

Liquids such as IPA (isopropyl alcohol), ethanol, methanol, ethylene glycol, propylene glycol, acetone, and water or mixtures thereof can be used as the fluid 1421, whereas the fluid 1421 is not limited thereto. Preferable properties the fluid 421 should have are low viscosity such that the arrangement of the fine objects 1420 is not hindered, and possession of volatility such that the substrate 1410 can be dried after the arrangement of the fine objects 1420.

In addition, although not shown, a cover is preferably provided above the substrate 1410 so as to face the substrate 1410. This cover is set in parallel to the substrate 1410 with a uniform gap (e.g., 500 μm) provided between the substrate 1410 and the cover. The gap is filled with the fluid 1421 containing the fine objects 1420. As a result, it becomes possible to run the fluid into a channel of the gap at a uniform velocity in the subsequent fine object disposing step, thus making it possible to dispose the fine objects 1420 uniformly on the substrate 1410. Moreover, in the subsequent fine object disposing step, evaporation of the fluid 1421 that causes convection can be prevented, so that disturbance of the disposition of the fine objects 1421 can be prevented.

(Fine Object Disposing Step)

Figure 42:
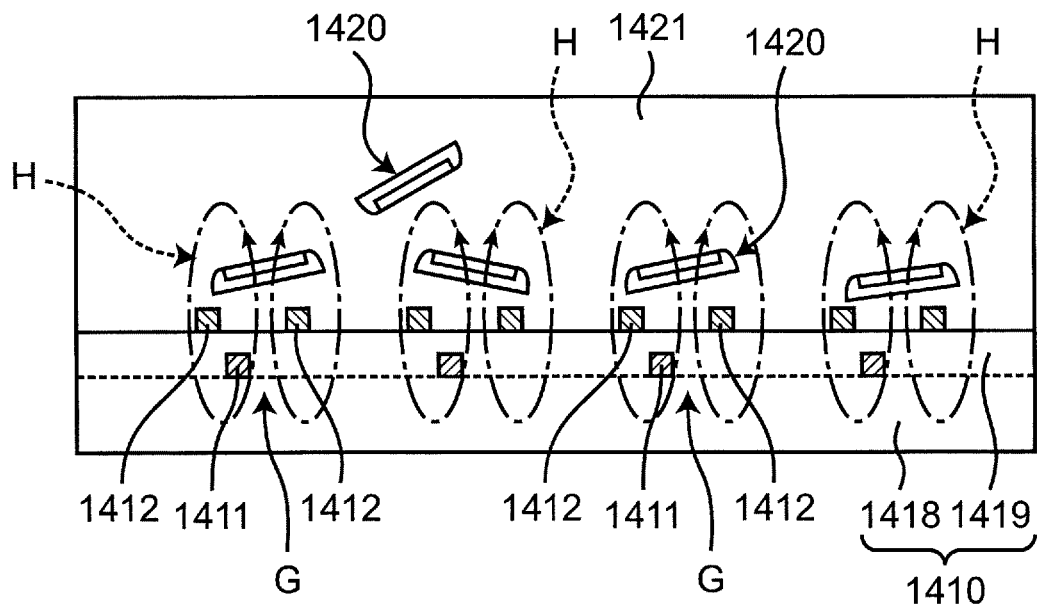
FIG. 42 is a sectional view showing a state in which the fine objects are aligned into a uniform orientation by a magnetic field produced in a fine object disposing step in the seventh embodiment.
Figure 43:
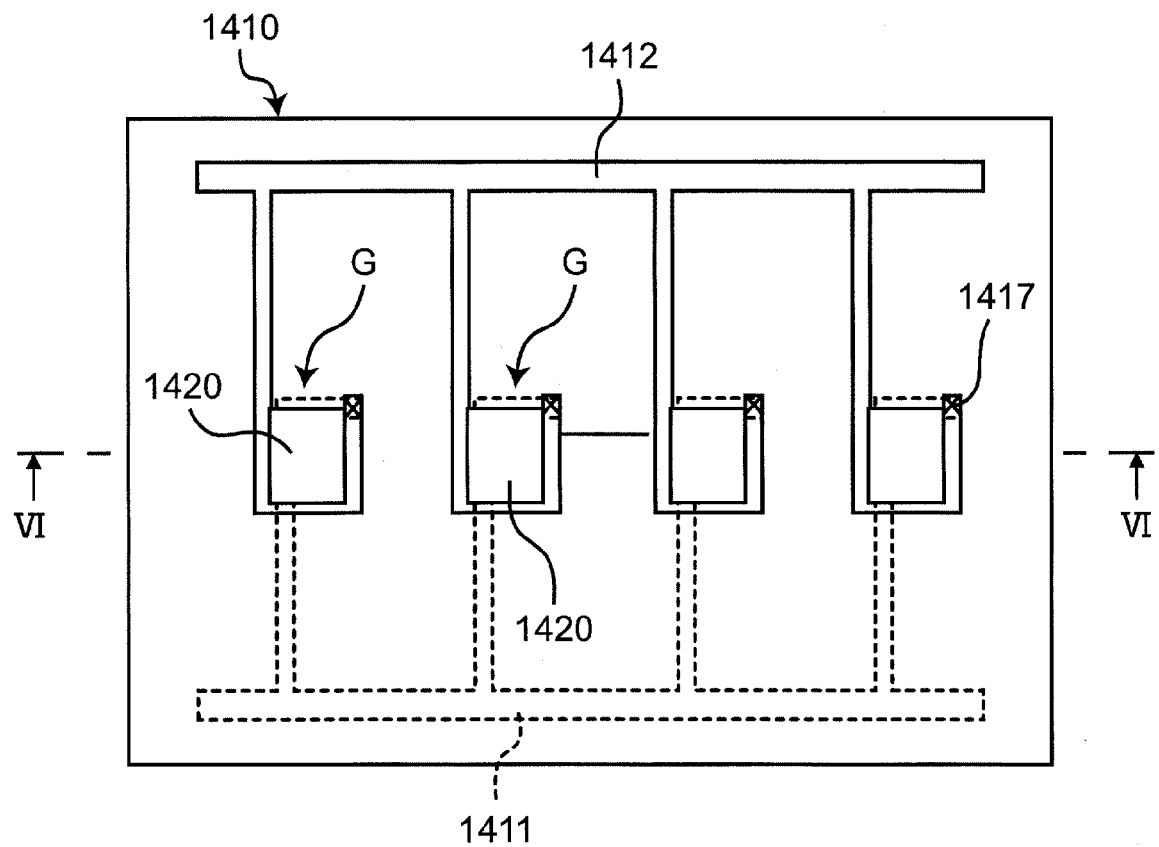
FIG. 43 is a plan view showing a state in which the fine objects are arranged with their orientation uniformized in the fine object disposing step in the seventh embodiment.
Figure 44:
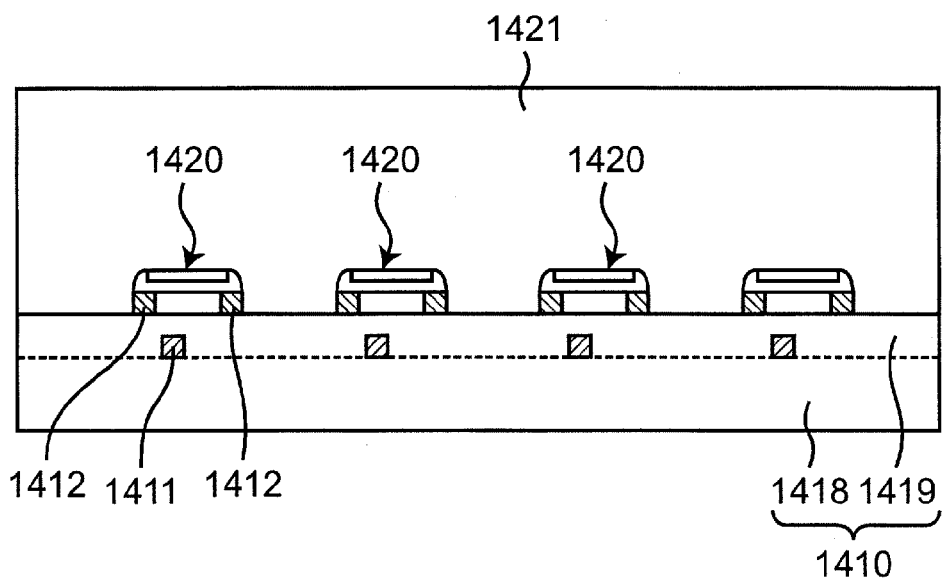
FIG. 44 is a sectional view taken along the line VI-VI of FIG. 43.

In this step, after the fluid introducing step, an electric current is made to flow from the second interconnection 1412 to the first interconnection 1411 to generate a magnetic field H in vicinity of each place G where a coil as a magnetic field generating portion is formed, as shown in FIG. 42. Interaction between this magnetic field H and the magnetized ferrite layer 1448 of the fine object 1420 causes the fine objects 1420 to be disposed in a predetermined orientation at predetermined positions on the substrate 1410 as shown in FIGS. 43 and 44. That is, the fine objects 1420 are disposed in a predetermined front/rear orientation at the places G of the substrate 1410. It is noted that FIG. 44 is a sectional view taken along the line VI-VI of FIG. 43.

In addition, reversing the direction of the electric current flowing through the first interconnection 1411 and the second interconnection 1412 causes the direction of the generated magnetic field to be reversed, so that the fine objects 1420 can be disposed in reversed front/rear orientation.

In this embodiment, by giving flows of currents through coils formed by the first, second interconnections 1411, 1412 formed on the substrate 1410, magnetic fields are generated in vicinities of those coils. Of course, it is also possible that instead of forming such coils on the substrate 1410, island-like ferromagnetic layers are formed on the surface of the substrate 1410 and the fine objects 1420 are disposed in a predetermined orientation at positions where the island-like ferromagnetic layers are formed.

However, the constitution of this embodiment has the following advantages over the case where island-like ferromagnetic layers are simply formed on the substrate. With island-like ferromagnetic layers formed on the substrate, there are normally being generated magnetic fields in vicinities of the ferromagnetic layers. On the other hand, as in this embodiment, with magnetic fields generated by giving flows of currents through the coils formed by the first, second interconnections 1411, 1412, it becomes possible to generate magnetic fields at a desired time in a desired direction and with a desired strength. For example, after the fluid introducing step, on condition that the fine object disposing step is started after the flow of the fluid 1421 is stopped enough or after the flow of the fluid has come to a steady state, it is implementable to improve the disposition yield in this fine object disposing step. Moreover, upon occurrence of failures in the fine object disposing step, it is implementable that the flow of the current through the first, second interconnections 1411, 1412 is once disconnected to dissipate magnetic fields to release the fine objects 1420 and thereafter redo the fine object disposing step.

Next, after completion of the disposition of the fine objects 1420 onto the substrate 1410, the substrate 1410 is heated with the current kept flowing through the first, second interconnections 1411, 1412, so that the liquid 1421 is evaporated to fulfill drying, making the fine objects 1420 fixed onto the substrate 1410.

(Interconnection Step)

In this step, after the fine object disposing step, the fine objects (devices) 1420 disposed on the substrate 1410 are interconnected. The interconnection step of this embodiment can be fulfilled in the same way as in the foregoing first embodiment. Therefore, figures and detailed description of the interconnection step are omitted.

Although the fine objects 1420 that are diode elements have been described above, the fine objects 1420 may be other elements, such as light emitting diodes. The fine objects 1420 may include integrated circuits and may each have two terminals that are to be connected to outside, and the two terminals may be formed on the front side surface and the rear side surface of each fine object 1420. This embodiment is effective on condition that the front side surface and the rear side surface are defined on each of the fine objects 1420 and that the fine objects 1420 are required to be disposed in a specified orientation of the front and rear thereof with respect to the substrate 1410.

(Major Effects)

In this embodiment, as to the substrate 1410 to be prepared in the substrate preparing step, the predetermined positions are defined by places where coils as magnetic field generating portions are formed on the substrate 1410 by the first interconnection 1411 and the second interconnection 1412. Also, in the fine object disposing step, by interaction between magnetic fields generated by flow of currents through the coils and the ferrite layer 1448 that is a magnetized ferromagnetic material included in the fine objects 1420, the fine objects 1420 are disposed at the predetermined positions.

With the above constitution, regions where the fine objects 1420 are arranged can be freely defined on the substrate 1410 by the first, second interconnections 1411, 1412. With the method of disposing the fine objects 1420 on the substrate 1410 in the constitution, even when a large number of the fine objects 1420 are arranged, time and costs required for the fine object disposing step hardly vary because the large number of coils formed by the first interconnection 1411 and the second interconnection 1412 have only to be provided. Besides, the method is quite suitable for improving the yield of the disposition because the forces acting between the substrate 1410 and the fine objects 1420 can be freely changed by regulation of magnitude and direction of the currents flowing through the first interconnection 1411 and the second interconnection 1412. For instance, the fine objects 1420 can be fixed to the substrate 1410 by increase in the currents after the completion of the disposition of the fine objects 1420. Furthermore, the yield of the disposition can be increased because the fine object disposing step can be started by giving the currents after sufficient stabilization of the flow of the fluid posterior to the fluid introducing step, for instance.

Also in this embodiment, the alignment structure of the fine object 1420 is that the fine object 1420 has a magnetized ferromagnetic material (ferrite layer 1448). The substrate 1410 also has an alignment structure, and the alignment structure of the substrate 1410 is that coils capable of generating magnetic fields with flow of currents therethrough are formed on the substrate 1410.

With the above constitution, orientation of the fine objects 1420 in their disposition onto the substrate 1410 can effectively be controlled by combinations between the alignment structure of the fine objects 1420 and the alignment structure of the substrate 1410, thus making it possible to dispose the fine objects 1420 in a predetermined orientation at predetermined positions on the substrate 1410 with high yield.

Eighth Embodiment

Figure 45:
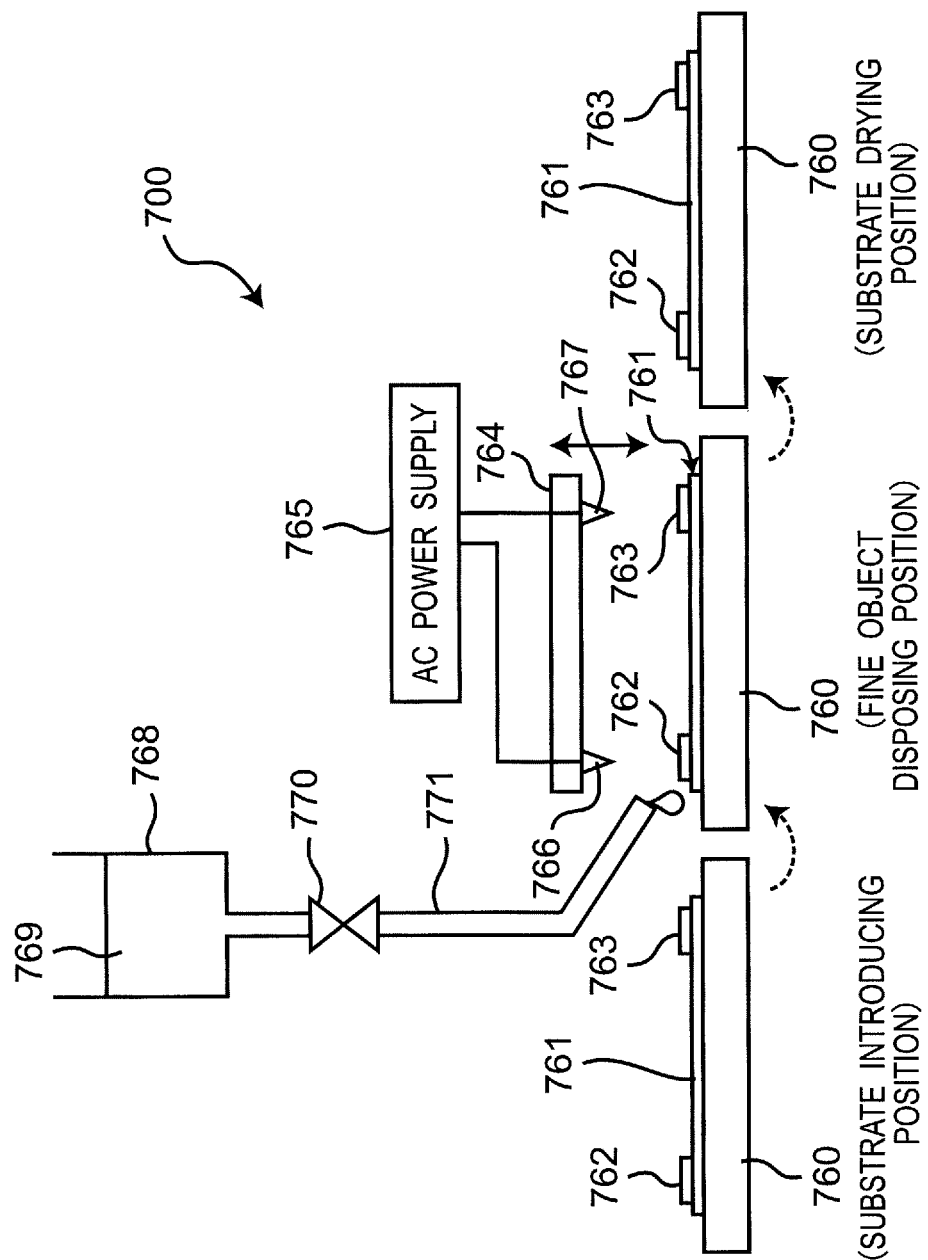
FIG. 45 is a view schematically showing an arranging apparatus 700 of an eighth embodiment of the invention.
Figure 46:
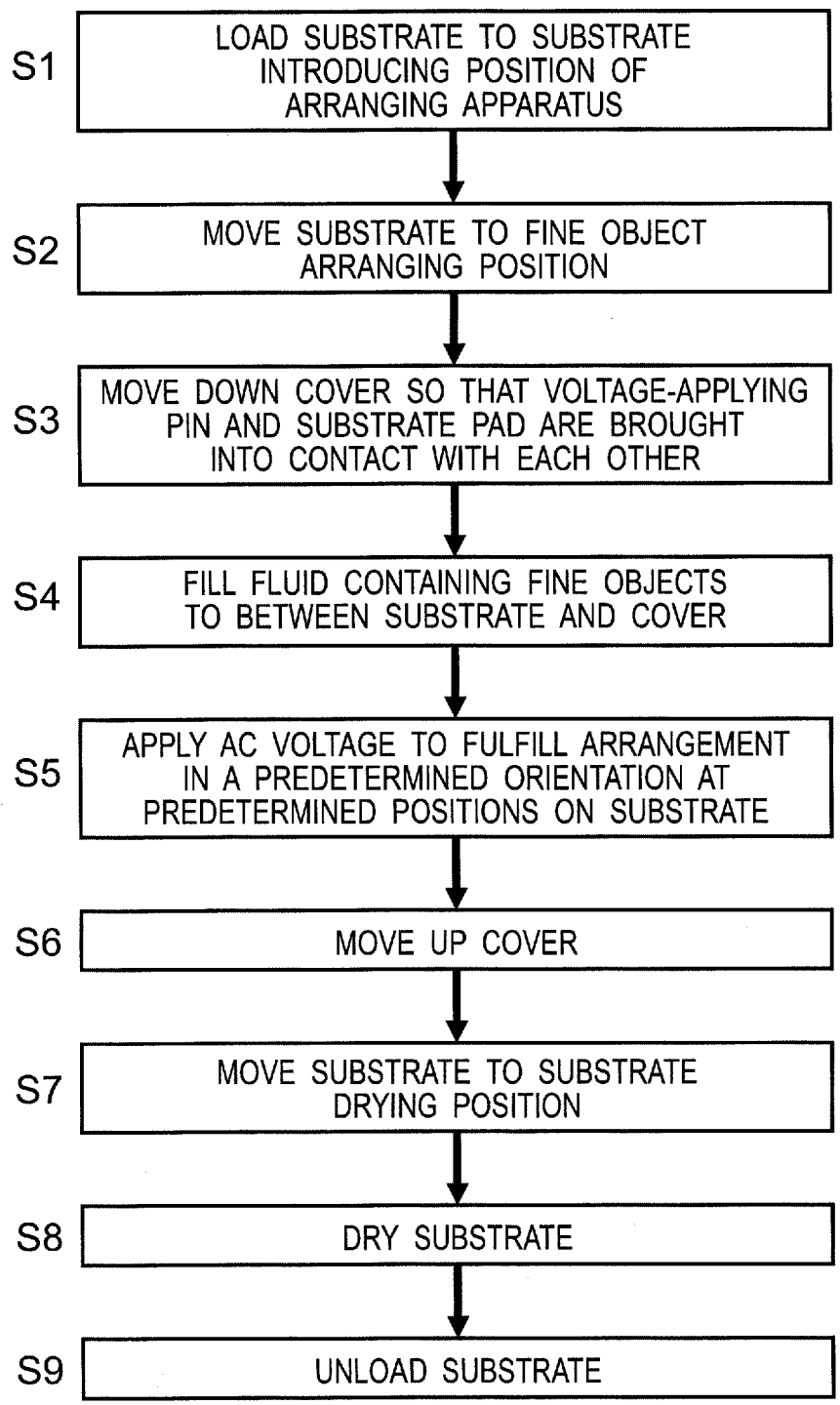
FIG. 46 is a flowchart simply showing procedures through which the arranging apparatus 700 disposes fine objects on a substrate.

Next, an arranging apparatus as an eighth embodiment of the invention will be described. The arranging apparatus 700 of this eighth embodiment relates to an arranging apparatus to be used for disposing the fine objects onto the substrate in the above-described first, second and fifth embodiments. This arranging apparatus is explained with reference to FIGS. 45 and 46. FIG. 45 is a view schematically showing the arranging apparatus 700 of the eighth embodiment, and FIG. 46 is a flowchart simply showing procedures through which the arranging apparatus 700 disposes the fine objects on the substrate.

The arranging apparatus 700, as shown in FIG. 45, includes a holder 760 for placing thereon a substrate 761 on which fine objects are to be disposed. With first, second electrodes (not shown) formed on the substrate 761, a first electrode pad 762 connected to the first electrode and a second electrode pad 763 connected to the second electrode are formed on the substrate 761. Positions where the fine objects are disposed on the substrate 761 are defined by areas (not shown) where a facing portion of the first electrode and a facing portion of the second electrode face each other.

First, the substrate 761 on which the fine objects are to be disposed is placed on the holder 760 in a substrate introducing position shown in FIG. 45 (step S1).

Next, the substrate 761, as it is placed on the holder 760, is conveyed to a fine object disposing position shown in FIG. 45 (step S2). In this state, a cover 764 is moved down to cover the substrate 761 (step S3). The cover 764 is moved up and down by an unshown up/down device.

As shown in FIG. 45, the cover 764 is provided with a first voltage-applying pin 766 and a second voltage-applying pin 767 so that when the cover 764 is moved down to cover the substrate 761, the first voltage-applying pin 766 and the first electrode pad 762 are electrically connected to each other while the second voltage-applying pin 767 and the second electrode pad 763 are electrically connected to each other. The first, second voltage-applying pins 766, 767 are connected to an AC power supply 765. A specified gap (e.g., 500 μm) is provided between the substrate 761 and the cover 764, and the gap serves as a channel through which a fluid containing the fine objects is fed.

In the fine object disposing position shown in FIG. 45, an apparatus for feeding a fluid 769 containing the fine objects is also provided. This feeding apparatus is made up of a reservoir 768, a valve 770 and a tube 771, where the fluid 769 containing fine objects stored in the reservoir 768 is fed to an end of the substrate 761 through the valve 770 by the tube 771 (step S4).

When the channel on the substrate 761 has been filled with the fluid 769 containing the fine objects, an AC voltage is applied from the AC power supply 765 via the first, second voltage-applying pins 766, 767 to the first, second electrodes on the substrate 761, so that the fine objects are disposed in a predetermined orientation at predetermined positions on the substrate 761 (step S5).

Upon completion of the disposition of the fine objects onto the substrate 761 in the way shown above, the application of the AC voltage from the AC power supply 765 is stopped and the cover 764 is moved up, and then the substrate 761 is conveyed to a substrate drying position shown in FIG. 45 (steps S6, S7). In this state, the substrate 761 is dried naturally or dried with heat applied (step S8).

Finally, the substrate 761 is removed from the holder 760 (step S9).

The arranging apparatus 700 actually executes the method for disposing fine objects onto a substrate in this invention. Therefore, according to the arranging apparatus 700, it becomes possible to dispose the fine objects in a predetermined orientation at predetermined positions on the substrate 761, as has been impossible by conventional techniques using dielectrophoresis. Also, in comparison with arranging apparatuses using the conventional common method in which fine objects are grasped with a manipulator or the like and disposed on a substrate, the arranging apparatus 700 of this embodiment has no necessity for sophisticated alignment among the manipulator, the fine objects and the substrate. Thus, according to this embodiment, the fine objects can be arranged on the substrate at lower costs and with simplicity.

On condition that a plurality of fine objects are disposed on the substrate, in particular, superiority of the arranging apparatus 700 of this embodiment to arranging apparatuses employing the conventional common technique using the manipulator or the like is remarkable. For instance, labor of arranging ten fine objects by the manipulator is about ten times as heavy as that of arranging one fine object. By contrast, labor and costs for the arrangement with the arranging apparatus 700 of this embodiment hardly depend on the number of fine objects that are arranged.

Ninth Embodiment

Figure 47:
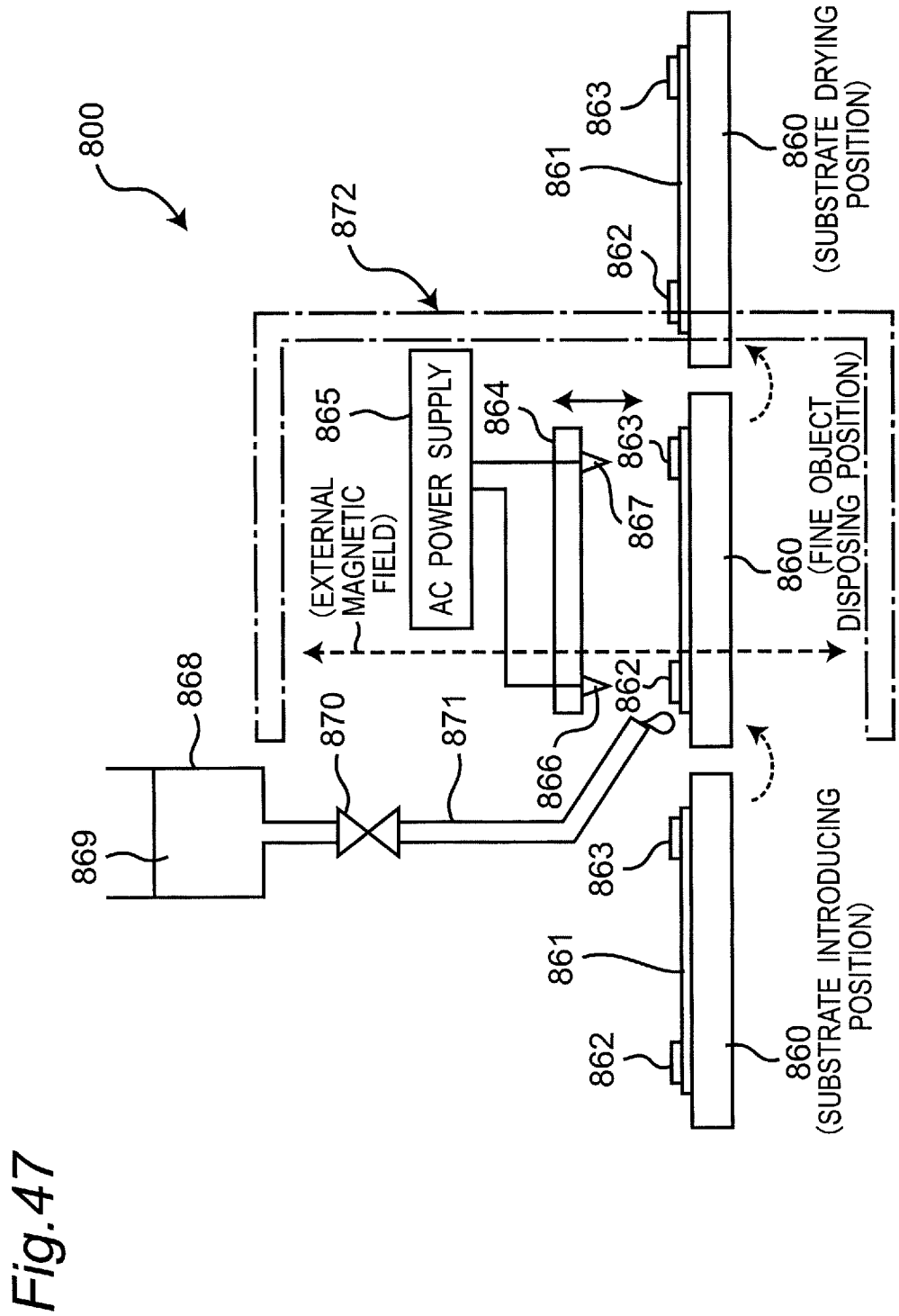
FIG. 47 is a view schematically showing an arranging apparatus 800 of a ninth embodiment of the invention.
Figure 48:
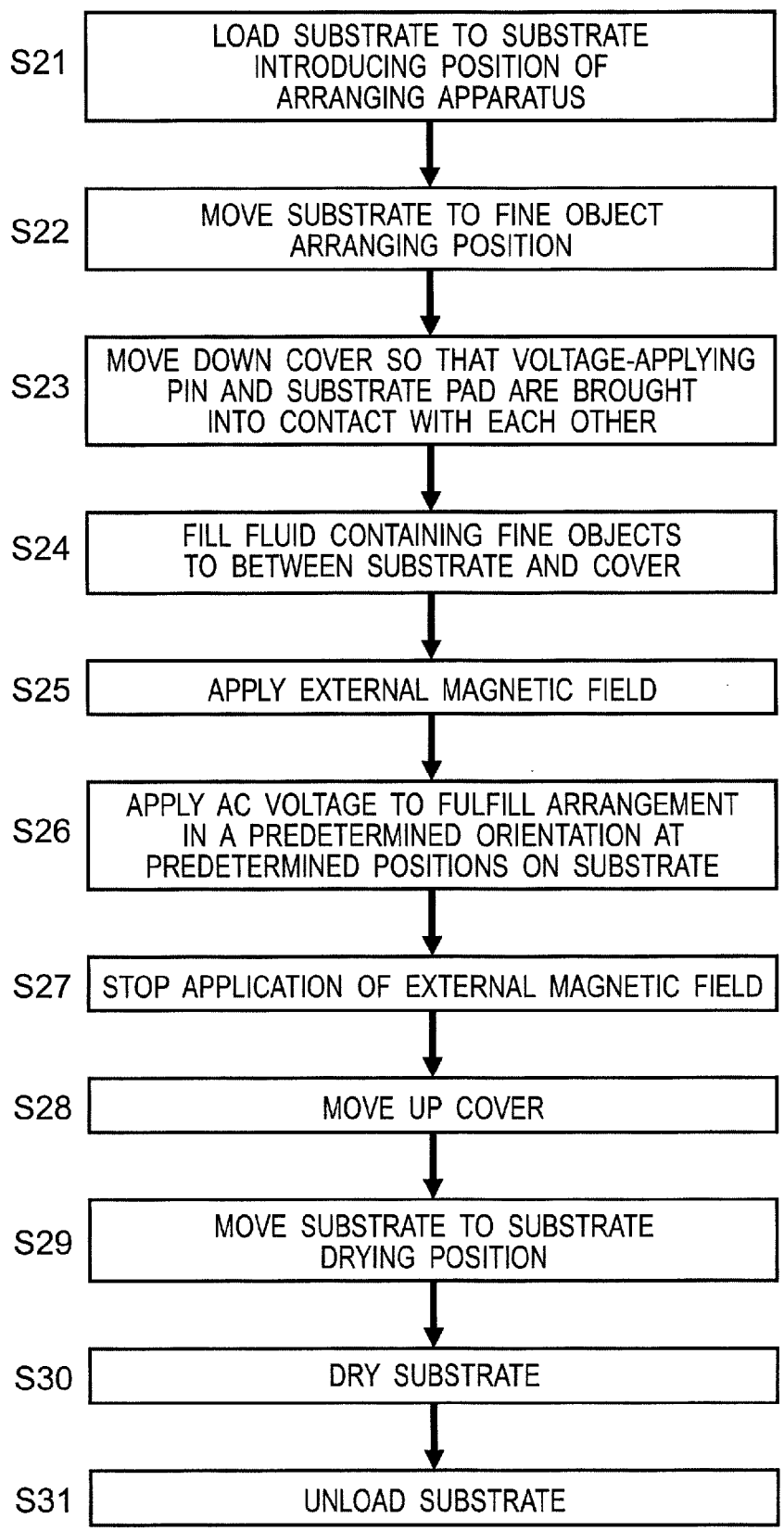
FIG. 48 is a flowchart simply showing procedures through which the arranging apparatus 800 disposes fine objects on a substrate.

Next, an arranging apparatus as a ninth embodiment of the invention will be described. This ninth embodiment relates to an arranging apparatus to be used for disposing the fine objects onto the substrate in the above-described third and fourth embodiments. This arranging apparatus is explained with reference to FIGS. 47 and 48. FIG. 47 is a view schematically showing the arranging apparatus 800 of the ninth embodiment, and FIG. 48 is a flowchart simply showing procedures through which the arranging apparatus 800 disposes the fine objects on the substrate.

The arranging apparatus 800, as shown in FIG. 47, includes a holder 860 for placing thereon a substrate 861 on which fine objects are to be disposed. With first, second electrodes (not shown) formed on the substrate 861, a first electrode pad 862 connected to the first electrode and a second electrode pad 863 connected to the second electrode are formed on the substrate 861. Positions where the fine objects are disposed on the substrate 861 are defined by areas (not shown) where a facing portion of the first electrode and a facing portion of the second electrode face each other.

First, the substrate 861 on which the fine objects are to be disposed is placed on the holder 860 in a substrate introducing position shown in FIG. 47 (step S21).

Next, the substrate 861, as it is placed on the holder 860, is conveyed to a fine object disposing position shown in FIG. 47 (step S22). In this state, a cover 864 is moved down to cover the substrate 861 (step S23). The cover 864 is moved up and down by an unshown up/down device.

As shown in FIG. 47, the cover 864 is provided with a first voltage-applying pin 866 and a second voltage-applying pin 867 so that when the cover 864 covers the substrate 861, the first voltage-applying pin 866 and the first electrode pad 862 are electrically connected to each other while the second voltage-applying pin 867 and the second electrode pad 863 are electrically connected to each other. The first, second voltage-applying pins 866, 867 are connected to an AC power supply 865. A specified gap (e.g., 500 μm) is provided between the substrate 861 and the cover 864, and the gap serves as a channel through which a fluid containing the fine objects is fed.

In the fine object disposing position shown in FIG. 47, an apparatus for feeding a fluid 869 containing the fine objects is also provided. This feeding apparatus is made up of a reservoir 868, a valve 870 and a tube 871, where the fluid 869 containing fine objects stored in the reservoir 868 is fed to an end of the substrate 861 through the valve 870 by the tube 871 (step S24). In the fine object disposing position, an external magnetic field applying apparatus 872 is further provided.

When the channel on the substrate 861 has been filled with the fluid 869 containing the fine objects, an external magnetic field is generated by the external magnetic field applying apparatus 872 so that the fine objects including magnetized ferromagnetic material are uniformized in their orientation (step S25). Thereafter, an AC voltage is applied from the AC power supply 865 via the first, second voltage-applying pins 866, 867 to the first, second electrodes on the substrate 861, so that the fine objects are disposed in a predetermined orientation at predetermined positions on the substrate 861 (step S26).

Upon completion of the disposition of the fine objects onto the substrate 861 in the way shown above, the application of the AC voltage from the AC power supply 865 is stopped, moreover the generation of an external magnetic field from the external magnetic field applying apparatus 872 is stopped (step S27), the cover 864 is moved up (step S28), and the substrate 861 is conveyed to a substrate drying position shown in FIG. 47 (step S29). In this state, the substrate 861 is dried naturally or dried with heat applied (step S30).

Finally, the substrate 861 is removed from the holder 860 (step S31).

The arranging apparatus 800 actually executes the method for disposing fine objects onto a substrate in this invention. Therefore, according to the arranging apparatus 800, it becomes possible to dispose the fine objects in a predetermined orientation at predetermined positions on the substrate 861, as has been impossible by conventional techniques using dielectrophoresis. Also, in comparison with arranging apparatuses using the conventional common method in which fine objects are grasped with a manipulator or the like and disposed on a substrate, the arranging apparatus 800 of this embodiment has no necessity for sophisticated alignment among the manipulator, the fine objects and the substrate. Thus, according to this embodiment, the fine objects can be arranged on the substrate at lower costs and with simplicity.

On condition that a plurality of fine objects are disposed on the substrate, in particular, superiority of the arranging apparatus 800 of this embodiment to arranging apparatuses employing the conventional common technique using the manipulator or the like is remarkable. For instance, labor of arranging ten fine objects by the manipulator is about ten times as heavy as that of arranging one fine object. By contrast, labor and costs for the arrangement with the arranging apparatus 800 of this embodiment hardly depend on the number of fine objects that are arranged.

Tenth Embodiment

Figure 49:
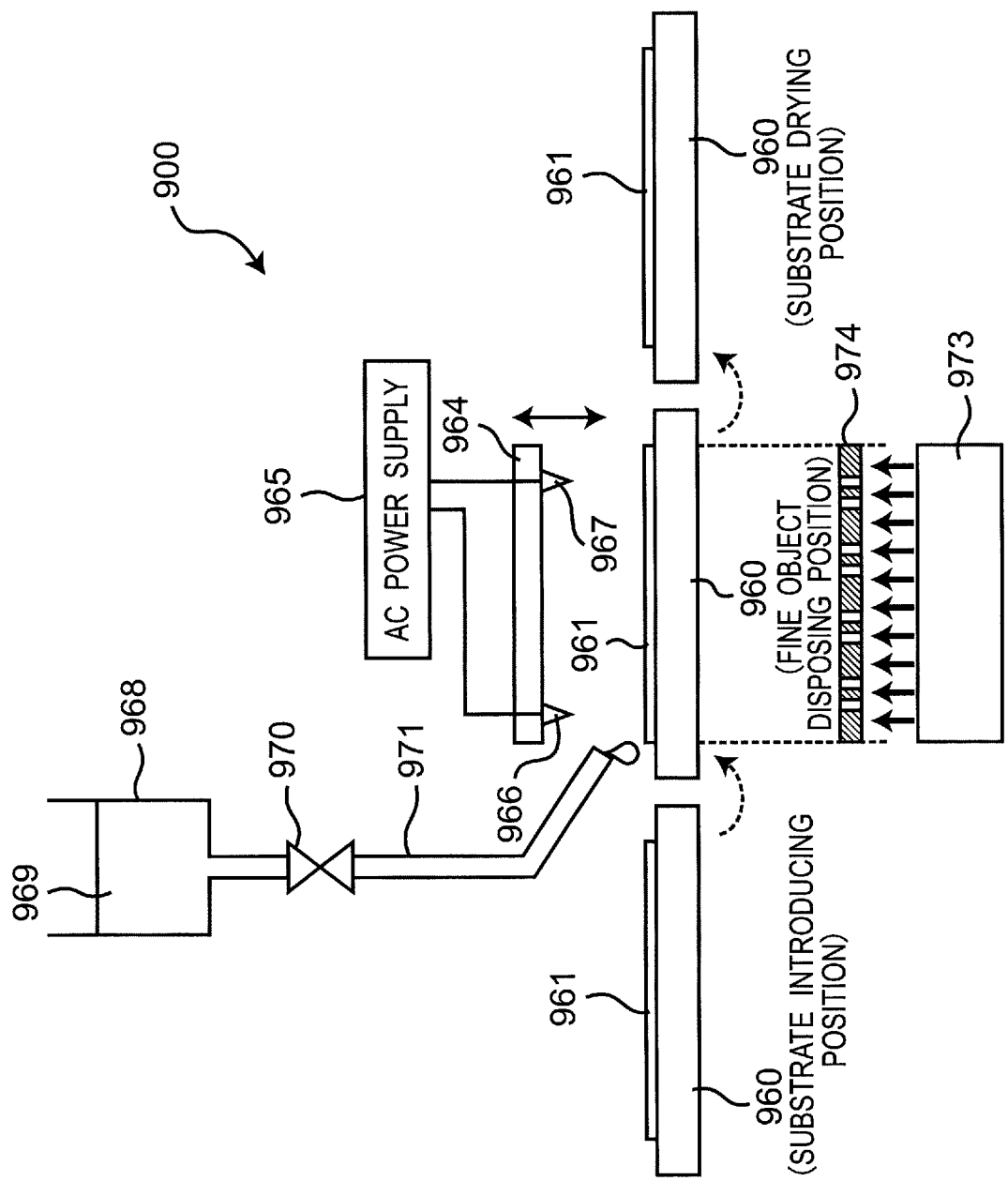
FIG. 49 is a view schematically showing an arranging apparatus 900 of a tenth embodiment of the invention.
Figure 50:
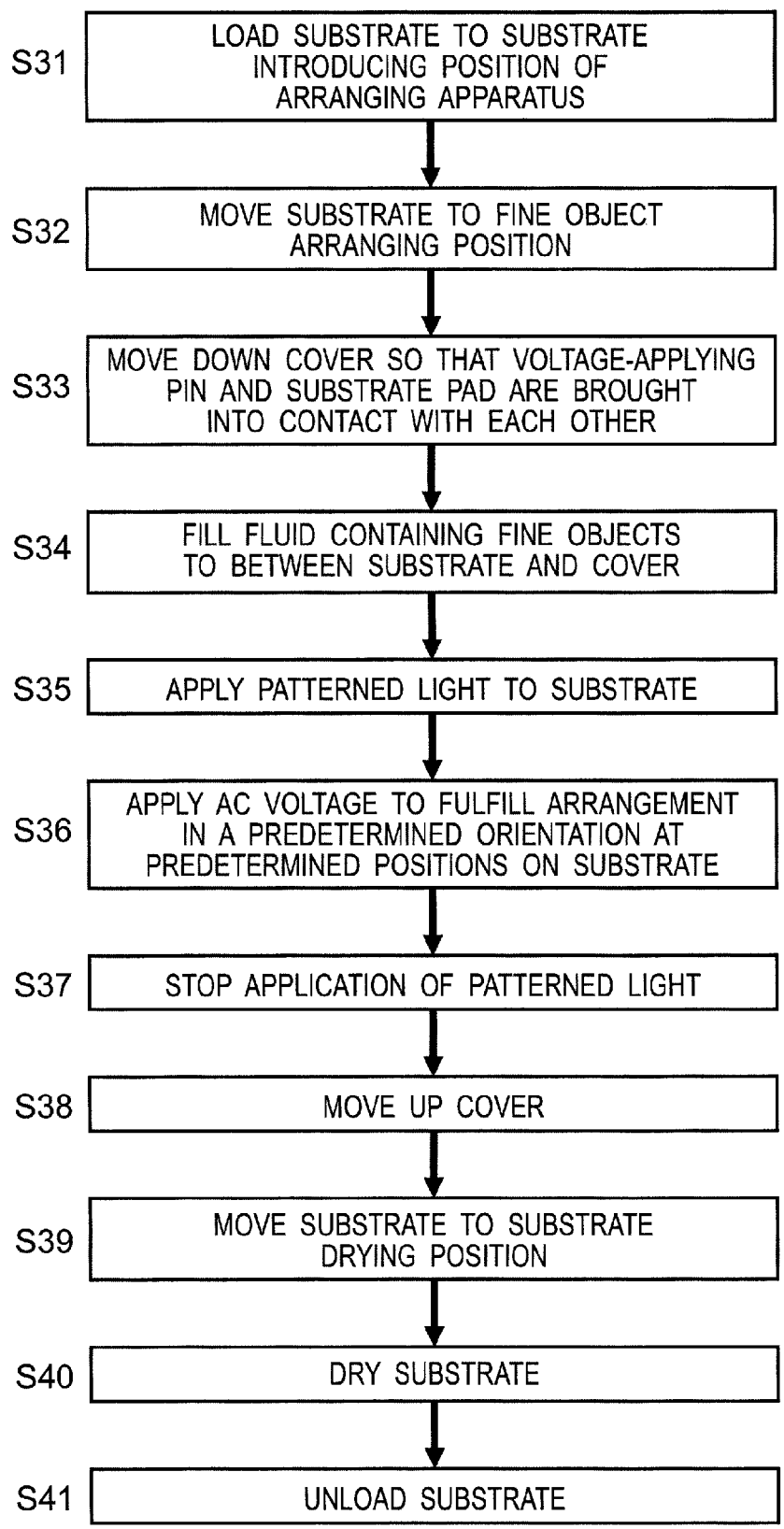
FIG. 50 is a flowchart simply showing procedures through which the arranging apparatus 900 disposes fine objects on a substrate.

Next, an arranging apparatus as a tenth embodiment of the invention will be described. This tenth embodiment relates to an arranging apparatus to be used for disposing the fine objects onto the substrate in the above-described sixth embodiment. This arranging apparatus is explained with reference to FIGS. 49 and 50. FIG. 49 is a view schematically showing the arranging apparatus 900 of the tenth embodiment, and FIG. 50 is a flowchart simply showing procedures through which the arranging apparatus 900 disposes the fine objects on the substrate. In addition, in the arranging apparatus 900 of this tenth embodiment, on condition that the external magnetic field applying apparatus 872 explained in the foregoing ninth embodiment is further included, the apparatus can be used also in the foregoing third and fourth embodiments with use of the substrate preparing step described in the sixth embodiment.

The arranging apparatus 900, as shown in FIG. 49, includes a holder 960 for placing thereon a transparent substrate 961 on which fine objects are to be disposed. Amorphous silicon is deposited on an overall surface of the substrate 961.

First, the substrate 961 on which the fine objects are to be disposed is placed on the holder 960 in a substrate introducing position shown in FIG. 49 (step S31).

Next, the substrate 961 is conveyed to a fine object disposing position shown in FIG. 49 (step S32). In this state, a cover 964 is moved down to cover the substrate 961 (step S33). The cover 964 is moved up and down by an unshown up/down device.

A specified gap (e.g., 500 μm) is provided between the substrate 961 and the cover 964, and the gap serves as a channel through which a fluid containing the fine objects is fed.

In the fine object disposing position, an apparatus for feeding a fluid 969 containing the fine objects is also provided. This feeding apparatus is made up of a reservoir 968, a valve 970 and a tube 971, where the fluid 969 containing fine objects stored in the reservoir 968 is fed to an end of the substrate 961 through the valve 970 by the tube 971 (step S34). In this embodiment, in the fine object disposing position, a light source 973 and a photomask 974 are further provided.

When the channel on the substrate 961 has been filled with the fluid 969 containing the fine objects, light having patterned illuminated regions is applied from the light source 973 through the photomask 974 to the transparent substrate 961 having the amorphous silicon layer (step S35). As a result, a first electrode and a second electrode are formed in the regions of the amorphous silicon layer lowered in resistance to correspondence to the patterned illuminated regions on the substrate 961. Then, facing portions of the first, second electrodes (not shown) define positions where the fine objects are disposed.

The cover 964 is provided with a first voltage-applying pin 966 and a second voltage-applying pin 967, and the first, second voltage-applying pins 966, 967 are brought into contact with the first electrode and second electrode (lowered-in-resistance amorphous silicon layer) formed by the patterned light-illuminated regions. As a result, the AC power supply 965 is electrically connected to the first, second electrodes formed on the substrate 961 via the first, second voltage-applying pins 966, 967. Thereafter, the AC voltage is applied from the AC power supply 965 via the first, second voltage-applying pins 966, 967 to the first, second electrodes on the substrate 961, so that the fine objects are disposed in a predetermined orientation at predetermined positions on the substrate 961 (step S36).

Upon completion of the disposition of the fine objects onto the substrate 961 in the way shown above, the application of the AC voltage from the AC power supply 965 is stopped, moreover the illumination of light from the light source 973 is stopped (step S37), the cover 964 is moved up (step S38), and the substrate 961 is conveyed to a substrate drying position (step S39). In this state, the substrate 961 is dried naturally or dried with heat applied (step S40).

Finally, the substrate 961 is removed from the holder 960 (step S41).

The arranging apparatus 900 actually executes the method for disposing fine objects onto a substrate in this invention. Therefore, according to the arranging apparatus 900, it becomes possible to dispose the fine objects in a predetermined orientation at predetermined positions on the substrate 961, as has been impossible by conventional techniques using dielectrophoresis. Also, in comparison with arranging apparatuses using the conventional common method in which fine objects are grasped with a manipulator or the like and disposed on a substrate, this arranging apparatus 900 has no necessity for sophisticated alignment among the manipulator, the fine objects and the substrate, making it possible to achieve the arrangement at lower costs and with simplicity.

On condition that a plurality of fine objects are disposed on the substrate, in particular, superiority of this arranging apparatus 900 to arranging apparatuses employing the conventional common technique using the manipulator or the like is remarkable. For instance, labor of arranging ten fine objects by the manipulator is about ten times as heavy as that of arranging one fine object. By contrast, labor and costs for the arrangement with the arranging apparatus 900 of this embodiment hardly depend on the number of fine objects that are arranged.

Eleventh Embodiment

Figure 51:
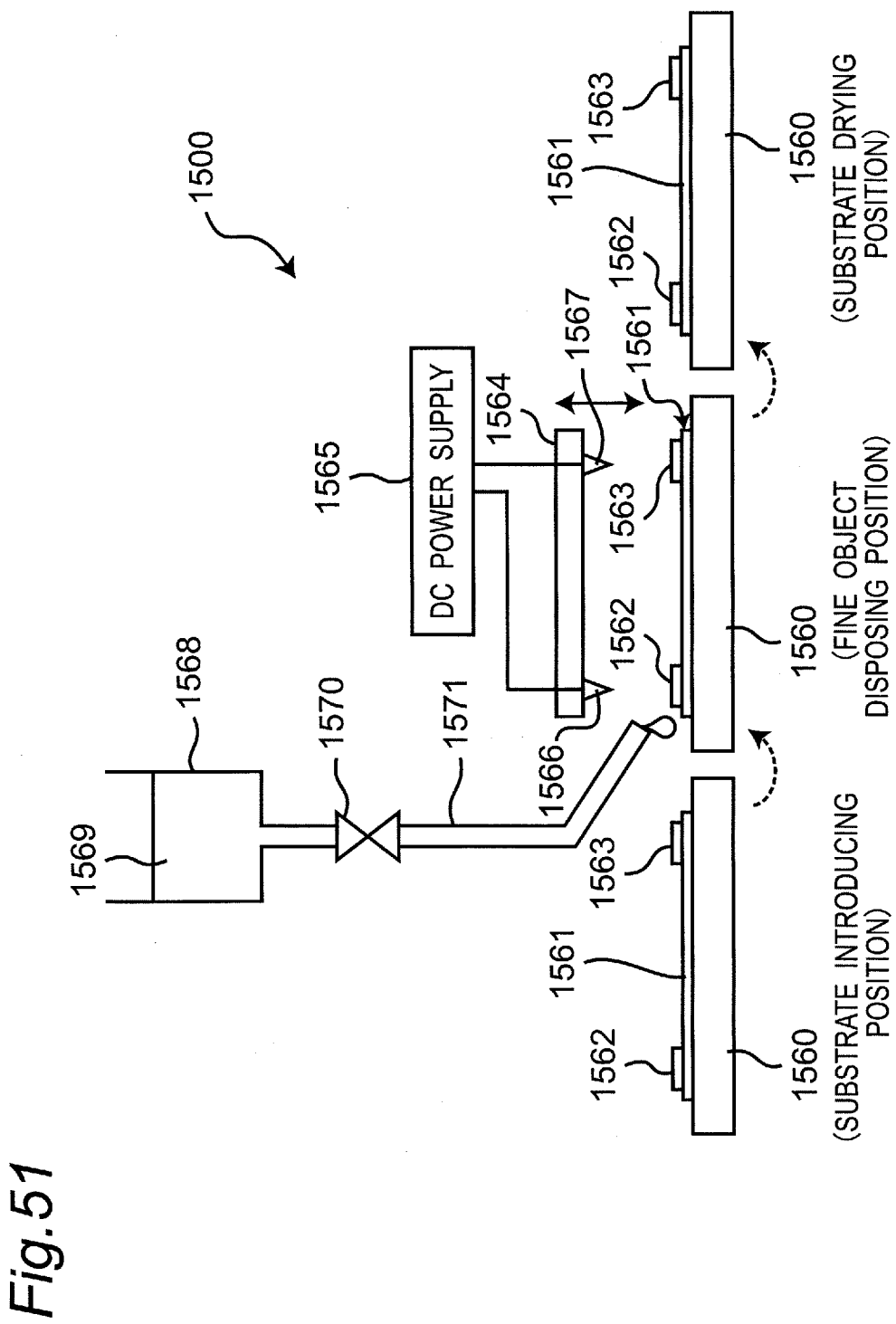
FIG. 51 is a view schematically showing an arranging apparatus 1500 of an eleventh embodiment of the invention.

Next, an arranging apparatus as an eleventh embodiment of the invention will be described. The arranging apparatus 1500 of this eleventh embodiment relates to an arranging apparatus to be used for disposing the fine objects onto the substrate in the above-described seventh embodiment. This arranging apparatus is explained with reference to FIG. 51. FIG. 51 is a view schematically showing the arranging apparatus 1500 of the eleventh embodiment.

The arranging apparatus 1500, as shown in FIG. 51, includes a holder 1560 for placing thereon a substrate 1561 on which fine objects are to be disposed. With first, second interconnections (not shown) formed on the substrate 1561, a first electrode pad 1562 connected to the first interconnection and a second electrode pad 1563 connected to the second interconnection are formed on the substrate 1561. Positions where the fine objects are disposed on the substrate 1561 are defined by coils (not shown) where the bent portion of the first interconnect and the bent portion of the second interconnection are connected with the contact.

First, the substrate 1561 on which the fine objects are to be disposed is placed on the holder 1560 in a substrate introducing position shown in FIG. 51.

Next, the substrate 1561, as it is placed on the holder 1560, is conveyed to a fine object disposing position shown in FIG. 51. In this state, a cover 1564 is moved down to cover the substrate 1561. The cover 1564 is moved up and down by an unshown up/down device.

As shown in FIG. 51, the cover 1564 is provided with a first voltage-applying pin 1566 and a second voltage-applying pin 1567 so that when the cover 1564 is moved down to cover the substrate 1561, the first voltage-applying pin 1566 and the first electrode pad 1562 are electrically connected to each other while the second voltage-applying pin 1567 and the second electrode pad 1563 are electrically connected to each other. The first, second voltage-applying pins 1566, 1567 are connected to a DC power supply 1565. A specified gap (e.g., 500 µm) is provided between the substrate 1561 and the cover 1564, and the gap serves as a channel through which a fluid containing the fine objects is fed.

In the fine object disposing position shown in FIG. 51, an apparatus for feeding a fluid 1569 containing the fine objects is also provided. This feeding apparatus is made up of a reservoir 1568, a valve 1570 and a tube 1571, where the fluid 1569 containing fine objects stored in the reservoir 1568 is fed to an end of the substrate 1561 through the valve 1570 by the tube 1571.

When the channel on the substrate 1561 has been filled with the fluid 1569 containing the fine objects, a DC voltage is applied from the DC power supply 1565 via the first, second voltage-applying pins 1566, 1567 to the first, second interconnections on the substrate 1561, and magnetic fields are generated by the coils, so that the fine objects are disposed in a predetermined orientation at predetermined positions on the substrate 1561.

Upon completion of the disposition of the fine objects onto the substrate 1561 in the way shown above, the application of the DC voltage from the DC power supply 1565 is stopped, the cover 1564 is moved up, and the substrate 1561 is conveyed to a substrate drying position shown in FIG. 51. In this state, the substrate 1561 is dried naturally or dried with heat applied.

Finally, the substrate 1561 is removed from the holder 1560.

The arranging apparatus 1500 actually executes the method for disposing fine objects onto a substrate in this invention. Therefore, according to the arranging apparatus 1500, it becomes possible to dispose the fine objects in a predetermined orientation at predetermined positions on the substrate 1561, as has been impossible by conventional techniques using dielectrophoresis. Also, in comparison with arranging apparatuses using the conventional common method in which fine objects are grasped with a manipulator or the like and disposed on a substrate, the arranging apparatus 1500 of this embodiment has no necessity for sophisticated alignment among the manipulator, the fine objects and the substrate. Thus, according to this embodiment, the fine objects can be arranged on the substrate at lower costs and with simplicity.

On condition that a plurality of fine objects are disposed on the substrate, in particular, superiority of the arranging apparatus 1500 of this embodiment to arranging apparatuses employing the conventional common technique using the manipulator or the like is remarkable. For instance, labor of arranging ten fine objects by the manipulator is about ten times as heavy as that of arranging one fine object. By contrast, labor and costs for the arrangement with the arranging apparatus 1500 of this embodiment hardly depend on the number of fine objects that are arranged.

Twelfth Embodiment

Next, an illuminating apparatus as a twelfth embodiment of the invention will be described. This twelfth embodiment relates to an illuminating apparatus fabricated by using the above-described method for disposing fine objects onto a substrate (first to seventh embodiments) or the arranging apparatus (eighth to eleventh embodiments), and is described below with reference to FIGS. 52 to 56.

Figure 52:
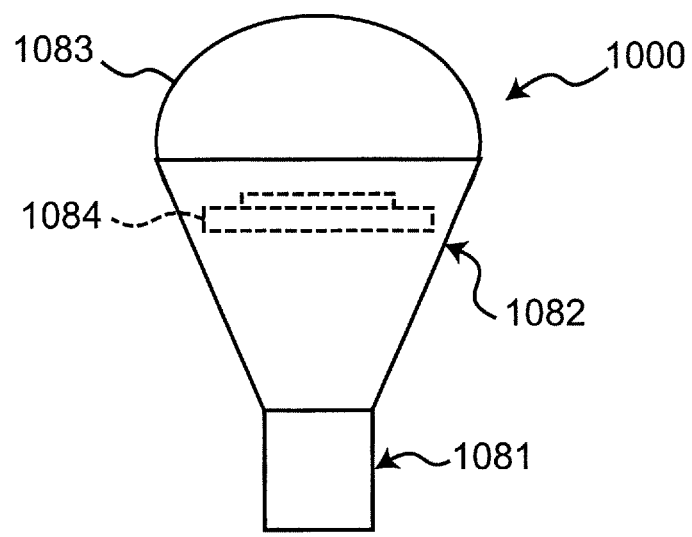
FIG. 52 is a side view of an LED bulb 1000 that is an illuminating apparatus of a twelfth embodiment of the invention.

FIG. 52 is a side view of an LED bulb 1000 that is an illuminating apparatus of this embodiment. The LED bulb 1000 includes a ferrule 1081 serving as a power-line connecting portion to be fitted to an external socket to make connection with a commercial power supply, a heat radiating portion 1082 of a conical shape whose one end is connected to the ferrule 1081 while the other end gradually increases in diameter, and a light-pervious portion 1083 covering the other end side of the heat radiating portion 1082. A light emitting device 1084 is placed within the heat radiating portion 1082.

Figure 53:
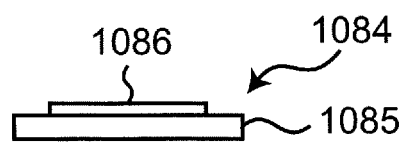
FIG. 53 is a side view of a light emitting device 1084 included in the LED bulb 1000.
Figure 54:
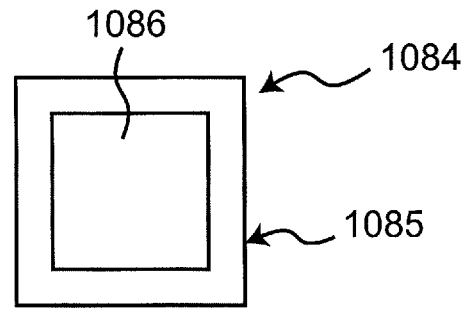
FIG. 54 is a plan view of the light emitting device 1084.

In the light emitting device 1084, as shown in FIG. 53 (side view) and FIG. 54 (top view), a light emitting substrate 1086 with a multiplicity of light emitting elements disposed thereon is mounted on the square-shaped heat radiating plate 1085.

Figure 55:
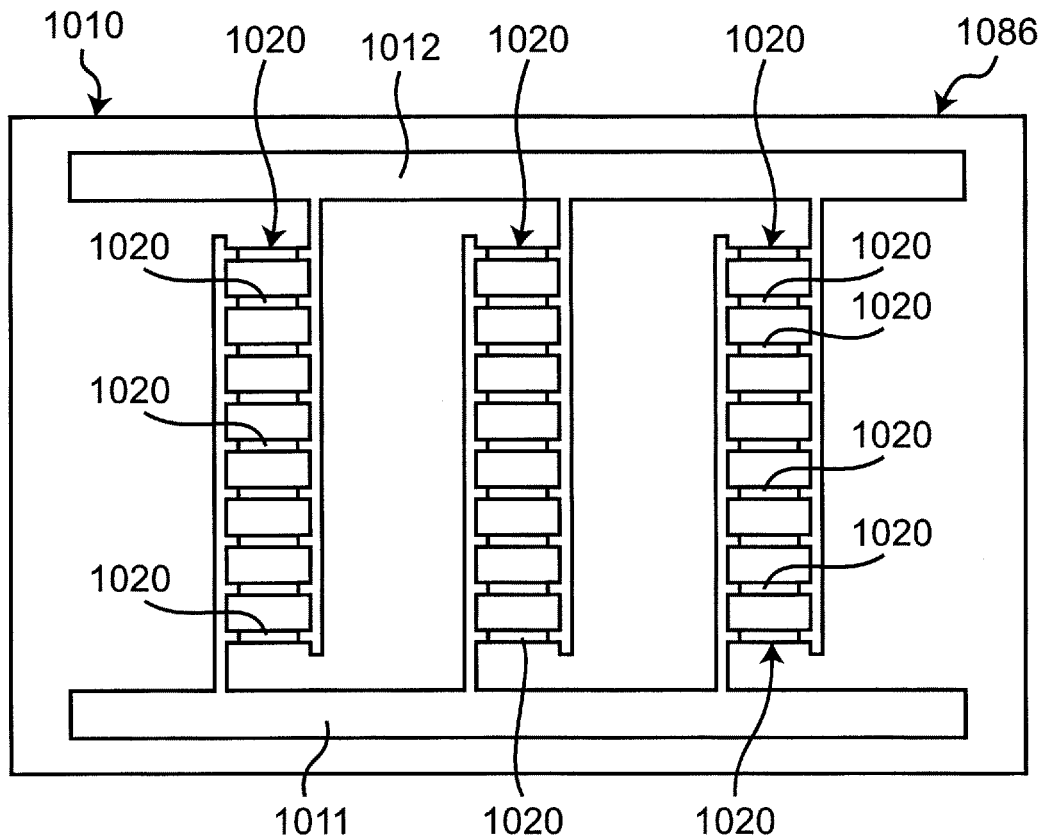
FIG. 55 is a plan view of a light emitting substrate 1086 of the light emitting device 1084.

The light emitting substrate 1086, as shown in FIG. 55, is made up of a substrate 1010, a first electrode 1011 and a second electrode 1012 formed on the substrate 1010, and a multiplicity of fine light emitting diodes 1020. The method for disposing the fine light emitting diodes 1020 onto the substrate 1010 may be given by the method described in the foregoing third embodiment or fifth embodiment.

Although 27 fine light emitting diodes 1020 are depicted in FIG. 55, a very large number of fine light emitting diodes 1020 may be disposed on the substrate. For example, as to the size of one light emitting diode, assuming that the fine objects 320 and the fine objects 520 shown as examples in the third embodiment and the fifth embodiment each have a length of 20 µm and a diameter of 1 µm, it is allowable to dispose 50,000 fine light emitting diodes, where one light emitting diode emits a 5-millilumen pencil of light, so that a light emitting substrate capable of emitting a totally 250-lumen pencil of light can be provided.

Figure 56:
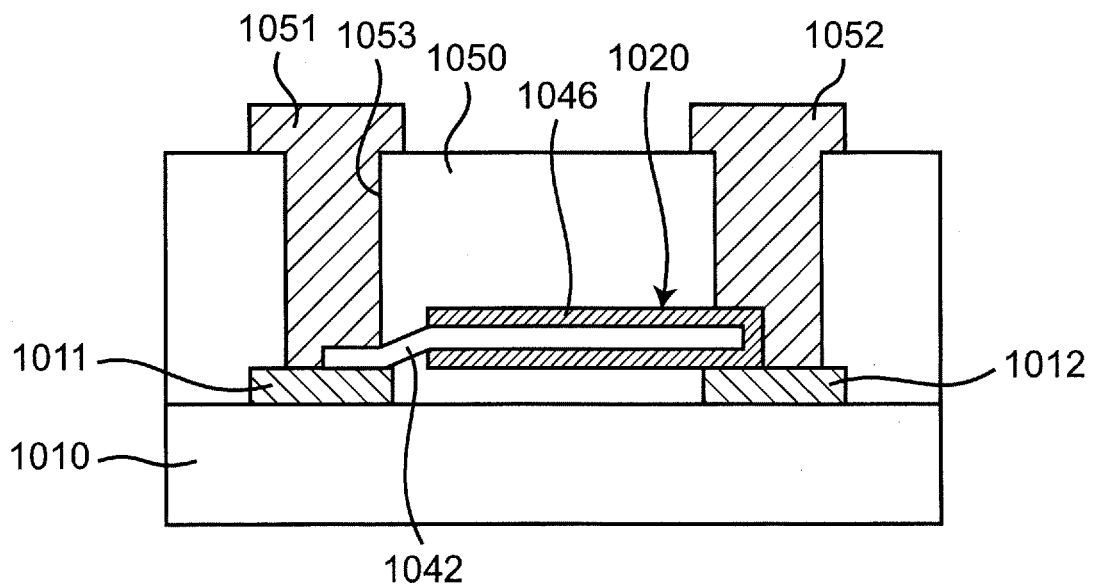
FIG. 56 is an enlarged sectional view of the light emitting substrate 1086.

FIG. 56 is an enlarged sectional view of the light emitting substrate 1086, showing how the fine light emitting diodes 1020 are interconnected. The fine light emitting diodes 1020 are so constituted that the fine objects 320 and the fine objects 520 described in the third embodiment and the fifth embodiment are disposed on the substrate 1010 by the methods described in the third and fifth embodiments, respectively. Each fine light emitting diode 1020 is composed of an n-conductive type GaN core 1042 and a shell 1046, where the shell 1046 is composed of an InGaN shell and a p-conductive type GaN shell. The fine light emitting diode 1020 is covered with an interlayer insulating film 1050, and the interlayer insulating film 1050 has contact holes 1053 opened. Through these contact holes 1053, the n-conductive type GaN core 1042 of the fine light emitting diode 1020 is electrically connected to a first metal interconnection 1051, and the shell 1046 is electrically connected to a second metal interconnection 1052.

A process for implementing such interconnections as in FIG. 56 may be a process similar to that described in the first embodiment with reference to FIGS. 9A to 9C. However, the fine objects 320, 520 described in the third, fifth embodiments, as they are disposed on the substrate by the methods described in the third, fifth embodiments, each have a ferrite shell 345, 545 as the outermost-layer shell. Accordingly, for the fine light emitting diodes 1020, preferably, after the disposition of the fine objects 320, 520 onto the substrate, the outermost-layer ferrite shell 345, 545 of the fine objects 320, 520 is peeled by dry etching or wet etching. As a result of this, the luminous efficacy can be improved.

As shown above, with use of the light emitting substrate 1086 in which a very large number of fine light emitting diodes 1020 are disposed in great multiplicity on the substrate 1010, the following effects can be obtained, compared with cases using light emitting substrates in which one or several light emitting diodes are disposed. First, each one light emitting diode has a small light emission area and moreover those diodes are dispersed on the substrate, so that the heat generation density due to light emission is smaller and moreover can be uniformized. On the other hand, ordinary light emitting diodes have large light emitting areas (which may reach 1 mm$^2$) so that the heat generation density due to light emission is larger, causing the light emitting layer to be high in temperature, giving influences on the luminous efficacy and reliability. By contrast, as in the illuminating apparatus of this embodiment, in which a multiplicity of fine light emitting diodes are disposed on the substrate, the luminous efficacy can be improved and resultantly the reliability can be improved.

The illuminating apparatus including a multiplicity of fine light emitting diodes according to this embodiment is fabricated by using the method or the arranging apparatus for disposing fine objects onto a substrate in the above-described embodiments, so that the fine objects can be disposed with their orientation (polarity) uniformized. Therefore, all the light emitting diodes can be made to emit light with high efficiency by DC drive. With conventional methods incapable of uniformizing the orientation (polarity) of the light emitting diodes, about half the fine light emitting diodes do not emit light.

Further, since the illuminating apparatus of this embodiment is fabricated by using the method or the arranging apparatus for disposing fine objects onto a substrate according to the invention, the illuminating apparatus has an advantage of very low cost required for the process for the disposition.

Thirteenth Embodiment

Next, a display apparatus as a thirteenth embodiment of the invention will be described. This display apparatus relates to a display apparatus fabricated by using the method for disposing fine objects onto a substrate in the above-described embodiments or the arranging apparatus in the above-described embodiments, and is described below with reference to FIG. 57.

Figure 57:
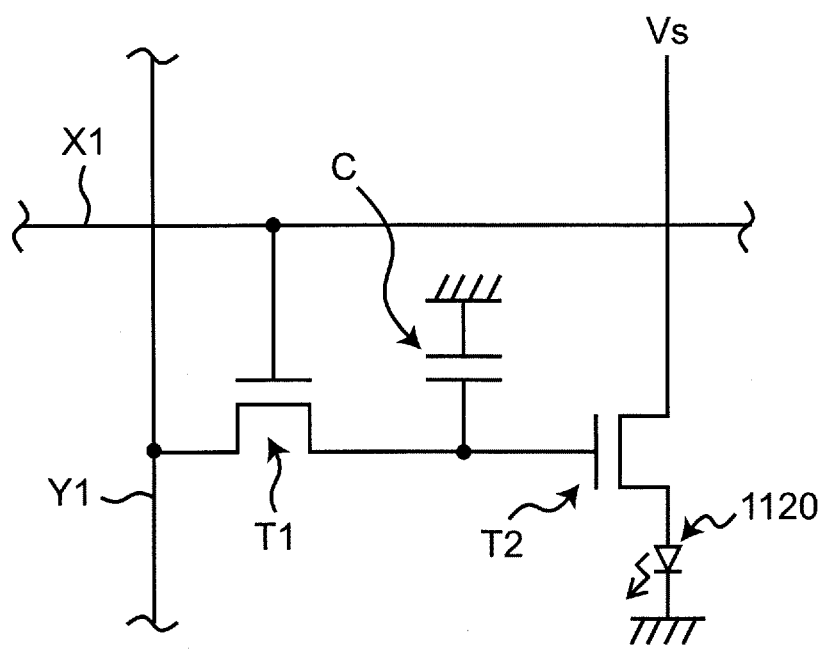
FIG. 57 is a circuit diagram showing a circuit of one pixel in an LED display as a thirteenth embodiment of the invention.
Figure 58:
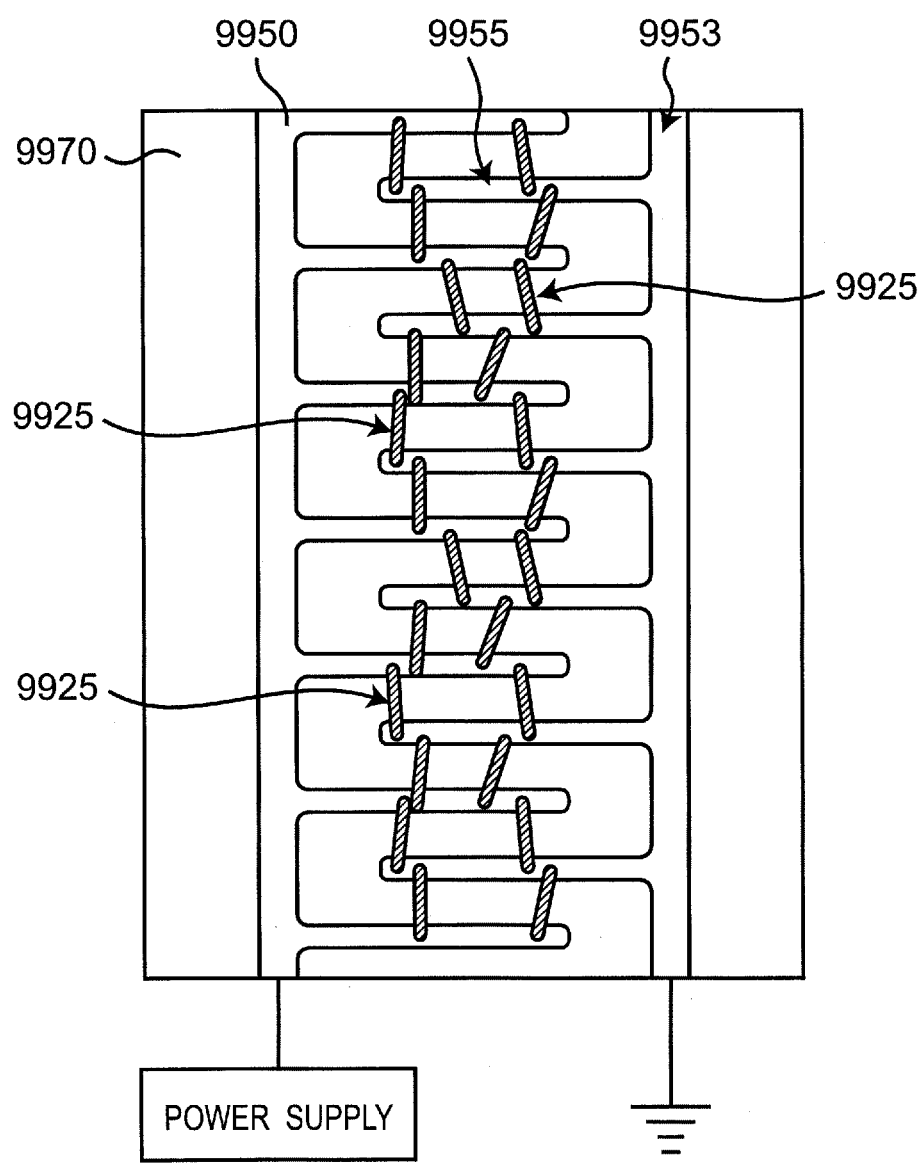
FIG. 58 is a view showing a state in which nanowires are disposed on a substrate by a conventional method.

FIG. 57 shows a circuit of one pixel in an LED display as this embodiment. This LED display is fabricated by using the method or arranging apparatus for disposing fine objects onto a substrate as described above. As light emitting elements therefor, for example, the fine objects 320, 520 described in the third, fifth embodiments can be used.

This LED display is in the active matrix address system, in which selective voltage pulses are fed to a row address line X1 while data signals are fed to a column address line Y1. When the selective voltage pulse is inputted to the gate of a transistor T1, causing the transistor T1 to turn on, the data signal is transferred from source to drain of the transistor T1, so that the data signal is stored as a voltage in a capacitor C. A transistor T2 serves for driving a pixel LED (which may be provided by the fine object 320 or 520) 1120, and the pixel LED 1120 is connected to power supply Vs via the transistor T2. Therefore, as the transistor T2 is turned on by the data signal derived from the transistor T1, the pixel LED 1120 is driven by the power supply Vs.

In the LED display of this embodiment, the one pixel shown in FIG. 57 is arrayed in plurality in a matrix shape. The pixel LEDs 1120 and the transistors T1, T2 arrayed in matrix are formed on the substrate.

For fabrication of the LED display of this embodiment, for example, the following procedure may well be adopted. First, transistors T1, T2 are formed on a glass or other substrate with use of ordinary TFT formation procedure. Next, on the substrate with the TFTs formed thereon, a first electrode and a second electrode for disposition of the minute light emitting diodes, which are to be the pixel LEDs 1120, are formed. Next, with use of the method described in the third or fifth embodiment, the minute light emitting diodes are disposed in a predetermined orientation at predetermined positions on the substrate where the first, second electrodes face each other. Thereafter, the interconnection step is carried out so that the minute light emitting diodes are connected to the drains of the transistors T2 and the ground line.

The display apparatus of this embodiment is fabricated with use of the method or arranging apparatus for disposing fine objects onto a substrate as described in the foregoing embodiments. The method or arranging apparatus for disposing fine objects onto a substrate as described in the foregoing embodiments is enabled to dispose the fine objects in a predetermined orientation at predetermined positions on the substrate, thus being suitable for fabrication of the display apparatus of this embodiment.

Further, the display apparatus of this embodiment is fabricated with use of the method or arranging apparatus for disposing fine objects onto a substrate according to the invention, thus having an advantage of very low cost required for the process for the disposition.

Besides, the display apparatus of this embodiment has a minute light emitting diode disposed in every pixel, and this minute light emitting diode can be formed by such a method as described with reference to FIGS. 20A to 20F in the third embodiment. With this formation method, as apparent from FIGS. 20A to 20F, the light emission area per unit substrate area for growth of light emitting diodes can be made considerably large, e.g., ten times larger than that by planar epitaxial growth. That is, for obtainment of the same light emission quantity, the number of substrates can be reduced to ¹⁄₁₀, which is a great reduction of manufacturing cost. Accordingly, the display apparatus of this embodiment is also enabled to attain a great reduction of manufacturing cost, compared with cases in which ordinary LEDs are disposed in individual pixels.

REFERENCE SIGNS LIST

A,B,C,D,E,F facing area
105 AC power supply
110,210,310,410,510 substrate
111,211,311,411,511 first electrode
112,212,312,412,512 second electrode
111A,112A,211A,212A,311A,312A,411A,412A,511A, 512A facing portion
120,220,220A,220B,320,420,520,620 fine object 121,221,321,421,521,621 fluid
130,244 front side layer
131,249 rear side layer
140,240,440 SOI substrate
141,241,441 silicon substrate
142,242,442 BOX layer
143,243,443 SOI layer
144,244,444 silicon nitride film
145,245,445 n-type impurity region
146,246,446 p-type impurity region
220A-1,220B-1 one end (head portion)
220A-2,220B-2 other end (leg portion)
340 GaN substrate
342,542 n-type GaN core
343,543 InGaN shell
344,544 p-type GaN shell
345,545 ferrite shell
448 ferrite layer
514 S-pole portion
515 N-pole portion
516 ferromagnetic pattern
610,961 transparent substrate
619 amorphous silicon film
650,974 photomask
651 opaque portion
652 transparent portion
655,973 light source
700,800,900,1500 arranging apparatus
760,860,960,1560 holder
761,861,1561 substrate
762,862,1562 first electrode pad
763,863,1563 second electrode pad
764,864,964,1564 cover
765,865,965 AC power supply
766,866,966,1566 first voltage-applying pin
767,867,967,1567 second voltage-applying pin
768,868,968,1568 reservoir
769,869,969,1569 fluid
770,870,970,1570 valve
771,871,971,1571 tube
872 external magnetic field applying apparatus
1000 LED bulb
1081 ferrule
1082 heat radiating portion
1083 light-pervious portion
1084 light emitting device
1085 heat radiating plate
1086 light emitting substrate
1010 substrate
1011 first electrode
1012 second electrode
1020 light emitting diodes
1042 n-conductive type GaN core
1046 shell
1050 interlayer insulating film
1051,1052 metal interconnection
G area where coils are formed
H magnetic field
1410 substrate
1411 first interconnection
1412 second interconnection
1417 contact
1418 substrate base portion
1419 interlayer insulating film
1420 fine object
1421 fluid
1444 silicon nitride film
1445 n-type impurity region
1446 p-type impurity region
1448 ferrite layer
1565 DC power supply

The invention claimed is:

1. A method for disposing fine objects, comprising:
a substrate preparing step for preparing a substrate in which positions where fine objects are disposed are defined, the fine objects having a maximum physical dimension of 100 μm or smaller;
a fluid introducing step for introducing a fluid containing the fine objects onto the substrate; and
a fine object disposing step for disposing the fine objects, which are contained in the fluid introduced onto the substrate, in a predetermined orientation at predetermined positions on the substrate by electromagnetic force, wherein
the fine objects respectively include a plurality of portions mutually differing in at least one of physical properties and shapes;
further, at least the fine objects include an alignment structure configured to dispose the fine objects on the substrate so that the fine objects are aligned in a predetermined orientation defined by disposition of the plurality of portions, which mutually differ in at least one of physical properties and shapes, relative to the substrate;
in the substrate preparing step, a substrate on which a first electrode and a second electrode have previously been formed is prepared;
the first electrode and the second electrode are covered with an insulating film;
in the fine object disposing step, a voltage is applied between the first electrode and the second electrode formed on the substrate so that the fine objects are disposed in a predetermined orientation and at predetermined positions in areas where the first electrode and the second electrode face each other;
the substrate has only a continuous flat planar surface without any recess or protrusion defined therein or thereon;
the first electrode and the second electrode are electrically connected to a voltage source so as to be able to apply the voltage between the first electrode and the second electrode; and
only the first electrode and the second electrode are provided on the continuous flat planar surface of the substrate.

2. The method for disposing fine objects as claimed in claim 1, wherein
the fine objects each include a front side portion and a rear side portion mutually differing in dielectric constant, and
the front side portion and the rear side portion define the alignment structure.

3. The method for disposing fine objects as claimed in claim 2, wherein
out of the front side portion and the rear side portion of the fine objects, one portion is formed from metal, and the other portion is formed from a semiconductor.

4. The method for disposing fine objects as claimed in claim 2, wherein
out of the front side portion and the rear side portion of the fine objects, one portion is formed from a semiconductor and the other portion is formed from a dielectric material.

5. The method for disposing fine objects as claimed in claim 2, wherein
in the fine object disposing step,
the fluid containing the fine objects introduced onto the substrate is made to flow relative to the substrate.

6. The method for disposing fine objects as claimed in claim 2, wherein
a plurality of the predetermined positions are defined on the substrate, and a plurality of the fine objects are disposed on the substrate.

7. The method for disposing fine objects as claimed in claim 2, wherein
the fine object disposing step includes using an arranging apparatus to dispose the fine objects onto the substrate, the arranging apparatus comprising:
a fluid introducing section arranged to introduce the fluid containing the fine objects onto the substrate; and
an electromagnetic force applying section arranged to apply electromagnetic force to the substrate.

8. An illuminating apparatus which is fabricated by using the method for disposing fine objects as claimed in claim 2, wherein each of the fine objects is a light emitting diode.

9. A display apparatus which is fabricated by using the method for disposing fine objects as claimed in claim 2, wherein each of the fine objects is a light emitting diode.

10. The method for disposing fine objects as claimed in claim 1, wherein
the fine objects each include two portions of mutually different sizes corresponding to the first electrode and the second electrode, respectively, in the predetermined positions,
in the substrate:
facing portions of the first electrode and facing portions of the second electrode face each other in areas where the first electrode and the second electrode face each other, and a width of each facing portion of the first electrode and a width of each facing portion of the second electrode are different from each other,
two portions of the fine objects mutually differing in sizes form an alignment structure of the fine objects, and
the facing portions of the first electrode and the facing portions of the second electrode, which mutually differ in width, define an alignment structure of the substrate.

11. The method for disposing fine objects as claimed in claim 10, wherein
the fine objects each include a front side portion and a rear side portion mutually differing in dielectric constant and further have two portions of mutually different sizes corresponding to the first electrode and the second electrode, respectively, in the predetermined positions,
in the substrate,
facing portions of the first electrode and facing portions of the second electrode face each other in areas where the first electrode and the second electrode face each other, and a width of each facing portion of the first electrode and a width of each facing portion of the second electrode are different from each other,
the front side portion and the rear side portion of the fine objects mutually differing in dielectric constant as well as the two portions mutually differing in sizes form an alignment structure of the fine objects, and
the facing portions of the first electrode and the facing portions of the second electrode, which mutually differ in width, define an alignment structure of the substrate.

12. The method for disposing fine objects as claimed in claim 1, wherein
the alignment structure of the fine objects includes a magnetized ferromagnet, and
in the fine object disposing step, the fine objects are aligned in the predetermined orientation by an external magnetic field.

13. The method for disposing fine objects as claimed in claim 12, wherein
the external magnetic field is directed generally parallel to a surface of the substrate.

14. The method for disposing fine objects as claimed in claim 12, wherein
the external magnetic field is directed generally vertical to a surface of the substrate.

15. The method for disposing fine objects as claimed in claim 1, wherein
the alignment structure of the fine objects includes a magnetized ferromagnet, and
the substrate also includes an alignment structure, and the alignment structure of the substrate is that a magnetized ferromagnet arranged in correspondence to each of predetermined positions on the substrate.

16. The method for disposing fine objects as claimed in claim 1, wherein
the front side portion and the rear side portion define the alignment structure; and
each of the fine objects is configured such that a quantity of electric charge induced on the fine object when the front side portion of the fine object faces the first electrode and the second electrode is different from a quantity of electric charge induced on the fine object when the rear side portion of the fine object faces the first electrode and the second electrode in a case that the fine object is disposed at the predetermined position on the first electrode and the second electrode to which voltages are applied in the fine object disposing step.

17. The method for disposing fine objects as claimed in claim 1, wherein
a distance between facing portions of the first electrode and the second electrode is set to 60% to 90% of a length of the fine object in a longitudinal direction.

18. A method for disposing fine objects, comprising:
a substrate preparing step for preparing a substrate in which positions where fine objects are disposed are defined, the fine objects having a maximum physical dimension of 100 μm or smaller;
a fluid introducing step for introducing a fluid containing the fine objects onto the substrate; and
a fine object disposing step for disposing the fine objects, which are contained in the fluid introduced onto the substrate, in a predetermined orientation at predetermined positions on the substrate by electromagnetic force; wherein
the fine objects respectively include a plurality of portions mutually differing in at least one of physical properties and shapes;
further, at least the fine objects include an alignment structure configured to dispose the fine objects on the substrate so that the fine objects are aligned in a predetermined orientation defined by disposition of the plurality of portions, which mutually differ in at least one of physical properties and shapes, relative to the substrate;
the substrate is a transparent substrate and a semiconductor film is formed on one surface of the transparent substrate;

in the substrate preparing step, light whose incidence region is set to a certain pattern is caused to be incident on the other surface of the transparent substrate, so that while the light keeps incident, portions of the semiconductor film on which the light is incident are selectively lowered in resistance, whereby the selectively lowered-in-resistance portions of the semiconductor film are formed as a first electrode and a second electrode, and in the fine object disposing step, a voltage is applied between the first electrode and the second electrode formed on the substrate so that the fine objects are disposed in the predetermined orientation and at the predetermined positions in areas where the first electrode and the second electrode face each other.

19. The method for disposing fine objects as claimed in claim 18, wherein the alignment structure of the fine objects includes a magnetized ferromagnet, and in the fine object disposing step, the fine objects are aligned in the predetermined orientation by an external magnetic field.

20. A method for disposing fine objects, comprising:

a substrate preparing step for preparing a substrate in which positions where fine objects are disposed are defined, the fine objects having a maximum physical dimension of 100 µm or smaller;

a fluid introducing step for introducing a fluid containing the fine objects onto the substrate; and a fine object disposing step for disposing the fine objects, which are contained in the fluid introduced onto the substrate, in a predetermined orientation at predetermined positions on the substrate by electromagnetic force; wherein the fine objects respectively include a plurality of portions mutually differing in at least one of physical properties and shapes;

further, at least the fine objects include an alignment structure configured to dispose the fine objects on the substrate so that the fine objects are aligned in a predetermined orientation defined by disposition of the plurality of portions, which mutually differ in at least one of physical properties and shapes, relative to the substrate;

the fine objects each include a magnetized ferromagnetic material;

the substrate includes a magnetic field generating portion, the magnetic field generating portion including coils defined by a multilayer interconnection structure provided on the substrate, wherein each interconnection of the multilayer interconnection structure is connected to each other by a contact;

the ferromagnetic material defines an alignment structure of the fine objects and the magnetic field generating portion defines an alignment structure of the substrate; and in the fine object disposing step, by a magnetic field generated by the magnetic field generating portion, the fine objects are disposed in the predetermined orientation and at the predetermined positions defined by areas where the magnetic field is generated by the magnetic field generating portion.

* * * * *